(12) United States Patent
Donaghey et al.

(10) Patent No.: US 7,705,749 B2
(45) Date of Patent: Apr. 27, 2010

(54) ALERT DEVICE

(75) Inventors: Andrew Paul Donaghey, Vermont South (AU); Ian Kenneth Francis McDonald, Huntingdale (AU); David Lewis Beard, Warranwood (AU)

(73) Assignee: Freestyle Technology Pty Ltd, Mitcham, Victoria ( * ) Notice: Subject to any disclaimer, the term of this patent is extended or adjusted under 35 U.S.C. 154(b) by 474 days.

(21) Appl. No.: 11/571,172

(22) PCT Filed: Jun. 24, 2005

(86) PCT No.: PCT/AU2005/000923

§ 371 (c)(1),
(2), (4) Date: Mar. 23, 2007

(87) PCT Pub. No.: WO2006/000039

PCT Pub. Date: Jan. 5, 2006

(65) Prior Publication Data

US 2007/0252724 A1    Nov. 1, 2007

(30) Foreign Application Priority Data

Jun. 24, 2004 (AU) ............................. 2004903457
Sep. 13, 2004 (AU) ............................. 2004905262

(51) Int. Cl.
*G08G 1/09* (2006.01)
*G08G 1/123* (2006.01)
*B60Q 1/00* (2006.01)

(52) U.S. Cl. .................. 340/905; 340/438; 340/995.13; 340/539.13; 340/7.43; 340/7.58; 455/404.2; 455/412.2; 701/213

(58) Field of Classification Search .................. 340/905
See application file for complete search history.

(56) References Cited

U.S. PATENT DOCUMENTS

| | | | |
|---|---|---|---|
| 6,381,465 B1 * | 4/2002 | Chern et al. ................. | 455/466 |
| 6,526,335 B1 * | 2/2003 | Treyz et al. ..................... | 701/1 |
| 6,741,188 B1 * | 5/2004 | Miller et al. ............. | 340/995.1 |
| 6,993,326 B2 * | 1/2006 | Link et al. ............... | 455/414.1 |
| 2002/0022920 A1 | 2/2002 | Straub | |
| 2002/0181415 A1 | 12/2002 | West et al. | |

(Continued)

FOREIGN PATENT DOCUMENTS

EP    0979016    2/2000

(Continued)

OTHER PUBLICATIONS

International Search Report; PCT/AU2005/000923; Sep. 1, 2005; M Hollingworth.

*Primary Examiner*—Donnie L Crosland
(74) *Attorney, Agent, or Firm*—Fish & Richardson P.C.

(57) ABSTRACT

An alert device for a vehicle includes a communications receiver for receiving file fragments for the device, a positioning data receiver for providing vehicle location data, a microcontroller system including a microcontroller and a programmable non-volatile memory system, for building and storing application and data files from the fragments, and executing an alert application of the device by processing at least one application file and associated data identified by configuration instructions included in at least one of the fragments to provide alert data for the vehicle corresponding to the location of the vehicle determined by the application on the basis of the vehicle location data.

29 Claims, 39 Drawing Sheets

U.S. PATENT DOCUMENTS

| | | |
|---|---|---|
| 2003/0022663 A1 | 1/2003 | Rajaram et al. |
| 2003/0169181 A1 | 9/2003 | Taylor |
| 2004/0038671 A1 | 2/2004 | Trayford et al. |
| 2004/0067752 A1 | 4/2004 | Himmelstein |
| 2004/0068364 A1 | 4/2004 | Zhao et al. |
| 2004/0104842 A1 | 6/2004 | Drury et al. |

FOREIGN PATENT DOCUMENTS

| | | |
|---|---|---|
| NZ | 520872 | 12/2003 |
| WO | WO 03/025742 | 3/2003 |

* cited by examiner

ALERT DEVICE

FIELD

The present invention relates to an alert device that is able to remotely receive application, configuration or data files to establish, adjust or control the application executed by the device.

BACKGROUND

Consumer electronic devices are now commonly used for a wide variety of applications. Many of the devices now include an embedded processor architecture, which normally comprises a microprocessor and associated memory. Instructional code and data for the device is stored in the architecture, and defines and controls the application for which the device has been specifically built. For example, a compact disc (CD) player and a cordless telephone each include a basic processor architecture, but the similarities then normally cease as the CD player is specifically configured to perform a number of tasks associated with processing the audio data on a CD, whereas a telephone is specifically configured to perform a number of call handling tasks. Similar considerations apply to other electronic devices, such as video game consoles, mobile telephones, electronic toys, cameras, etc. The device is specifically configured for its chosen application, and that application cannot be changed, particularly by the receipt of any remote instructions. Even more general processing devices, such as a wireless personal digital assistant (PDA) or a personal computer connected to a computer network, have defined operating systems with a defined set of APIs that restrict the applications that can be performed on the devices, and restrict the extent to which the devices are remotely configurable. Restrictions are also imposed by the security constraints associated with the network that can be used to connect to the device, and any configuration is performed on a one to one basis, ie only one client device can be configured remotely at a given time.

It is desired to address the above or at least provide a useful alternative, particularly in the context of an alert application.

SUMMARY

In accordance with the present invention there is provided an alert device for a vehicle including:
- a communications receiver for receiving file fragments for said device;
- a positioning data receiver for providing vehicle location data;
- a microcontroller system including a microcontroller and a programmable non-volatile memory system, for building and storing application and data files from said fragments, and executing an alert application of said device by processing at least one application file and associated data identified by configuration instructions included in at least one of said fragments to provide alert data for said vehicle corresponding to the location of said vehicle determined by said application on the basis of said vehicle location data.

The present invention also provides an alert device, including:
- a wireless communications receiver for receiving alert files for said device;
- a positioning unit for providing location data representing the location of said device;
- a microcontroller system for processing and storing said alert files, and performing an alert application defined by said files and using said location data to provide alert data corresponding to the location of said device.

The present invention also provides an alert device, including:
- a microprocessor;
- a programmable non-volatile memory system addressable by the microprocessor;
- a communications receiver for receiving file fragments for said device; and
- an operating system (OS) for controlling the device to identify fragments for said device, build files from said fragments, store said files in said memory system, and process the files as defining an alert application for providing alert data for a user of the device.

BRIEF DESCRIPTION OF THE DRAWINGS

Preferred embodiments of the present invention are hereinafter described, by way of example only, with reference to the accompanying drawings, wherein.

DETAILED DESCRIPTION OF PREFERRED EMBODIMENTS OF THE INVENTION

1. The Client Processor Device

Figure 1:
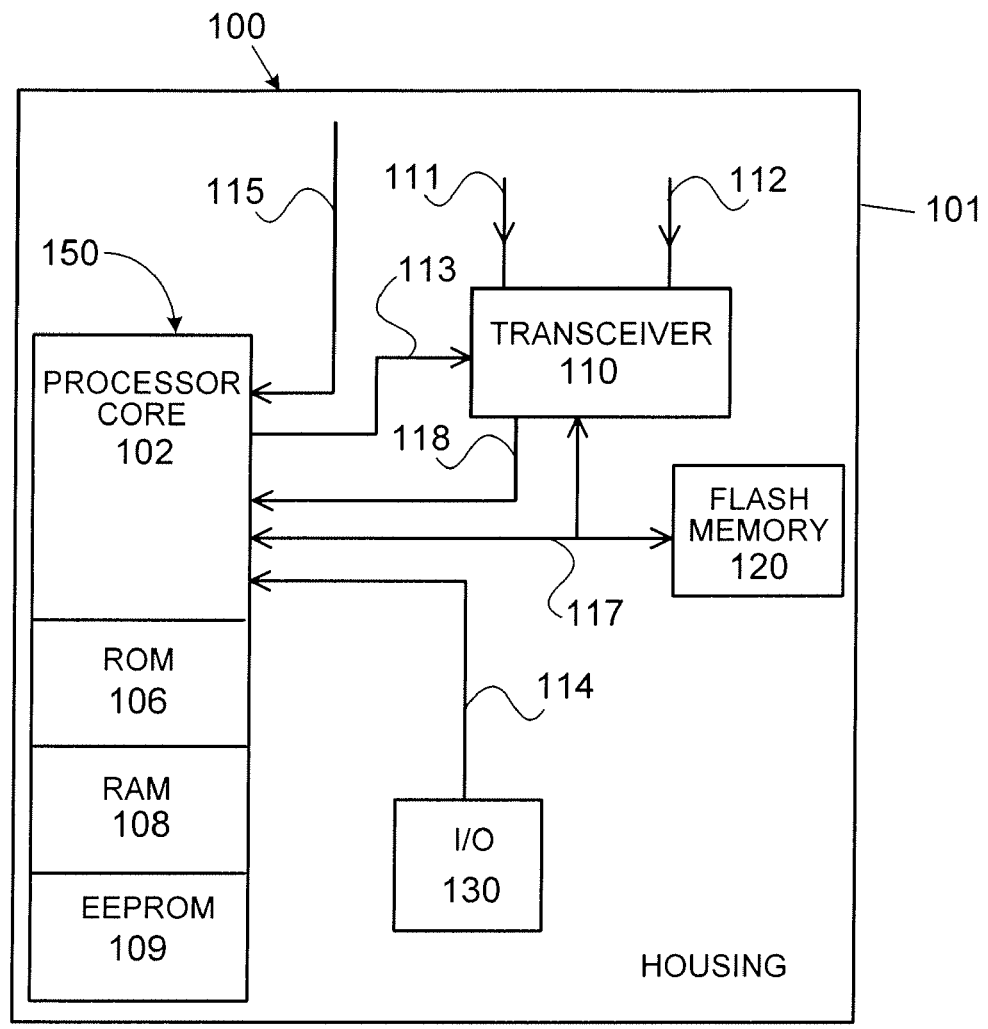
FIG. 1 is a block diagram of a preferred embodiment of a client processor device.

A client processor device 100, as shown in FIG. 1, has a housing 101 that contains a printed circuit board on which three semiconductor chips 110, 120 and 150 are mounted to provide a receiver 110, a non-volatile programmable memory 120, in the form of data-flash memory, and a microcontroller 150. Other support components for the chips are included on the board within the housing 101, such as a battery power system, and any additional input/output (I/O) components 130 that are required, such as a LED or LCD display and control input buttons or keys. The microcontroller 150 is connected to the receiver 110 and the memory 120 via a serial interface 117 and to an address and data bus 114 for connection to the I/O components 130, and has an asynchronous serial interface 115 for external peripherals. The housing 101 is relatively small, and the footprint of the device 100 occupies less than 20 $cm^2$. The electronic components of the device 100 also consume less than 100 mW.

The microcontroller 150 is an 8-bit microcontroller with flash read only memory (ROM) 106 (about 128 kbytes), electronically erasable and programmable read only memory (EEPROM) 109 and random access memory (RAM) 108 (less than 4 kbytes), such as the PIC 18 Series Microcontrollers produced by Microchip Technology Inc (http://www.microchip.com). The processor core 102 of the microcontroller 150 has a hardware return stack of 32 levels, and no formal data stack, making it primarily suitable to handling only one processor task. Offset addressing is not supported and only two hardware interrupts are provided, one low and one high priority interrupt, without any support for software interrupts. The return stack stores a return address only.

The memory 120 provides data storage on a data flash device, such as the AT45 Series of data-flash memories produced by Atmel Inc (http://www.atmel.com), using a hierarchal structure of sectors, blocks and pages as discussed in detail below. A complete page, comprising 264 or more bytes depending on device type, is written at once, whereas at least one block is erased, with a block comprising eight pages of data. The data-flash memory 120 is managed by a flash file system, described in detail below.

The receiver 110 is an RF transceiver, such as the NT29xx series produced by Numa Technologies, Inc (http://www.numateclinologies.com), and is controlled by the microcontroller 150 (via the serial interface 117) to provide an analog output 118, for sampling by the processor core 102, of the radio frequency (RF) signal received by the receiver 110. The receiver provides an air interface, and is frequency agile being phase locked loop synthesised. The receiver uses diversity antennas 111 and 112 connected to the transceiver chip 110, under control of the processor 150 using a control signal 113 to switch the signal from one or the other antenna, to improve performance under marginal signal conditions. A switching arrangement is used, but it is also possible to use dual receivers and receive paths, which may be tuned to different frequencies.

Figure 2:
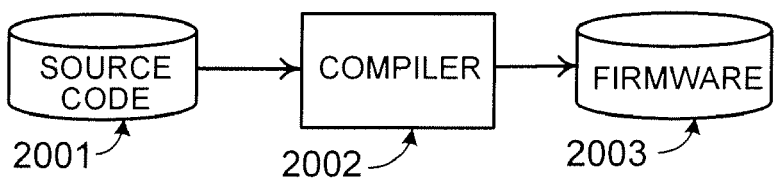
FIG. 2 is a block diagram of compilation components for firmware of the client processor device.

The firmware production process is shown in FIG. 2. The firmware 2003 stored in the ROM 106 of the device 100 is primarily written as source code 2001 in the C programming language and compiled using the PICC-18 ANSI C compiler 2002 provided by HI-TECH Software LLC. The compiler uses a compiled stack to deal with the omitted data stack from the processor core 102. The data stack would normally hold auto-allocated (local) variables and function parameters. Instead, the complete calling hierarchy of the code is evaluated at compile time by the compiler to produce a call-graph tree, as described below. The auto-allocated variables and function parameters are allocated to a fixed memory bank in a section of the RAM 108, being designated parameter RAM by the compiler, and the allocations are shared where possible to minimise the overall parameter RAM requirements. For example, the maximum possible parameter RAM size may be 256 bytes, a compromise between the bank switching limitations of the processor and the speed and size of the code. This maximum allocation size is normally more than sufficient for a single main task and routines called using the low and high priority interrupt handlers. The compiled stack is only designed to handle a single task without supporting re-entrant code. The compiler defines three separate roots in a call graph, one for main execution and one for each of the interrupts.

Figure 3:
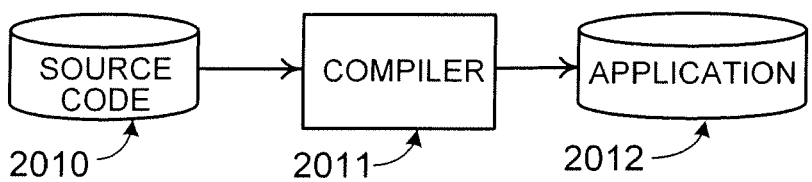
FIG. 3 is a block diagram of compilation components for an application of the client processor device.

The application production process is shown in FIG. 3. An application 2012 sent to and stored in the flash memory 106 of the device 100 is primarily written as source code 2010 in a programming language, such as C, and compiled into byte code for a virtual machine (VM) using a compiler 2011 for the device 100.

Operating System (OS)

Figure 5:
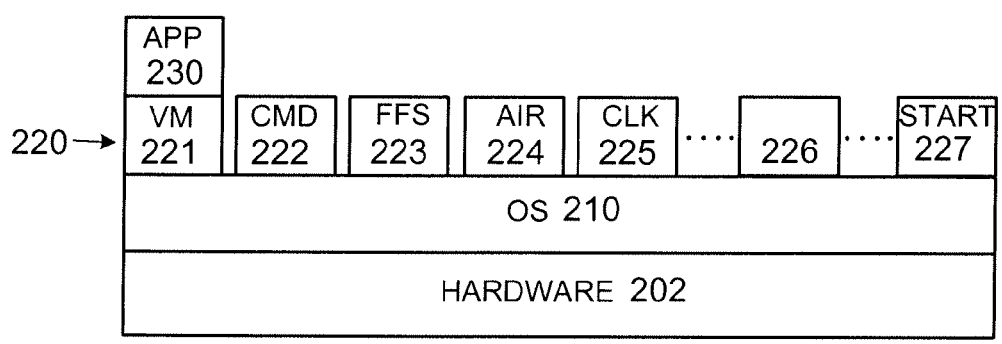
FIG. 5 is a block diagram of the logic architecture of the client processor device.

The operating system (OS) 210 can be considered to reside on and be supported by the hardware 202 of the device 100, as shown in FIG. 5. The code for the OS and its basic tasks 220 are stored in the flash ROM 106. The OS on boot, sets the interrupts, initialises semaphores (described below) and scheduling, and supports and runs a start-up task 227 which in turn starts the remaining basic tasks 220, including the virtual machine task 221 on which the application code 230 relies. The number of tasks is limited to eight due to the word length of one byte of the processor 102 and because an increase would substantially increase overhead. The OS provides a cooperative multi-tasking environment to allow asynchronous events to be handled independently, with much reduced code complexity, enabling the device 100 to be more responsive and reliable. The asynchronous events are normally those either caused externally to, or not under control of, the device, such as button presses, characters received on a serial port interface of the I/O 130 or a hardware peripheral connected to the I/O 130 completing an operation. Most of the events require a response in a timely manner.

The operating system is able to share the time of the processor 102 between the tasks by rapidly context switching between them on a cooperative basis. The tasks are:

(i) A clock task 225. This maintains time of day and a calendar.
(ii) A virtual machine (VM) task 221. This processes the byte code of the application files as discussed below.
(iii) A command task 222. This establishes a set of commands available via the local asynchronous serial interface 115.
(iv) A flash file system task 223. This handles building and management of all files within the flash memory 120.
(v) An air task 224. This establishes communications and control of the transceiver 110 and supports an air protocol of the device 100, as discussed below.
(vi) Additional tasks 226. This represents any other tasks as required, for example, to process data received from a global positioning system (GPS) receiver.
(vii) The start-up task 227. This establishes the remaining tasks in a controlled fashion as discussed below.

The tasks are each assigned a unique priority depending upon the required processing rate and latency, when started. When a context switch is performed, the OS moves the processor stack contents to a memory area allocated for the task being swapped out, and then restores it with the stored stack for the new task to be run. By allocating stack memory levels required for each task, memory requirements are contained. The storage level can be allocated from 2 to 32 depending on the task, when it is started. A context switch may involve calling a function (e.g. the OS_Yield( ) function) in the OS, which causes the running task to yield control to the OS and therefore allowing another task to run. Preferably, context switching is achieved only by calling the OS_Yield( ) function. A common scratch-pad area of the RAM 108 is used for temporary processing and is only relevant within a function call, as the contents are ignored if another routine is called, which may overwrite the contents. Accordingly, when the OS accomplishes a task switch, the scratch pad area does not need to be saved thereby providing a significant saving of RAM and processor overhead.

Many software modules and hardware resources (e.g. the data-flash memory 120, the EEPROM 109, and the bus 117) need to be shared between tasks, and each shared resource is allocated a binary semaphore (or token). If a resource is used and another task attempts to use it, then this is prohibited until the first task finishes with the resource. Locking of the shared resources protects them from re-entrant calls. In the device 100, normally 20 to 30 semaphores are allocated to lock the resources. Binary semaphores are controlled as a bit field in bit addressable memory of the RAM 108, and counting semaphores are used to control linear or multi-level resources (such as buffers). The semaphores are allocated when the firmware 2003 is compiled by the compiler 2002.

To protect the shared code (and resource) via locking, the following procedure is used:
(a) Request access to the module/resource via the semaphore.
(b) Lock out other tasks using the semaphore associated with the module/resource once access is obtained;
(c) Call functions for the module/resource; and
(d) Allow other tasks access by freeing the semaphore associated with the module/resource.

These steps (a) and (d) may be implemented as functions in the corresponding software modules to save code space (e.g. as Lock and Unlock functions).

Task re-entrant code can be written to allow multiple tasks to call the same routine. A particular task may only call the one routine once. To do this the routine's parameters are saved if they must be accessed after the context switch. This can be achieved using an array to provide context sensitive storage for each task as follows:

```
char storage[8];                        // Parameter storage for each of 8 tasks
void shared(char var) {
    storage[<current_task>] = var;      // save the parameter
    ...
    OS_Yield( );                        // context switch
    var = storage[<current_task>];      // Restore parameter ...
}
```

The OS also includes a scheduler that is responsible for determining the processor time allocated to each task. The highest priority task (e.g. task "1") is allocated up to 50% of the processor time, given the opportunity to run every second context switch, whilst the next high office priority task (e.g. task "2") is allowed to run 25% percent of the context switches and so on. For example, the task may be switched based on a priority level as follows: 1 2 1 3 1 2 1 4 1 2 1 3 1 2 1 5, etc. If a task cannot be run because it is blocked, then the next lowest priority task is run and so on. This allows resource intensive or critical tasks to be run more often or with lower latency whilst ensuring slower tasks are not able to stall. The scheduler in addition is able to prevent a potential priority inversion hang without requiring a complex priority inheritance procedure. While lower priority tasks are guaranteed to run, a higher priority task waiting on a resource in use by a lower level task will not be indefinitely blocked.

The low and high priority interrupts of the processor 100 are treated as being slow and fast, respectively. The fast interrupt is reserved for handling time critical tasks, such as analog to digital conversion of a sampled analog signal. The fast interrupts generally do not relate to the use of shared routines or those of the OS, and the slow interrupts are used to handle asynchronous events, such as timer interrupts, serial port events and lower level packet decoding that directly relate to OS controlled tasks. The low interrupt handlers use OS functions, such as semaphores to communicate with tasks.

Figure 6:
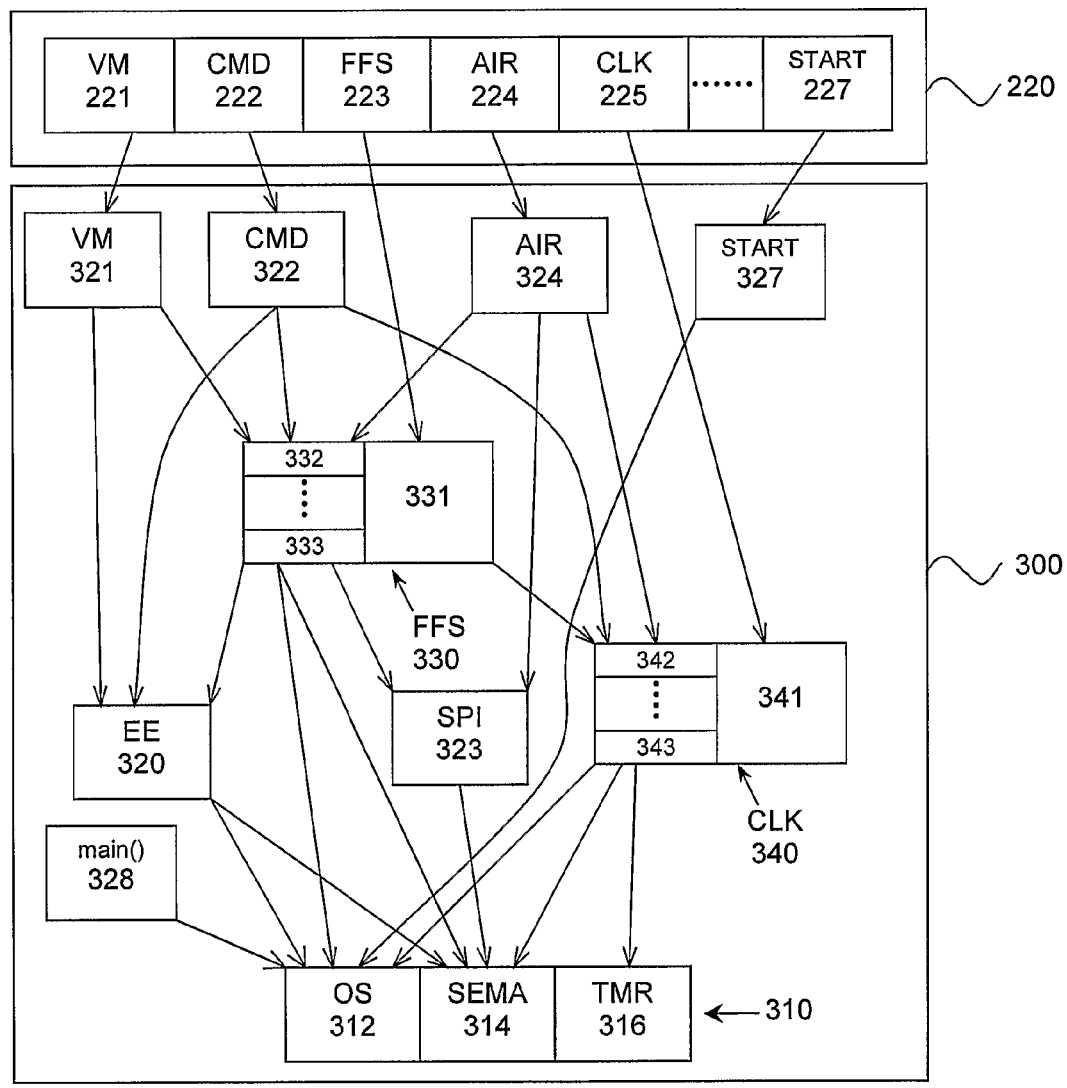
FIG. 6 is a block diagram of the software architecture of the client processor device.

A timer module 316 of the OS provides, shown in FIG. 6, accurate timing of intervals and delays, and allows tasks to be synchronised to a period such as one second for a clock of the device 100. The timer module allows a variety of different high and low resolution durations to be measured, and a number of timers, can be allocated when the firmware is compiled.

Software Architecture

The software architecture employed by the firmware stored in the ROM 106 distinguishes between software modules 300 and the tasks 220, as shown in FIG. 6. The software modules 300 are available for use by the tasks 220, the arrows indicating dependencies. An object-oriented approach is used in the module decomposition process, and some modules are given responsibility at a given time for a particular shared resource (e.g. the serial interface, EEPROM, etc.) as required.

There are four classes of software modules 300. The first type 310 includes the OS core 312 that manages scheduling and task switching, and the semaphore 314 and timing 316 modules. These modules are typically used by all tasks and written to guarantee that they can be called at any time (i.e. not require locking). The second type are shared modules that must be locked to ensure conflicts do not occur. These include an SPI module 323 that manages data transfer on the serial peripheral interface and an EE module 320 that allows access to the processor's EEPROM 109. These modules typically contain a number of available routines, which are locked as a group (i.e. these routines are locked/unlocked using the same semaphore).

The third type are modules run autonomously from a task. These include the virtual machine 321, command processor 322, air interface 324 and start-up 327 modules. These are each dedicated to a particular task, not shared and therefore do not require locking.

The fourth type is a combination of the latter two. These have components that are run only from a single task, for example in the flash file system (FFS) module 330, the module 331 is run from a FFS task 223 whereas a set of shared functions, 332 and 333 are available for use by external modules, including the internal component 331. The shared functions are locked for use. The clock module 340 is another example, where a dedicated module 341 is run from the clock task 225, and a set of shared functions 342, 343 are also available for use by other modules.

The main( ) routine 328 is responsible for initialising all modules as required and calling an OS 312 routine to run the start-up task 227.

Call Graph Management

Manipulation of the call graph supports a multi-tasking environment. Call-graph allocation is performed using assembler directives unique to the firmware compiler 2002. These include directives to define a root, and to allocate each routine to a particular root. Any of the modules that have contained routines that run to completion and do not require a separate call-graph root are defined to use a default main root to save parameter space.

A flattening call-graph approach could be used but typically results in the very limited parameter space allocation being easily exceeded. Rather, the call graph is broken into a number of separate trees, whereby the main function of each task forms the base of a tree or root. This allows the overlaying of auto variables between functions and parameter passing. For routines that are not run to completion, assembly directives in the task code are used. These are used internally by the compiler to ensure interrupt code starts at a separate base and interrupts can run at any time. Routines or functions that are shared across tasks are always assigned to a root. Shared functions which always run to completion between context switches may all share the same root as they will not run concurrently, but they may not share a root with tasks that do not always run to completion. Any shared functions that may incur a context switch before they complete are assigned a unique root. Groups of such functions or routines that are guaranteed never to be called concurrently by more than one task can be assigned the same root to conserve parameter space.

Any functions solely called either directly or indirectly by the maino routine 328 need not be formally placed in the call-graph as they will be placed in the main root of the call-graph by the compiler. These would typically include once-off initialisation and configuration functions.

Firmware Management

Figure 4:
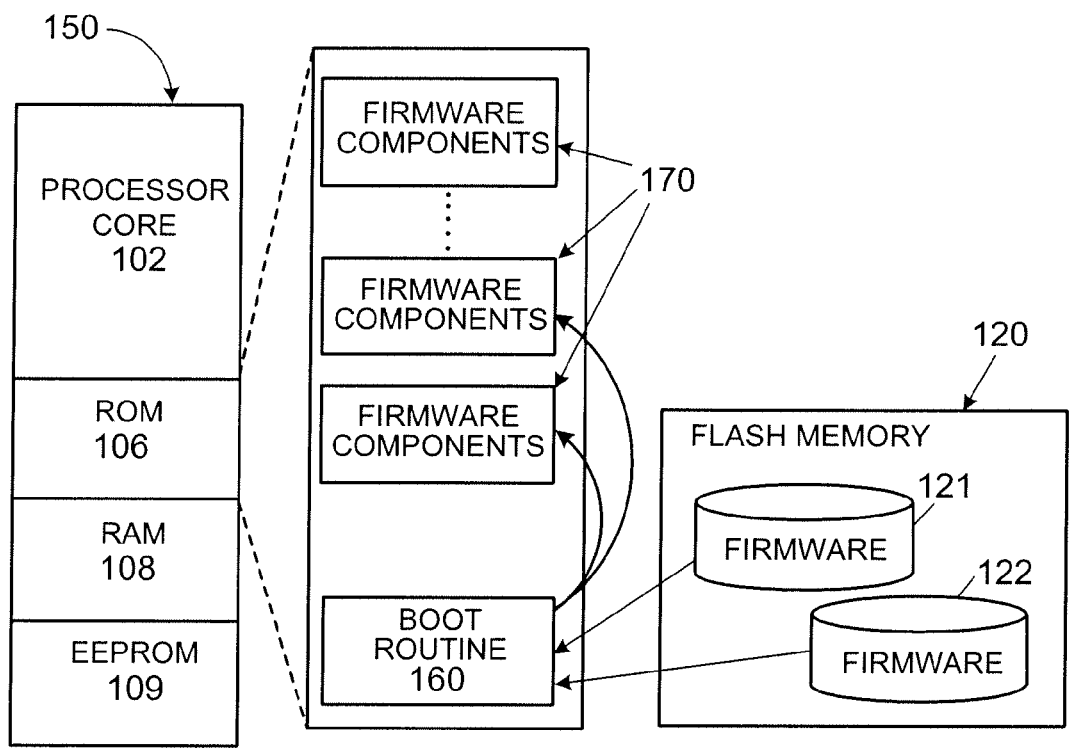
FIG. 4 is a block diagram of firmware management components for the client processor device.

The device 100 can be structured so that only a small boot routine 160 is permanently held in the device ROM 106 as depicted in FIG. 4. The boot routine 160 can program the remaining firmware components 170 into the ROM with data obtained via the local interface 115, or transfer execution to the remaining firmware components once they are programmed.

Once the remaining firmware components are in place and operating, the flash file system of the client processor device 100 receives and stores files in the flash memory 120 for processing by the virtual machine 321 of the OS. The files normally relate to an application or a version of the application, but the files may also include updates to the remaining firmware components. The boot routine 160 may read file information from the flash memory 120 but without the need to implement the flash file system to the full extent. The boot routine may compare the versions of the firmware components programmed in the device ROM with files identified to be firmware (e.g 121, 122) in the flash memory 120 and automatically update the firmware components in the device ROM, if it determines they are newer.

The device 100, is entirely remotely configurable, without a user having to interact directly with the device, e.g. by selecting a button.

Flash File System

Figure 7:
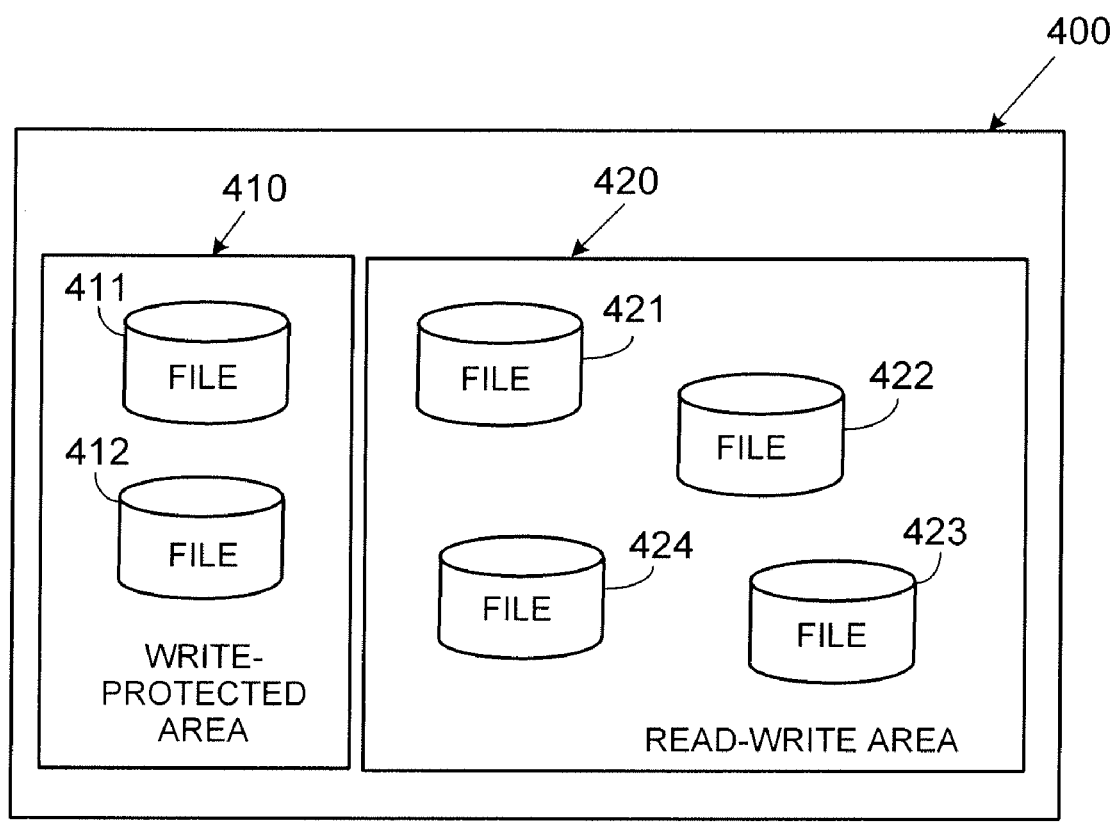
FIG. 7 is a block diagram of a flash memory system of the client processor device.

The flash file system of the client processor device 100 receives and stores files in the flash memory 120 for processing by the virtual machine 321 of the OS. The flash file system 400, as shown in FIG. 7, is a linear file system that allows up to 64 files of up to 64 kbyte to be stored in the flash memory 120. The file system allows storage of files (e.g. files 411, 412), in a write-protected area 410 and optionally in a read-write area 420 (e.g. file 421, 422, 423, 424), as shown in FIG. 7. The write-protected area is read-only if the device is not in an initial configuration state, otherwise write access is allowed. The flash file system supports 512 kbyte and 1 Mbyte data flash devices 120 and this does not preclude other device sizes or numbers of devices, if required.

Figure 8:
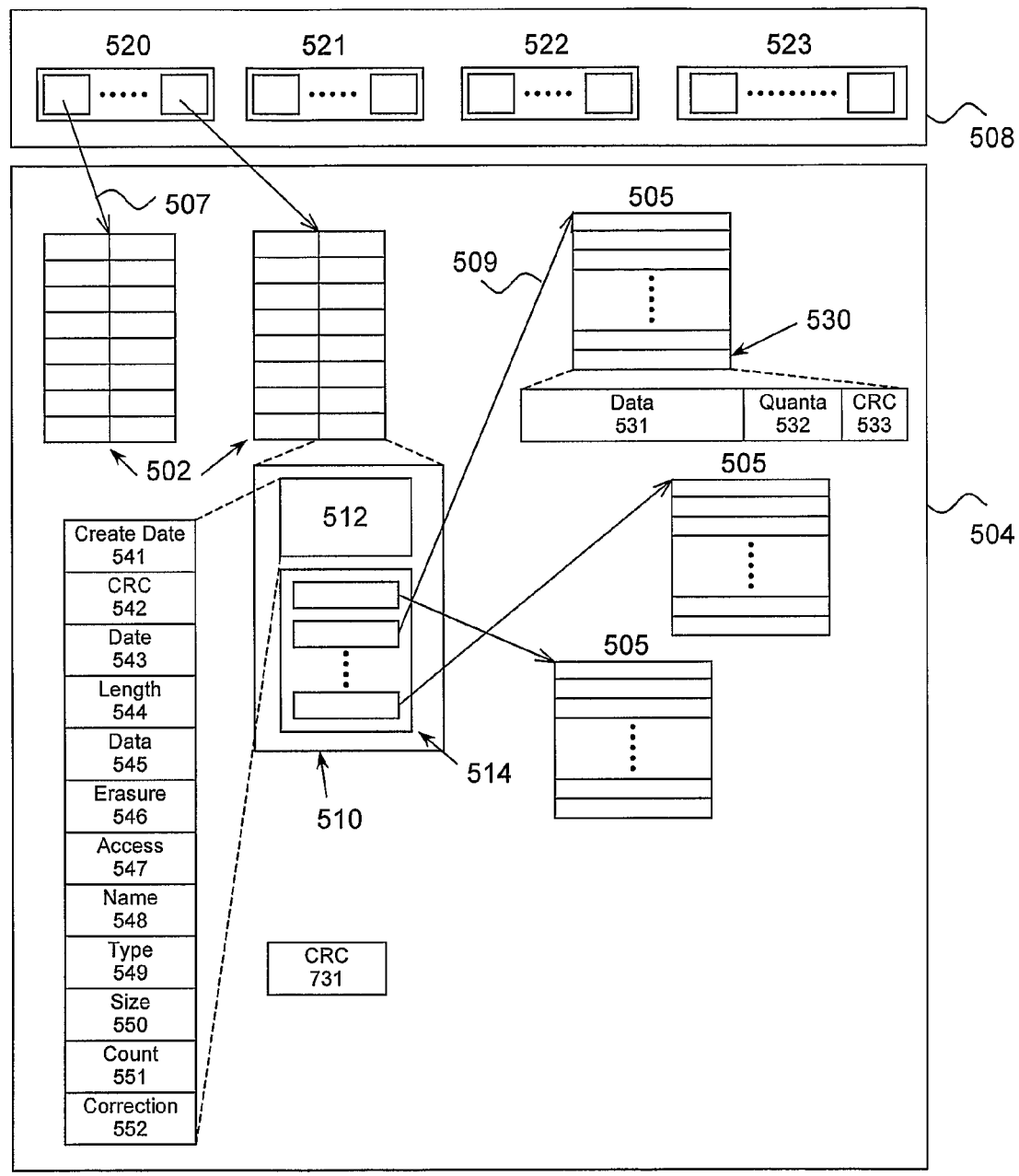
FIG. 8 is a block diagram of the flash file system architecture of the client processor device.

The data-flash memory 120 is divided up into 264 byte pages, where 256 bytes are used for actual data, and the 8 spare bytes are used for indicating what portions of the page contain valid data. A structure is used, as shown in FIG. 8, where 508 represents RAM components and 504 the components stored in the data-flash memory 120. One or two flash blocks are treated as an allocation unit, depending on the device capacity, so that a total of 256 allocation units are available. An allocation unit may be a directory unit 502, or a data unit 505. The directory units 502 each include directory entries 510 having a header 512 and a table 509. The header 512 includes information about the file, such as its local creation date 541, CRC 542, release date 543, length 544, data quanta count 545, erasure quanta count, 546, access mode 547, name 548, type 549, quanta size 550, quanta count 551, erasure correction 552. Table 514 includes pointers 509 to the data allocation units 505 that actually hold the data for the file. Each data allocation unit holds one or two blocks, being eight or sixteen pages 530 depending on the flash device capacity. A page 530, containing valid data, consists of 256 bytes of data 531, 4 bytes of quanta 532, and a 32-bit CRC. The quanta 532 represents up to 32 indicator flags, which indicate which bytes of the data 531, are valid. The RAM 108 maintains a set of tables 520, which each have pointers 507 to predefined number of directory units 502 which each include 16 or 32 directory entries 510 per unit, depending on flash device capacity.

Allocation units in write-protected flash and those in read-write flash are allocated from pools 521 and 522, respectively, representing free allocation units, maintained in RAM 108.

A table 523 is maintained for the state of all directory entries 510 in the directory allocation units 502 in the write-protected and read-write areas of the flash memory 120. The state defines whether the directory entry 510 contains an allocated file header 512, and if so, the file's name and flags indicating, whether it is complete, and any request that it be deleted. For a complete file additional state flags indicate whether it is released, for use by the virtual machine. The state also indicates whether a released the file is locked and/or open.

A count of the total number of writes to each allocation unit is maintained in a table in EEPROM 109. The count is used to ensure the next allocation unit with the lowest count is used thereby achieving even wear of the flash. If this count exceeds a threshold, then the file system will not reallocate the allocation unit, and it can be treated as allocated in order to avoid further access to it. A free allocation unit with the least number of writes to it is allocated first. The file system updates the pointers accordingly if allocation units are moved due to a worn unit.

Figure 13:
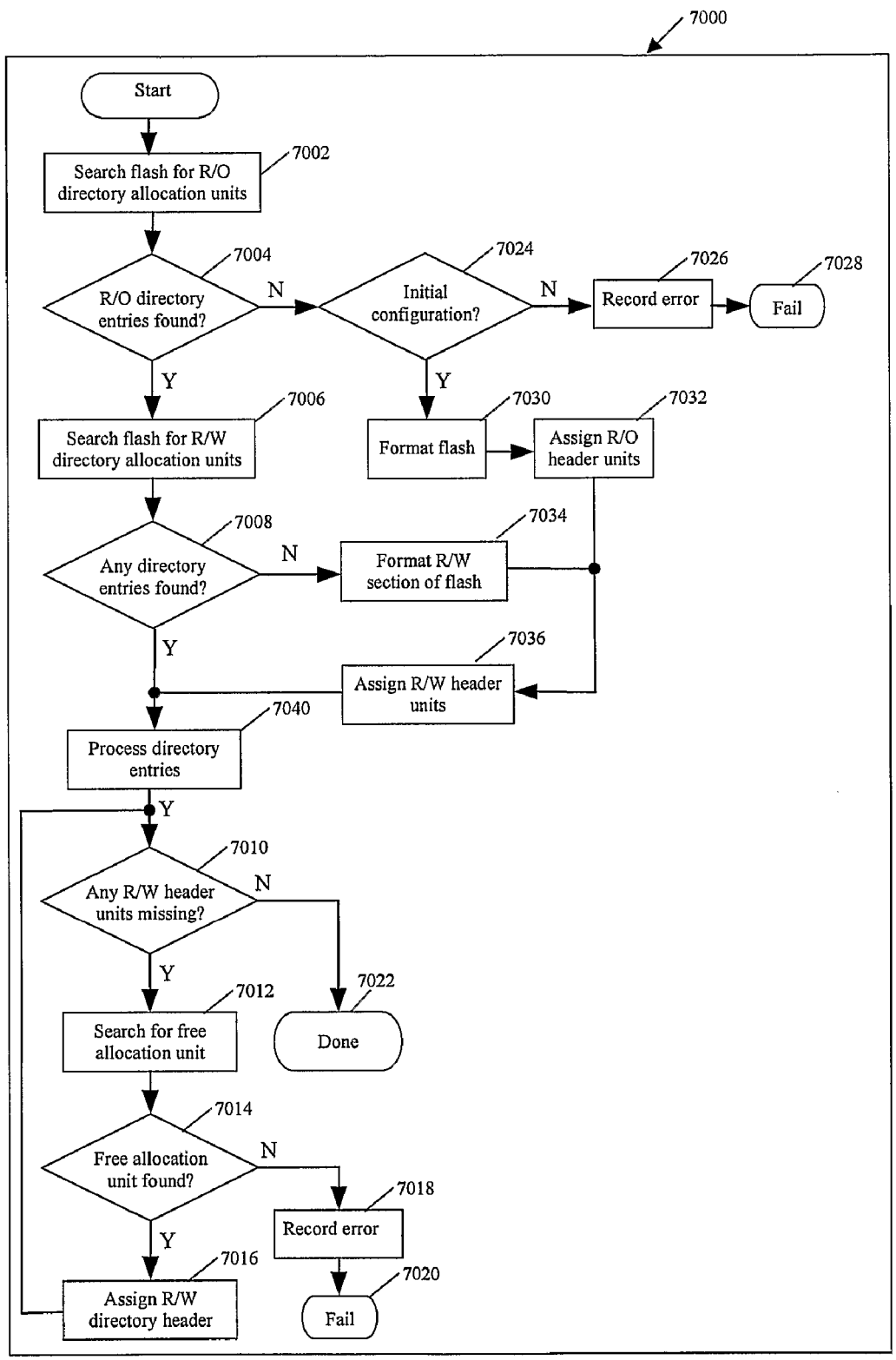
FIG. 13 is a flow diagram of an initialisation procedure for the flash memory system.

The flash file system task 223 on initialisation executes a start up procedure 7000, as shown in FIG. 13. The start up procedure 7000 begins at step 7002 by searching the write-protected area 410 of the flash memory 120 for the expected number of directory allocation units 502. Step 7004 determines whether such directory allocation units are found. If all units are found, step 7004 proceeds to step 7006 to search the read-write area 420 of the flash memory 120 for directory allocation units. Then, if step 7008 determines that directory allocation units are found in the read-write area, step 7008 proceeds to step 7080, where all directory entries are processed.

However, if step 7004 determines that the expected number of directory allocation units are not found in the write-protected area, step 7004 proceeds to step 7024, to determine whether the unit is in an initial configuration state. Initial configuration occurs at manufacture being indicated by a dedicated hardware signal. If step 7024 determines that the unit is not being configured, step 7026 records the error and, at step 7028, a signal is generated to indicate that the flash file system has failed to start.

If step 7024 determines that the unit is being configured, step 7024 proceeds to step 7030 to format the flash memory 120 (e.g. by deleting data from both the write-protected and read-write areas of the memory 120). At step 7032, header units in the write-protected area are created, and at step 7036, header units in the read-write area are similarly created.

Figure 14:
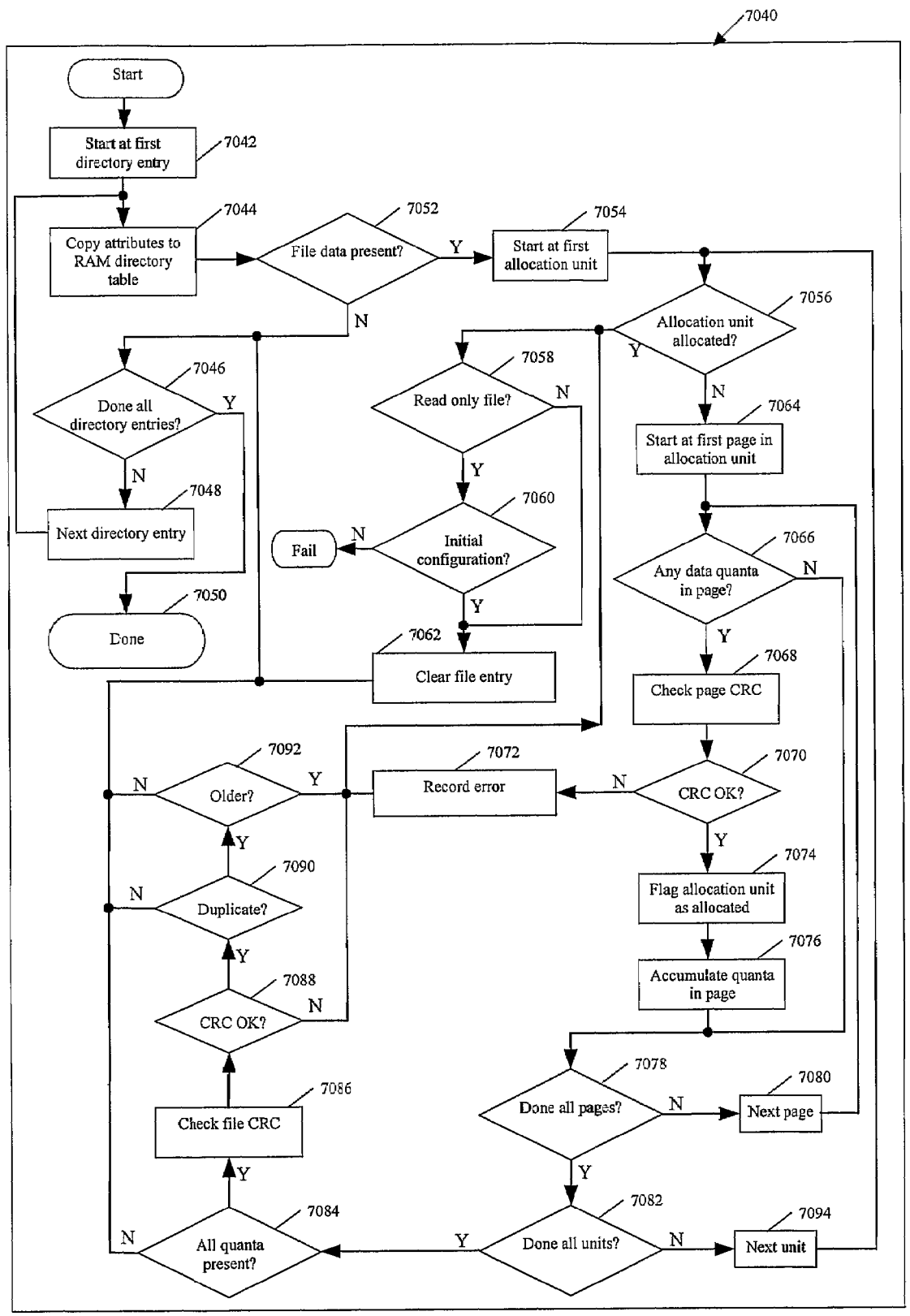
FIG. 14 is a flow diagram of a directory entry initialisation procedure for the initialisation procedure of the flash memory system.

Step 7036 proceeds to step 7040 to process all directory entries, as shown in FIG. 14. If step 7008 determines that directory allocation units 502 are not found in the read-write area, step 7008 proceeds to step 7034 to format only the read-write area. Step 7034 proceeds to step 7036 to create header units in the read-write area. Step 7036 proceeds to step 7040 to process all directory entries, as shown in FIG. 14.

Once all the directory entries have been processed, step 7040 proceeds to step 7010 to determine whether any of the directory allocation units 502 in the read-write area of the memory 120 are missing. If none are missing, step 7010 proceeds to step 7022 to start the file system. Otherwise, step 7010 proceeds to step 7012 to search for a free allocation unit in table 52 (e.g. in the read-write area). Step 7014 determines whether a free allocation unit has been found. If found, step 7014 proceeds to step 7016 to assign the free allocation unit as a directory entry. Step 7016 the proceeds to step 7010 to continue processing other directory entries. If step 7014 determines that a free allocation unit cannot be found, step 7014 proceeds to step 7018 to record the error, and at step 7020, generates a signal indicating that the file system has failed to start.

The process shown in FIG. 14 processes all directory entries in order to ascertain the files resident in the flash memory, the state and integrity of each file (i.e. whether complete, incomplete or corrupted) and the allocation units used. No assumptions are made about the state or number of files, or data allocation units prior to this process.

Step 7042 is the first step for individually processing each directory entry 510 in the directory allocation units 502 in the write-protected area, and also the directory allocation units in the read-write area of memory 120. Each directory entry 510 potentially contains data related to a file (e.g. 411, 421). Step 7042 selects a directory entry for processing. At step 7044, the file name 548 represented by the selected directory entry (contained in header of the selected directory entry), and the file location (e.g. write-protected or read-write), and attributes such as completeness are entered into a RAM directory table 523. Step 7052 then determines whether the selected directory entry contains file data. If step 7052 determines that the file contains no data, step 7052 proceeds to step 7046 which determines whether all the directory entries identified by the directory allocation units (eg. 502) in memory 120 have been processed. If so, step 7048 proceeds to step 7050 indicating all directory entries have been processed. Otherwise, step 7046 proceeds to step 7048, which selects another directory entry from the directory allocation units in memory and proceeds to step 7044.

If step 7052 determines that the file contains data, step 7052 proceeds to step 7054 to select a data allocation unit 505 corresponding to the file (e.g. by retrieving the pointer to the first data allocation unit (e.g. 505) from the table (e.g. 514) for the selected directory entry). Step 7054 then proceeds to step 7052 to process the selected data allocation unit by determining whether that unit has been allocated in memory 120 by checking table 522. If so, step 7056 proceeds to step 7058 to first determine whether the file can entry can be deleted from the corresponding directory allocation unit (as the allocation unit is incorrectly in use by another file) by determining whether the file is in write-protected space. Otherwise, step 7056 proceeds to step 7064 to check the contents of the selected data allocation unit.

If step 7058 determines the file is in write-protected space, step 7058 proceeds to step 7060 which determines if the device is in an initial configuration state. Otherwise, step 7058 proceeds to step 7062 to clear the file entry. If step 7060 determines the device is not in an initial configuration state, step 7060 proceeds to step 7094 to indicate an unrecoverable error. Otherwise, step 7060 proceeds to step 7062 to clear the file entry by de-allocating all data allocation units referred to in the by the file's header table 514, except the data allocation unit already in use by another file, then clearing the file's directory entry 510. Step 7062, then proceeds to step 7046 which determines whether all the directory entries have been processed. If so, step 7046 proceeds to step 7050 indicating that all directory entries have been processed. Otherwise, step 7046 proceeds to step 7048 to select a new directory entry and proceeding to step 7044.

Step 7064 proceeds to check the contents of the selected allocation unit 505 by selecting the unit's first page and proceeding to step 7066. Step 7066 determines whether the selected page 530 contains any data by checking whether the data quanta flags 532 indicate any data bytes are present. If so, step 7066 proceeds to step 7068 to check the CRC of the selected page by evaluating the CRC of the data 531 and quanta flags (e.g. 532) Otherwise, step 7066 proceeds to step 7078 to check whether all the pages in the allocation unit have been processed.

Step 7068 proceeds to step 7070 to check whether the evaluated CRC in step 7068, matches the stored CRC 533. If not, step 7070 proceeds to step 7072 to record the error and, at then proceeds to step 7058 to delete the file entry from the corresponding directory allocation unit, if allowed. Otherwise, step 7070 proceeds to step 7074 to set a flag in table 522 indicating that the data allocation unit 305 has been allocated.

Step 7074 proceeds to step 7076 to record a running total of the amount of data quanta contained in the data pages, and proceeds to step 7078 to check whether all the pages in the allocation unit have been processed. If not, step 7078 proceeds to stop 7080 to select another page in the data allocation unit for processing, and proceeds to step 7056. Otherwise, step 7078 proceeds to step 7082 to determine whether all the data allocation units for the file (as defined in the directory entry) have been processed. If not, step 7082 proceeds to step 7094 to select another data allocation unit for the same file (e.g. another pointer to a data allocation unit for that file), and the new selected data allocation unit is processed at step 7056.

If step 7082 determines that all the data allocation units for the file have been processed, step 7082 proceeds to step 7084. Although all the data allocation units for a file (as defined in the directory entry) have been processed, the file may still be incomplete. Step 7084 determines whether the data for the file is complete by whether the quanta accumulated in step 7076 matches the expected quanta count (e.g. 545) in the file header 540. If not, step 7084 proceeds to step 7046 to select another directory entry. Otherwise, step 7084 proceeds to step 7086 to check the CRC data for the file as a whole. Step 7088 determines whether the CRC check at step 7086 indicates that all the data contained in the file is consistent with the file CRC 543 contained in the header 540. If not, step 7088 proceeds to step 7058 to delete the file entry from the corresponding directory allocation unit, if allowed. Otherwise, step 7088 proceeds to step 7090.

Step 7090 determines whether the file presently being processed is a duplicate of another file in the flash file system by comparing file header (e.g. 512) parameters. If step 7090 determines that the file is not a duplicate, step 7090 proceeds to step 7046 to select a new directory entry. Otherwise, step 7090 proceeds to step 7092 to determine whether the date/time stamp on the present file 543 represents a time that is earlier than the date/time of another file of which the present file is a duplicate. If so, step 7092 proceeds to step 7058 to check if the file entry can be deleted from the corresponding directory allocation unit. Otherwise, step 7092 proceeds to step 7046 to 7046 to check whether all the directory entries have been processed.

The failures identified in flash memory initialisation processes 7000 and 7040 may occur as a result of corruption or loss of data in one or more flash memory pages. Possible causes of such corruption may be power failure or system re-boot whilst the data is being written to the device 100, or random data bit-errors due to wear and/or cross-talk between pages. It is beneficial to guard against these modes of failure and reducing their severity if they do occur. This can be achieved by modifying the file system to:

(a) wear the flash memory as evenly as possible;

(b) ensure loss of a single data page never affects more than one file; and (c) ensure corruption, or loss, of a single page can be recovered.

The first two are satisfied by employing distributed file directory headers throughout the flash memory (e.g. within the first data allocation unit of each file), rather than aggregating them in a few allocation units. The last can be addressed, at least in part, by using duplicate directory headers for each file, each on separate flash memory pages, to allow a corrupted header to be recovered from the intact header. To recover a lost page from the data area of a file, a simple erasure correction can be implemented by storing an additional page (e.g. along with the duplicated directory headers), to provide a page-wise parity of all data pages in the file. A corrupt header or data page can be identified by the failure of the CRC associated with each page written to flash.

Figure 15:
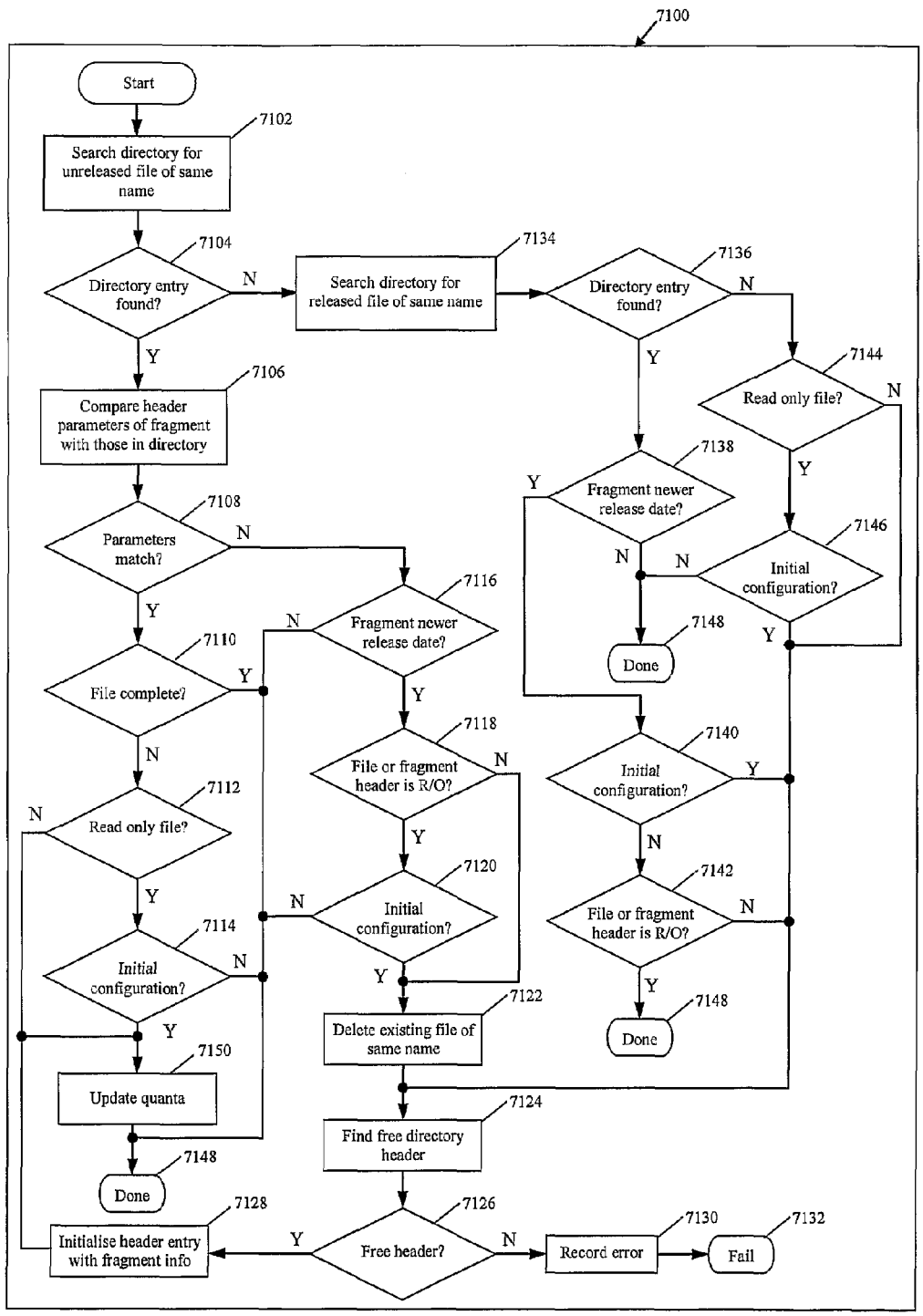
FIG. 15 is a flow diagram of a receive process of the flash memory system.

The flash file system processes file fragments received by the receiver 110 to perform a receive process 7100, as shown in FIG. 15. Space in the flash 120 is only allocated for the actual fragments received, to reduce overhead, and each file fragment is time stamped with its local creation date 541, in addition to a release date 543 determined by the transmitting server. Fragments can be received in different orders and multiple files received at once, which allows for interleaved transmission and prompt transmission of high priority files.

The receive process 7100 as shown in FIG. 15 begins at step 7102 on receiving a file fragment. Step 7102 searches the RAM directory table 523 for an unreleased file (i.e. an incomplete file or completed file not in the released state) with the same name 548 as the file fragment received. Step 7102 then proceeds to step 7104 to determine whether such an incomplete file exists in the RAM directory table 523. If found, step 7104 proceeds to step 7106, which compares the header parameters of the fragment with those of the existing file. If an unreleased file is not found, step 7104 proceeds to step 7134 to search the RAM directory table 523 for a complete file in the released state with the same name as the file fragment received.

Step 7106 then proceeds to step 7108, to determine whether the header parameters (i.e. 542 to 552) of the fragment received and the existing file match. If so, step 7108 proceeds to step 7110, which checks whether the file is completed. Otherwise, step 7108 proceeds to step 7116, which determines whether the file is obsolete by checking whether the release date 543 of the fragment received is newer than that of the existing incomplete file.

If the file is determined as complete in step 7110, step 7110 proceeds to step 7148, to end process 7100. Otherwise, step 7110 proceeds to step 7112 which determines whether the existing unreleased file is in the write-protected section of flash memory 120. If step 7112 determined that the file is write-protected, step 7112 proceeds to step 7114, which determines whether the device is in the initial configuration state which allows writes to the write-protected section of flash memory. Otherwise, step 7112 proceeds to step 7150; a process which updates the incomplete file in flash memory with the data received.

If step 7114 determines that the write-protected section is writable, step 7114 proceeds to step 7150, to update the incomplete file in write-protected flash memory. Otherwise, step 7114 proceeds to step 7148, to end process 7100, with the file fragment received being discarded, as the write-protected section 410 of the flash memory 120 is read-only.

If step 7116 determines that the fragment is newer, step 7116 proceeds to step 7118, which checks whether either the file fragment has a read-only access flag (e.g. 547), indicating that it should be stored in the write-protected area, or that the existing file is in the read-only section of flash memory 120. Step 7118 ensures a file of the same name may not exist in both write-protected and read-write areas of the flash memory.

If step 7118 indicates neither the fragment nor the existing file is read-only access, step 7118 proceeds to step 7122, which deletes the existing incomplete file as it has been made obsolete by the newer file fragment. Otherwise, step 7118 proceeds to step 7120 which checks whether write access to the write-protected area of the flash memory system is available. If so, step 7120 proceeds to step 7122 to delete the existing incomplete file by setting the delete flag in the corresponding entry in the directory table 523. Otherwise, step 7120 proceeds to step 7148, to end process 7100. Step 7122 proceeds to step 7124, which attempts to search for a free directory header in the appropriate write-protected 410 or read-write 420 areas of the flash memory depending on the read-only access flag in the received file fragment. The result of the search in step 7124 is checked in step 7126. If the search located a free header step 7126 proceeds to 7128 to initialize the fields (e.g. 542 to 552) in a new directory header 512 with the header information from the received file fragment, and the local time field 541 with the current time maintained by the clock task 225. Otherwise, step 7128 proceeds to step 7130 to record a failure to locate a free header, which proceeds to step 7132 to indicate a file system failure.

Step 7128 also flags the status of the new file as incomplete in the RAM directory table 523, and proceeds to step 7150 to commence storing the fragment as a new file.

Based on the search performed at step 7134, step 7136 determines whether a released file with the same name as the file fragment received exists in memory 120. If no such file exists, step 7136 proceeds to step 7144. However, if a released file is found, step 7136 proceeds to step 7138 to compare the release dates of the file and the file fragment. If the file fragment is newer, step 7138, proceeds to step 7140 to check whether the device is in an initial configuration state. If so, step 7140 proceeds to step 7124 commence storing the file fragment as a new file. Otherwise step 7140 proceeds to step 7142, which checks whether either the file fragment has a read-only access flag (e.g. 547), indicating that it should be stored in the write-protected area, or that the existing file is in the write-protected section of flash memory 120. If step 7142 indicates neither the fragment nor the existing file is read-only access, step 7142 proceeds to step 7124 to commence storing the file fragment as a new file. Otherwise, step 7142 proceeds to step 7148 to end process 7100.

Step 7144 determines whether the data in the file fragment received belongs to a file intended for storage in the write-protected area of memory 120 (e.g. based on access mode data stored in the file fragment). If so, step 7144 proceeds to step 7146 to determine whether the unit is in an initial configuration state, which allows write-access to the write-protected section 410 of the flash memory. Otherwise, step 7144 proceeds to step 7124 to commence storing the file fragment as a new file. If step 7146 determines the unit is in initial configuration, step 7146 proceeds to step 7124 to commence storing the fragment as a new file. Otherwise, step 7142 proceeds to step 7148 to end process 7100.

Figure 16:
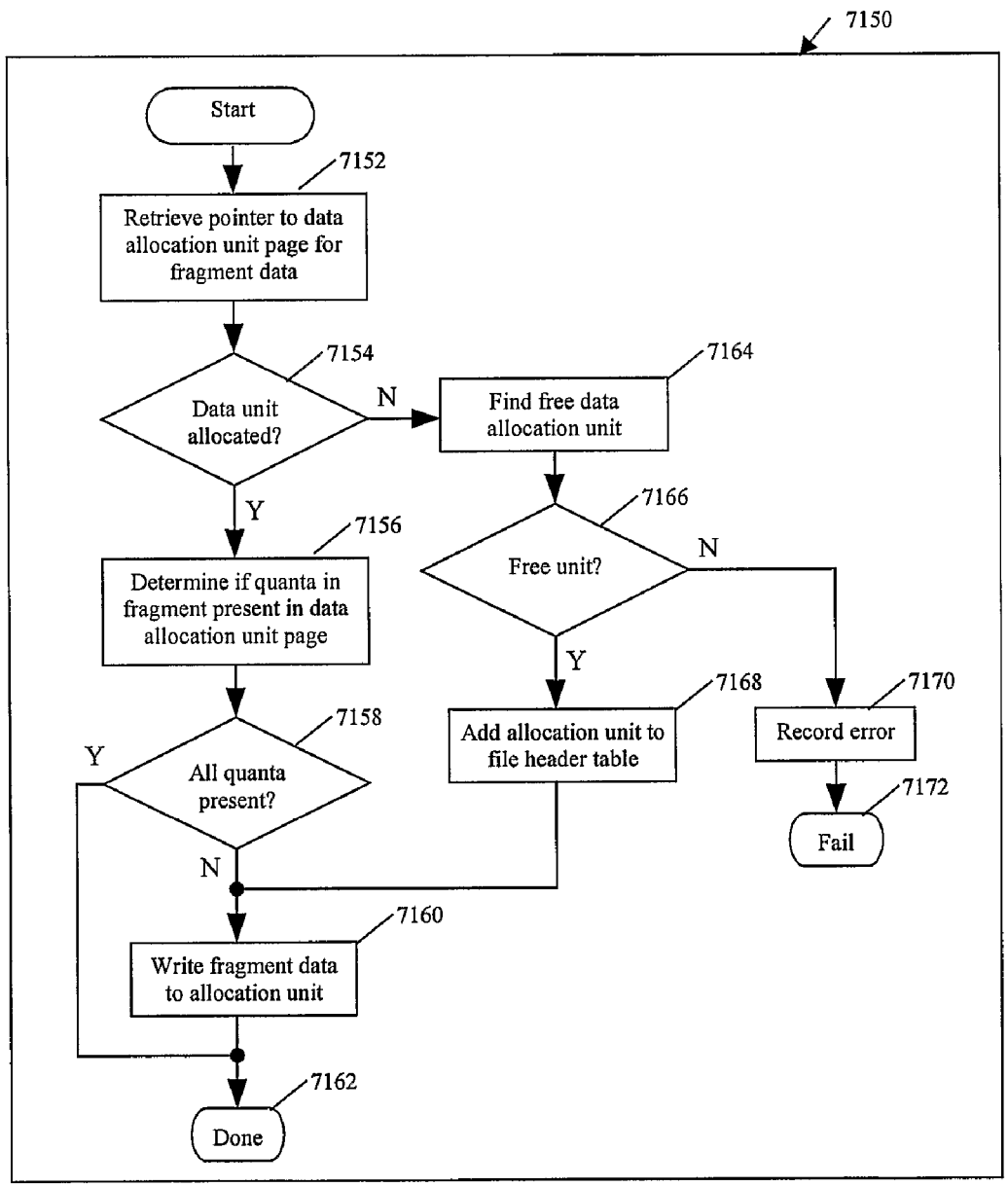
FIG. 16 is a flow diagram of an update quanta process of the receive process of the flash memory system.

The process 7150 to update an incomplete file with the data quanta received in a file fragment is shown in FIG. 16. The update quanta process begins at step 7152 by retrieving the pointer to the page 530 in the data allocation unit where the data contained in the file fragment is destined to be written. The data allocation unit is identified by indexing the table of data allocation unit pointers (e.g. 514) in the file's directory entry. The index is calculated by using the starting quanta number (e.g. 741) in the file fragment received, the quanta size (e.g. 550) and the number of quanta held by each data allocation unit.

It is assumed quanta in the file fragment do not overlap pages 530 in data allocation units, however it is straightforward to enhance the procedure to cater for file fragments that contain data that may overlap pages.

Step 7152 proceeds to step 7154, which determines whether a data allocation unit identified by step 7152 has been allocated in the data allocation unit table (e.g. 514) in the file's directory entry. If so, step 7154 proceeds to step 7156, which determines if the page identified in step 7152 contains all data quanta present in the file fragment received. Otherwise, step 7154 proceeds to step 7164, which searches the relevant pool of allocation units (e.g. 521 or 522) for a free data allocation unit depending on the read-only access flag of the file (e.g. 547). If step 7156 determines all data in the fragment are present in the file, step 7158, following step 7156, proceeds to step 7162 to end the update quanta process 7150. Otherwise, step 7158 proceeds to step 7160 to write the data in the fragment to the page and end the update quanta process 7150 at step 7162. Step 7164 proceeds to step 7166, which determines whether the search for a free allocation unit was successful. If so, step 7166 proceeds to step 7168, which adds a pointer (e.g 509) to the free allocation unit to the index in the file's header table (e.g. 514), and proceeds to step 7160 to write the fragment to the allocation unit. Otherwise, step 7166 proceeds to step 7170, which records an error, and proceeds to 7172 to end the update quanta process 7150 with a failure.

Figure 17:
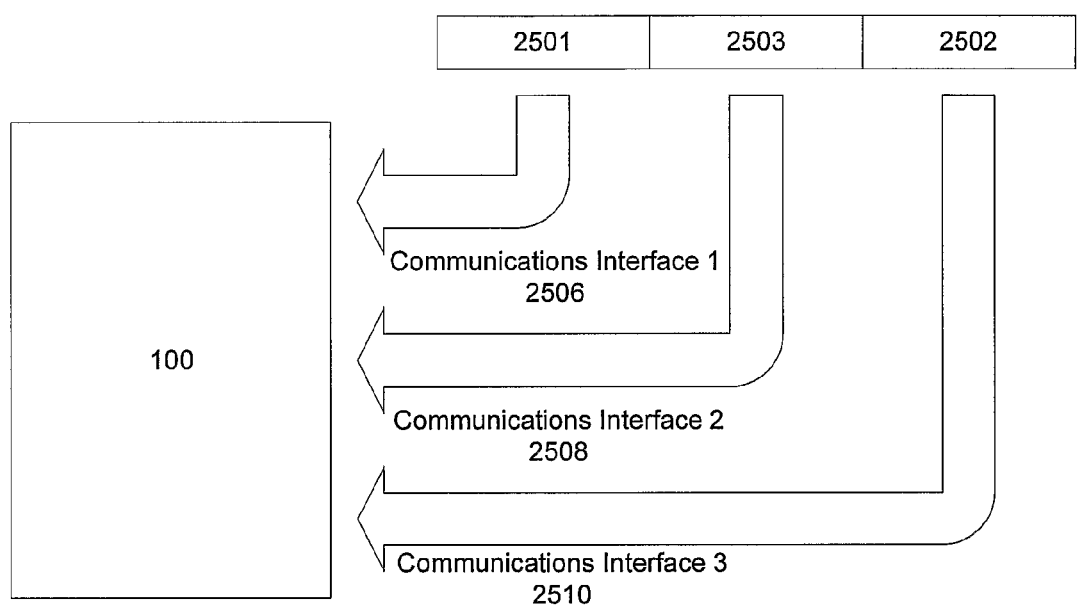
FIG. 17 is a block diagram of the client device receiving files from the server transmission system via a variety of network interfaces.

FIG. 17 shows the client device 100 receiving files from the server transmission system as file fragments 2501, 2502 and 2503. The file fragments 2501, 2502 and 2503 may be sent to the client device 100 via a different communications interface 2506, 2508, 2510 (e.g. interfaces for a paging network, a wireless network, the Internet, or a direct connection with the client device 100). The file fragments 2501, 2502 and 2503 do not have to be sent or received in any particular sequence. When the client device 100 receives all the file fragments 2501, 2502 and 2503, the device 100 reorganises all the fragment into their proper sequence for processing (e.g. based on the fragment identifier for each file fragment 2501, 2502 and 2503 indicating their sequence).

Similarly, commands and configuration data can be sent to the client device 100 via a different communications interfaces.

The file system also implements erasure correction recovery of missing fragments. All files have an associated 32-bit cyclic redundancy check (CRC) and a CRC calculated locally and stored for every page to check the integrity of the data stored in the flash memory page. These erasure correction pages follow the end of the file. A file missing core fragments also has provision for Erasure Error Correction (EEC) data at the end, and when the necessary file data is received or able to be reconstructed using the EEC data, any EEC data is freed and file marked as "complete".

Once the file is complete, it cannot be altered or patched by the VM task 213, but can only be deleted by the flash file system.

The flash file system supports a locking mechanism to prevent them from being deleted during a garbage collection process performed by the file system task, particularly if a new version of the file is available. A locked file gives an application guaranteed access to that file. The flash file system always locks existing files on initialisation and newly completed files. Files can only be unlocked by the application.

Figure 18:
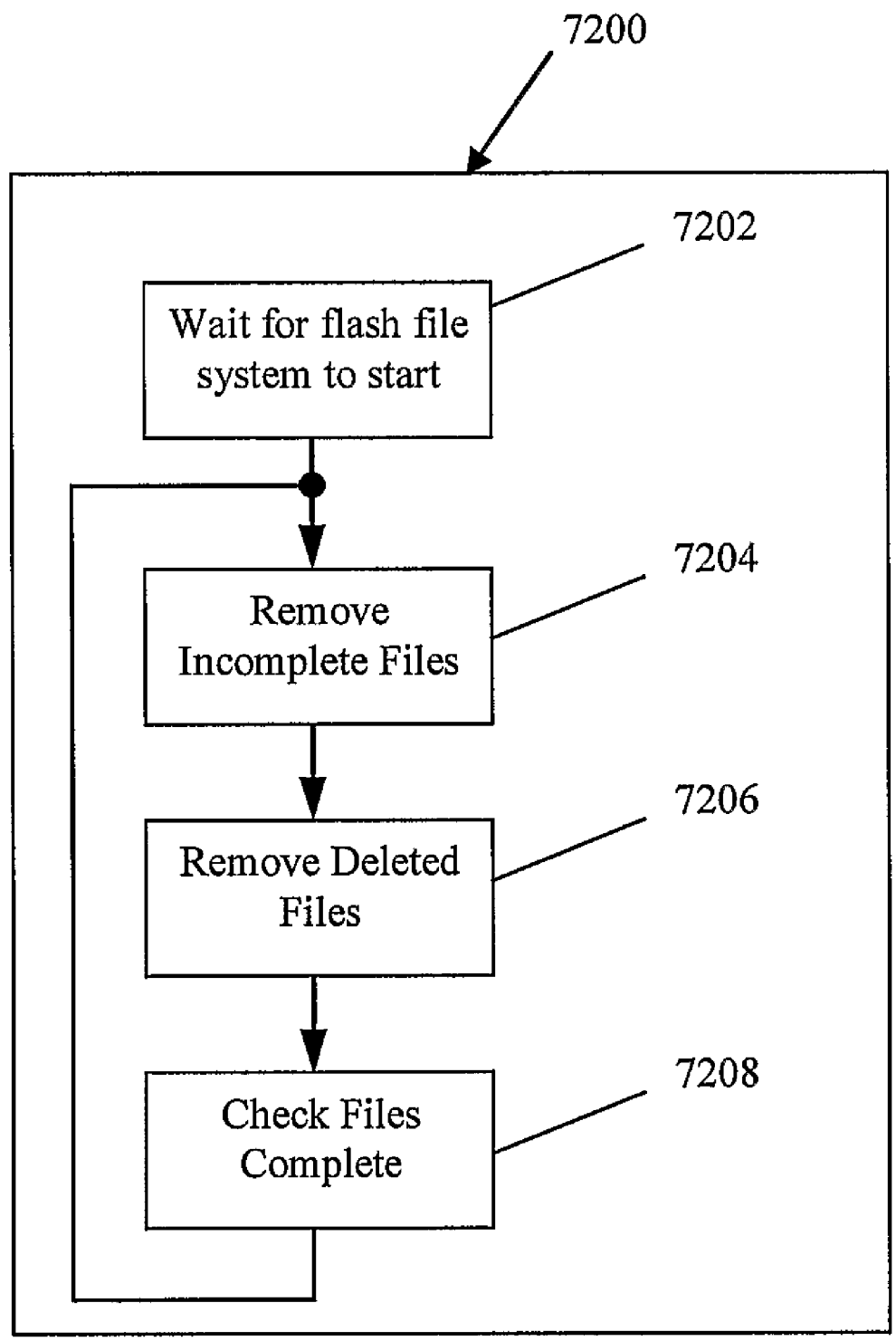
FIG. 18 is a flow diagram of a file house keeping process of the flash memory system.
Figure 19:
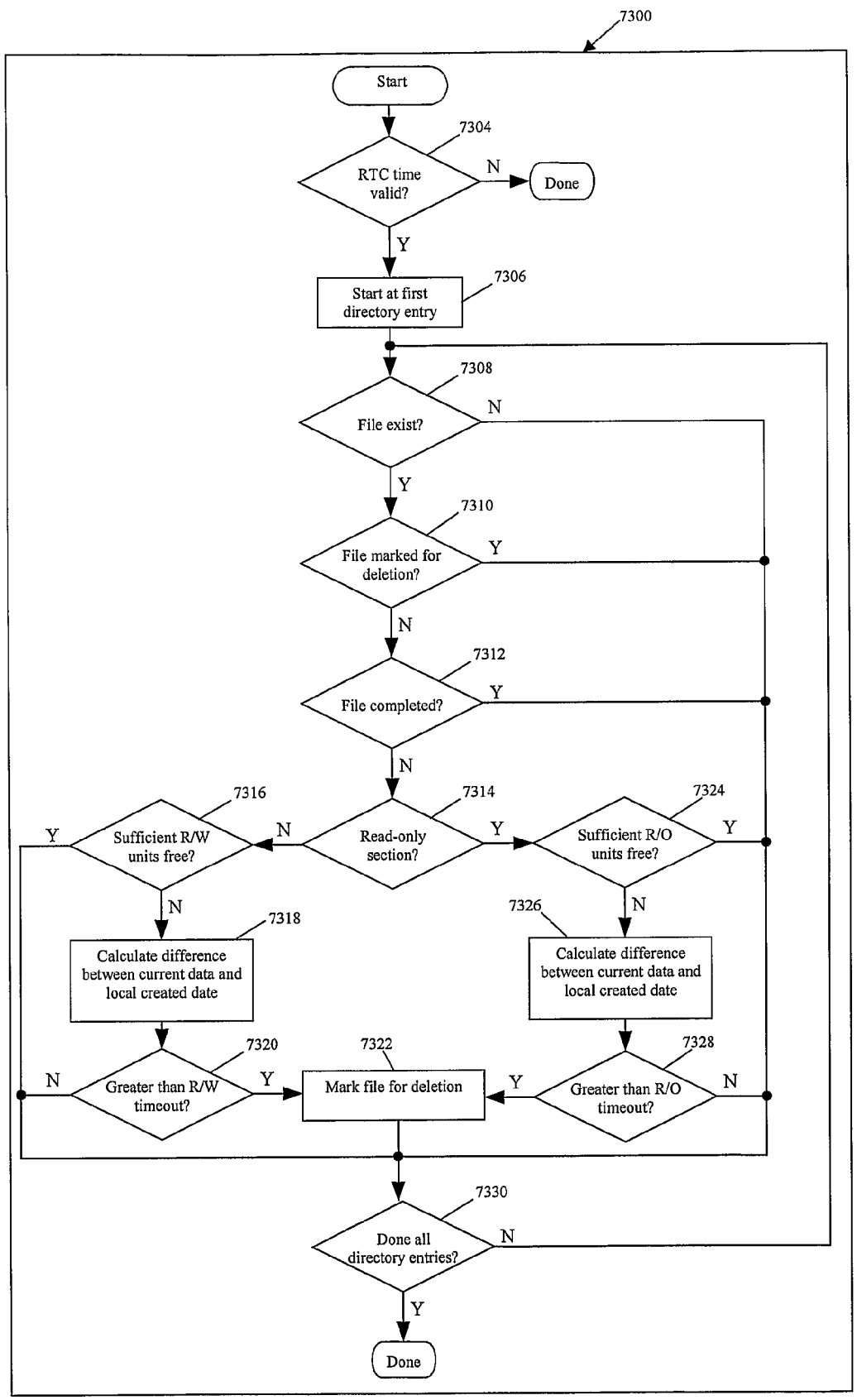
FIG. 19 is a flow diagram of an incomplete file removal process of the flash memory system.
Figure 20:
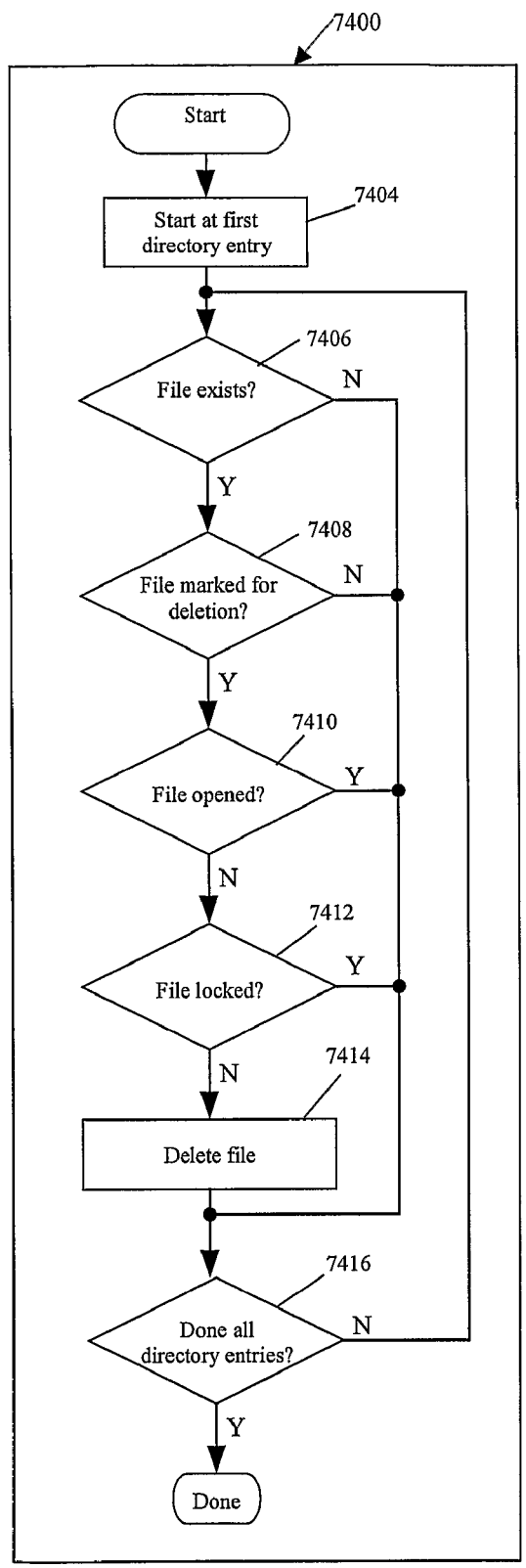
FIG. 20 is a flow diagram of a file deletion process of the flash memory system.
Figure 21:
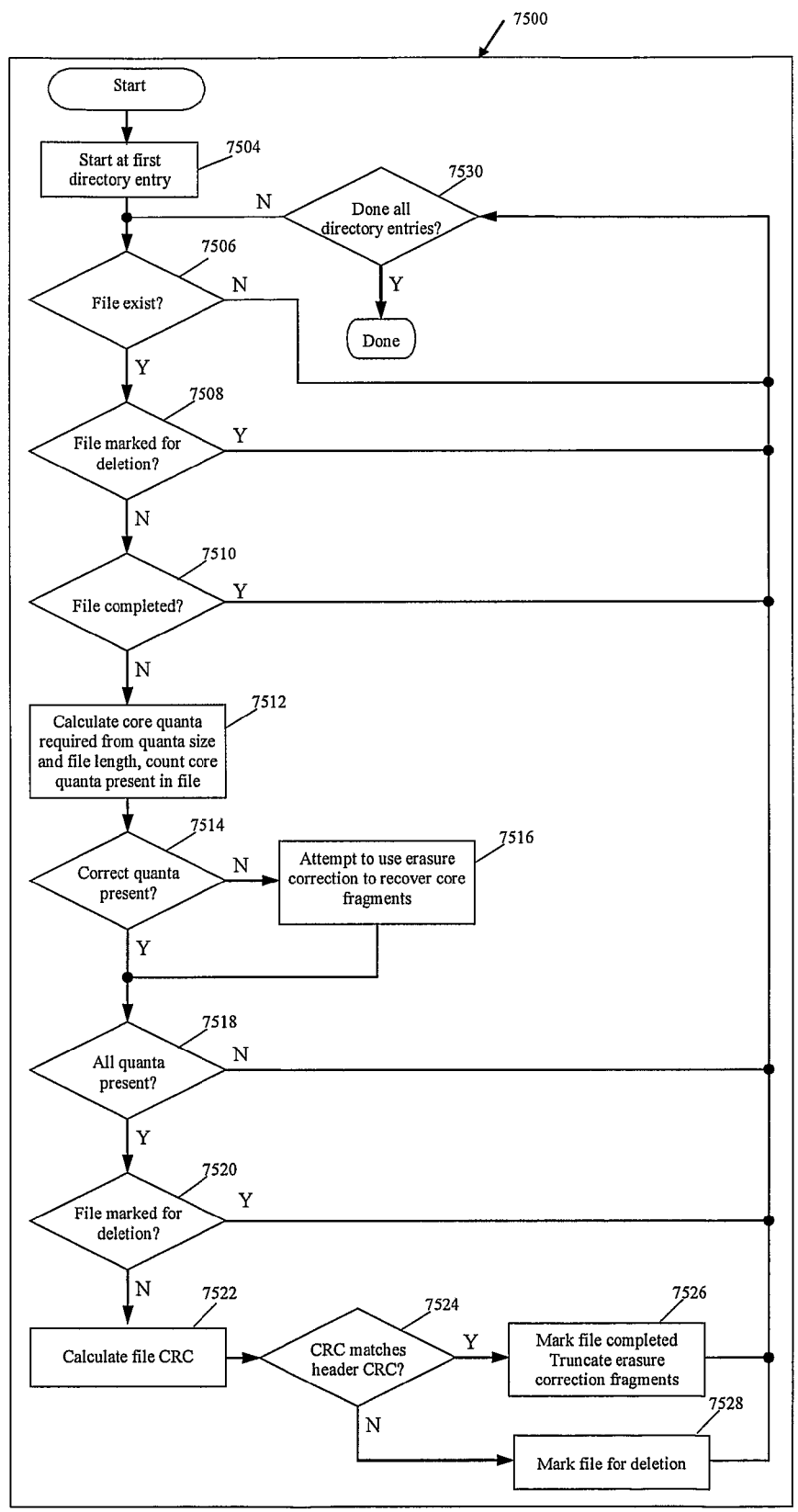
FIG. 21 is a flow diagram of a building missing fragments process of the flash memory system.

The file system housekeeping process 7200 is shown in FIG. 18. Once the flash file system is started at step 7202, process 7200 executes a number of procedures in turn to remove incomplete files (at step 7204), remove deleted files (at step 7206) and to check completed files for deletion (at step 7208). The function of steps 7204, 7206 and 7208 are described in further detail with reference to processes 7300, 7400 and 7500 respectively, as depicted in FIGS. 19, 20 and 21. The actions of determining which file to delete and actually deleting them are made separate by the use of a deletion flag to indicate to the deletion process that the file is a delete candidate. This allows the relatively slower deletion process shown in FIG. 20 to be handled by the housekeeping task 223 thereby speeding up any process which wishes to delete a file.

FIG. 19 is a flow diagram of the process 7300 for removing incomplete files if they are not completed within a specified time. If the number and type of free allocation units (i.e write-protected or read-write), related to the access mode of the file, fall below a preset threshold less time is allowed for incomplete files to become complete to free up more allocation units. Process 7300 begins at step 7304 by determining whether the Real Time Clock (RTC) of the microprocessor 102 is returning a valid time value. If the RTC output is not a valid time value, process 7300 ends and execution returns to process 7200. Otherwise, if the RTC output is valid, step 7304 proceeds to step 7306 to locate a first directory entry in the flash memory 120 for processing. Step 7306 proceeds to step 7308 to retrieve data stored in the directory entry and determine whether the directory entry corresponds to a file. If the directory entry does not correspond to a file, step 7308 proceeds to step 7330. Otherwise, step 7308 proceeds to step 7310 to determine whether the file has been marked for deletion. If the file has been marked for deletion step 7310 proceeds to step 7330. Otherwise, step 7310 proceeds to step 7312 to determine if the file is complete. If so, step 7312 proceeds to step 7330. Otherwise, step 7312 proceeds to step 7314 to determine if the file is stored in the write-protected section of the flash memory 120 (i.e. read-only memory if not in initial configuration).

If the file is stored in write-protected memory, step 7314 proceeds to step 7324 to determine if there are sufficient free allocation units in the read-only memory for storing more data. If the write-protected memory has sufficient capacity, step 7324 proceeds to step 7330. Otherwise, step 7326 generates the time difference between the local creation date of the file (i.e. the time when the first portion of the file was stored in memory 120) and the time at which the most recent portion of the file was received. Then, step 7328 determines whether the time difference generated at step 7326 exceeds the predetermined timeout value for the write-protected memory. If the generated time difference exceeds the timeout value for the write-protected memory, then step 7328 proceeds to step 7330. Otherwise, step 7328 proceeds to step 7322 to mark the file for deletion.

If the file is stored in the read-write section of the flash memory 120 (i.e. read-write memory), then step 7314 proceeds to step 7316 to determine if there are sufficient free allocation units in the read-write memory for storing more data. If the read-write memory has sufficient capacity, step 7316 proceeds to step 7330. Otherwise, step 7318 generates the time difference between the local creation date of the file (i.e. the time when the first portion of the file was stored in memory 120) and the time at which the most recent portion of the file was received. Then, step 7320 determines whether the time difference generated at step 7318 exceeds the predetermined timeout value for the read-write memory. If the generated time difference exceeds the timeout value for the read-write memory, then step 7320 proceeds to step 7330. Otherwise, step 7328 proceeds to step 7322 to mark the file for deletion.

Step 7322 marks the file for deletion (e.g. by setting the deletion flag for the file) and proceeds to step 7330 to determine whether all directory entries in the memory 120 have been processed. If so, process 7300 ends and execution returns to process 1200. Otherwise, step 7330 proceeds to step 7308, where a different directory entry is selected and processed.

FIG. 20 is a flow diagram of the process 7400 for removing files marked for deletion from the memory 120. Process 7400 begins at step 7404 by locating a first directory entry in the flash memory 120 for processing. Step 7404 proceeds to step 7406 to retrieve data stored in the directory entry and determine whether the directory entry corresponds to a file. If the directory entry does not correspond to a file, step 7406 proceeds to step 7416. Otherwise, step 7406 proceeds to step 7408 to determine whether the file has been marked for deletion by examining the file's status in the directory table 523. If the file has not been marked for deletion step 7408 proceeds to step 7416. Otherwise, step 7408 proceeds to step 7410 to determine if the file is open (e.g. currently being opened or used). If so, step 7410 proceeds to step 7416. Otherwise, step 7410 proceeds to step 7412 to determine if the file is locked (e.g. locked so it will not be deleted). If so, step 7412 proceeds to step 7416. Otherwise, step 7412 proceeds to step 7414 to delete the file. Step 7414 proceeds to step 7416 to determine whether all directory entries in the memory 120 have been processed. If so, process 7400 ends and execution returns to process 7200. Otherwise, step 7416 proceeds to step 7406, where a different directory entry is selected and processed. The main file system housekeeping loop is also responsible for checking incomplete files and building any missing fragments using received erasure correction fragments where possible, as depicted in FIG. 21. A CRC is performed on any newly completed files to check their integrity. The process of assembling files is decoupled from the receive fragment process shown in FIG. 15, to simplify both.

FIG. 21 is a flow diagram of the process 7500 for marking incomplete files for deletion from the memory 120. Process 7500 begins at step 7504 by locating a first directory entry in the flash memory 120 for processing. Step 7504 proceeds to step 7506 to retrieve data stored in the directory entry and determine whether the directory entry corresponds to a file. If the directory entry does not correspond to a file, step 7506 proceeds to step 7530. Step 7530 determines whether all the directory entries in the memory 120 have processed. If so, process 7500 ends and execution returns to process 7200.

Otherwise, step 7530 selects another directory entry from memory 120 and proceeds to step 7506 to process the new directory entry.

If step 7506 determines that the directory entry corresponds to a file, step 7506 proceeds to step 7508 to determine whether the file has been marked for deletion. If so, step 7508 proceeds to step 7530. Otherwise, step 7508 proceeds to step 7510 to determine whether the file is complete. If the file is complete, step 7510 proceeds to step 7530. Otherwise, step 7510 proceeds to step 7512 to generate the core quanta present in the file (i.e. the amount of data for the file, excluding the erasure correction fragments) and the core quanta still required (i.e. the amount of data still required for the file to be complete). The core quanta required may be determined, for example, by subtracting the core quanta present in the file from the file length. Step 7512 proceeds to step 7514 to verify whether the quanta present for the file (determined at step 7512) is actually stored in the file system. If so, step 7514 proceeds to step 7518. Otherwise, step 7514 proceeds to step 7516 to attempt to record core quanta of the file using the error correction fragments. Step 7516 then proceeds to step 7518.

Step 7518 determines whether the core quanta for the file has been stored in memory 120 (e.g. including the fragments recovered at step 7516). If not, step 7518 proceeds to step 7530. However, if all the core quanta is present, step 7518 proceeds to step 7520 to determine whether the file has now been marked for deletion. If so, step 7520 proceeds to step 7530. Otherwise, step 7520 proceeds to step 7522 to generate CRC data for the file. Then, at step 7524, the CRC data generated at step 7522 is compared with the CRC data stored in the header of the file. If the CRC data match, step 7524 proceeds to step 7526 to mark the file as completed, and truncates the erasure correction fragments for the file. Otherwise, step 7524 proceeds to step 7528 to mark the file for deletion. Both steps 7526 and 7528 proceed to step 7530.

Virtual Machine

The virtual machine (VM) 321 is a software module executed by the processor core 102 as a task, VM task 221, which runs applications stored in the flash file system. The VM is implemented as a byte-code interpreter that allows a single application to be run at any time, as the interpreter is single threaded. The VM may include, for example, two separate program counters and two separate stacks in order to run multiple applications. The use of byte-code allows the execution of applications from the data-flash memory that otherwise would not be able to be run by the processor 102.

A VM application is primarily event driven. It polls and acts on an event queue which accepts asynchronous events from user I/O (e.g. buttons), scheduled timer events, etc.

A particular application normally resides in a single identified file, as discussed below, but the interpreter supports call and return of functions in other files, which allows the application code to be maintained in a modular fashion, and thereby reducing file size downloads.

At any time there may be many application and data files resident in the flash file system. The following process determines what application to run and also manages the removal of redundant files.

Figure 9:
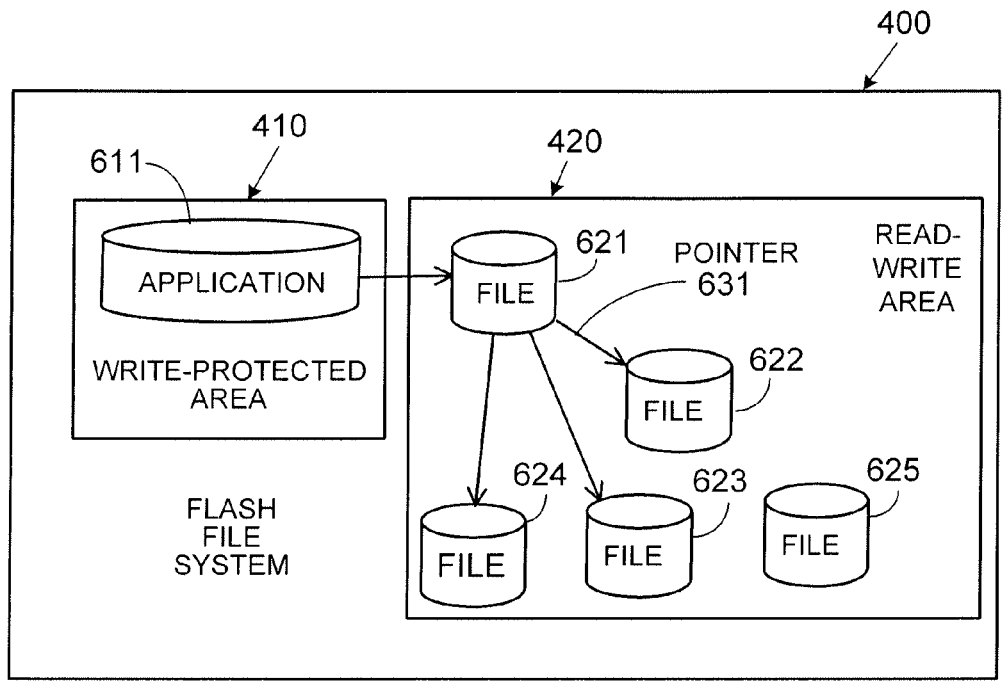
FIG. 9 is a block diagram of an application management system of the client processor device.

The VM 321 when started in the VM task 221 first attempts to run a file with name "0" (i.e. the "init" application 611, as shown in FIG. 9) typically stored in the write-protected area 410 of the flash file system 400. The init application 611 reads a configuration "init-tab" table file 621 which determines what file or files correspond to applications to be executed, the data files required for each application and the conditions under which the applications should each be executed (e.g. by using the pointers 631 to those files stored in the init-tab file 621). The init-tab file 621 is stored in the read-write area 420 so it can be regularly updated as the application and data files 622, 623, 624 stored in the flash memory 120 are updated. The init application 611 is also responsible for identifying and flagging files 625 that are candidates for deletion to help ensure the flash file system always has space for new files. Any files not identified in init-tab file 621 are delete candidates.

TABLE 1

| Event | Application | Data Files |
|---|---|---|
| A | 12 | 2,3,7,8,9,13 |
| . | . | |
| . | . | |
| A | 6 | 2,3,5,7,8,9,10,11 |
| A, B | 1 | 2,3,4,5 |

Table 1 provides an example of the data in an init-tab file 621 which refers to three applications, respectively stored in files 12, 6 and 1. The first column identifies the events from the event queue that may be used to trigger the running of the application file in the second column. The last column determines data files required by each application.

The init-tab file 621, as shown in Table 1, states that an initial version of the application governing the operation of the device 100 was placed in file "1", and used data files 2, 3, 4 and 5. After some time, a new version of the application was produced with expanded functionality, and transmitted. This new version of the application used all files that original version used, with the addition of new data files 7, 8, 9, 10 and 11. The new version of the application was placed in file 6. Finally, the latest version of the application was created and transmitted to the device 100. The latest version of the application eliminated several of the old data files (4, 5, 10 and 11) and added new data file 13. The latest application file has been placed in file 12. The init-tab file 621 endeavours to run application file 12 if possible, otherwise application file 6 is run, or otherwise application file 1. An application file is only run if the init-tab file 621 is able to verify that all required data files for execution of a particular application file are available.

The init-tab file may also be structured to identify additional files for each event that need not be present to run the corresponding application, but must not be identified as delete candidates. This allows optional files to be present to be used by the application, if desired, without them being removed by the init application 611. If the space for new files or the number of free directory entries is below a certain threshold, file system resource may be recovered by removing one or more sets of files in init-tab corresponding to the lower priority events depending on the amount of resource to be recovered.

New data files 622, 623, 624 for an application may be received using receive process 1100 in FIG. 15, and once received, the files are locked by the application (e.g. by setting a read-lock flag corresponding to each file). Such locking prevents that application from using other data files which are not part of the current version being used by the application (e.g. files for a previous version). The application may use data files for a previous version by first unlocking the files for the current version being used, and then locking the files for the version selected for use.

The byte-code instructions of an application can be read into a small cache maintained in the RAM 108 to reduce the flash access overhead. The cache size being empirically set to balance cache load overhead with cache misses. The VM implements a data stack to store the local temporary variables and parameters. The design of the byte-code instructions used by the application files and interpreted by the VM are orthogonal to ease compiler design whilst minimising the number of instructions. They are grouped into 8-bit, 16-bit, 32-bit, floating-point groups and by number of operands for execution efficiency. A common set of operations is supported in all arithmetic groups (such as arithmetic, memory operations etc.), and additional operations may be supported for each group (e.g. bit tests for integers or for floating-point numbers etc.). Other operations, which are not part of the VM (such as trigonometric operations) are implemented, as desired, by function such as flash read/write. The function and system calls are executed using VM instructions involving unique function and system operational codes, respectively. A single operand is accepted to determine the operation to be performed, and any required parameters are passed via the data stack. The system calls are handled externally of the VM and this allows extensions that do not affect the core of the virtual machine. Calls to the flash file system, for example, allow directory information and file data information to be read.

An application can make a system call to the VM to reboot the device 100, if this is necessary for the application to now be run or take advantage of any new OS components sent to the device 100.

Air Protocol

The receiver 110 and the processor 102 utilise an air protocol to receive information including commands, time of day and file fragments. Information is transmitted using the air protocol by a server transmission system that has a server communications application to implement the air protocol and which can use an existing pager communications network infrastructure for transmission. The air task 214 controls communications between the processor 102 and the receiver 110. The air protocol is a communications protocol that, in accordance with the OSI layer model, has different attributes for a physical layer, a data link layer, a network layer and a transport layer The device 100 can use an existing communications network infrastructure to receive information, for example a paging network. Accordingly the link layer of the air protocol can be tailored to support transmission of text messages as defined by the Post Office Code Standardisation Advisory Group (POCSAG) standard.

The physical layer is simply the bit stream that is broadcast and received by the receiver 110. All the receivers 110 of different client devices 100 are normally tuned to the same carrier frequency for an application. This allows all of the client devices 100 to be updated with application files, as required. A unique ID or address for each device 100 (such as the serial number for the device 100), is available to filter the packets for an individual device 100. The device 100 is therefore identified by a paging address, and transmissions can be made for a number of paging addresses. The link layer supports a sub-set of the printable 7-bit characters, as discussed below.

The network layer supports the transmission of multicast packet data. The packets include address information to send the data to a single device address, a group of devices or all devices. A type parameter is used to identify the data carried, and the data types include commands, time and file segments, ie fragments. The network layer also enables data authentication and validation.

The transport layer supports the carriage of an arbitrary number of data octets of any length up to a maximum length supported by the link layer, which for the device 100 is 170 octets. The transport layer also provides error detection and optional correction so that corrupted packets can be identified and corrected.

For the transport layer, the data is pre-pended with its length in octets. The length is represented by an octet representing an unsigned 8-bit number. A CRC-32 is calculated from this and appended in little endian format as a quad-octet. The resulting message is then broken into quad-octets, padding with zeroes as necessary. Each quad-octet is converted to group of 5 ASCII characters using a base 85 encoding scheme, similar to RFC1924, as discussed below.

The quad-octets are each treated as a little endian 32-bit unsigned number. To convert repeatedly they are divided by 85, taking the remainders at each step. The 5 remainders are placed in little endian order. They are each mapped to a printable character by using a mapping scheme that has monotonically increasing values, which allows for simpler decoding (ie without using a look-up table).

The resulting ASCII message is then padded out to a multiple of 20 characters by padding with '}'. A '}' is used because a group of 5 is an illegal BASE-85 encoding. This is to ensure that the message occupies a complete number of POCSAG codewords (each contains 20-bits, 20 characters=7 codewords). The group is encoded also using the base 85 encoding scheme.

For the network layer, an air protocol packet has the following structure:

```
<packet> ::= <Protocol Id><payload>
    <Protocol Id> ::= <octet>
    <payload> depends on <protocol Id> which designates
    the protocol type.
```

Protocol Id has a value that identifies the protocol as follows.

<Protocol Id>=1 allows sending of a data of a specified type. This can be sent to specified processors by the parameter <Processors> if the device 100 has more than one processor 102. More than one processor may be included in the device 100 in situations where a GPS receiver of the device 100 has a processor that is considered to be a separate processor for which files may need to be downloaded. Alternatively, an additional processor 102 may be included to be dedicated to a particular OS task to enhance the cycle time for that task and in turn enhance the speed of the device 100. Then <payload>::=<Address><Processors><Type><Data>

<Protocol Id>=2 allows transmission of a specified data type to specified processors in a group of devices with a timestamp.

<payload>::=<Address><Processors><Type><Time stamp><Data>

<Protocol Id>=3 allows transmission of authenticated data to specified processors with specified type to a group of devices with a timestamp.

<payload>::=<Address><Processors><Type><Time stamp><Authentication><Data>

<Protocol Id>=4 allows transmission of a specified data type to specified processors in a group of devices with a timestamp and a local time offset.

<payload>::=<Address><Processors><type><Time stamp><Local time offset><Data>

<Protocol Id>=5 allows transmission of specified data type to a set of units in a specified product and platform range with timestamp and local time offset.
  <payload>::=<Product Id><Platform_range><Address><Type><Data>
<Protocol Id>=6 allows transmission of specified data type to a set of units in a specified product and platform range with timestamp.

---
<payload> ::= <Product Id><Platform_range><Address><Type><Timestamp><Data>
---

<Protocol Id>=7 allows transmission of specified data type to a set of units in a specified product and platform range with timestamp and authentication.

---
<payload> ::= <Product Id><Platform_range><Address><Type><Timestamp><Authentication><Data>
---

<Protocol Id>=8 allows transmission of specified data type to a set of units in a specified product and platform range with timestamp and local time offset.

---
<payload> ::= <Product Id><Platform_range><Address><type><Timestamp><Local time offset><Data>
---

For product Id:
  The product Id allows the particular pager address (cap code) to support multiple products by identifying which product should receive the packet:
  <Product Id>=<octet>

For platform range:
  The platform range determines what releases of the platform should receive the packet by means of a range of acceptable platform build numbers:

---
<Platform_range> ::= <platform_min><platform_max>
<platform_min>,<platform_max> = <platform> =
<octet_LSB><octet_MSB>
<address> ::= <broadcast>|<group>|<serial> =
<octet><octet><octet><octet>
  <broadcast> ::= 0xFF, 0xFF, 0xFF, 0xFF
  <group> ::= 0xFF,0xFF, <group Id>
  <group Id> ::= <octet_LSB><octet_MSB> 0x0000 ... 0xFFFE
  <serial> ::= <octet_LSB><octet><octet><octet_MSB>
---

For addressing:
  Specifies all devices, a particular device or a group of devices.
  <Processors>::=<octet>=<processor1:lsb> ... <processor8:msb>
  Specifies a set of processors from a maximum of 8.
  Message types specifies how the system should handle the data being transmitted:

---
<type> ::= <octet> = <file fragment> | <set time> |
<set groups> | <user data> | <user alarm>
---

<file fragment> ::= 1
  <set time> ::= 2
  <set groups> ::= 3
  <user data> ::= 4
  <user alarm> ::= 5

---

The actual message data transmitted:

---
<data> ::= {<octet>} | <file fragment> | <set time> |
<set groups> | <user data> | <user alarm>
---

For a file fragment sent to a specified memory:

---
<file fragment> ::= <header>{<byte>}
<header> ::= <CRC32><date><length><data><erasure><number>
<access><name><size><count><correction>
  <CRC32> ::= <LSB:octet><octet><octet><MSB:octet> = CRC32 of core file contents
  <date> ::= <time> = Release date
  <length> ::= <LSB:octet><octet><octet><MSB:octet> = file length in bytes
  <data> ::= <LSB:octet ><MSB:octet > = length of all data quanta and erasure correction quanta in bytes
  <erasure> ::= <LSB:octet ><MSB:octet > = length of all erasure correction quanta only
  <number> ::= <LSB:octet ><MSB:octet > = first quanta number in this fragment
  <access> ::= <section:LSN><storage:MSN>
  <name> ::= <byte> = filename
  <size> ::= <byte>=quanta size
  <count> ::= <byte> = quanta count
  <correction> ::= <nibble:E><nibble:c> = erasure correction, E = k and c = n-k
  <section> ::= <FLASH_RO> | <FLASH_RW> = flash section type
    <FLASH_RW> ::= 0 = Read/write section
    <FLASH_RO> ::= 1 = Read only section
  <storage> ::= 0 ... 15 = memory id to store fragment
---

The parameter set groups allow up to eight group addresses to be set for a device 100 identified by its 10, ie its serial number.

---
<set groups> ::= <group1:group> ... <group8:group>
<group> ::= <LSB:octet><MSB:octet>
---

The parameter set time sets time using a previous time reference to reduce error.

---
<set time> ::= <time reference><time correction><Local time offset>
<time reference> := <time>, previous timestamp in payload
<time correction> ::= <octet> = 0 ... 240 (seconds = 4 minutes)
---

The Format of User Data

---
<user data> ::= {<offset><length><data>}
  <offset> ::= 16 bit unsigned
  <length> ::= 16 bit unsigned
  <data><length> octets.
---

For user alarms to be set:

```
<user alarm> ::= {<set ualarm> | <cancel ualarm>}
  <set ualarm> ::= 'S' <ualarm number><ualarm record>
  <cancel ualarm> ::= 'C' <ualarm number>
  <ualarm number> ::= <octet> = 0 . . . 3 (device may use less than this)
```

A <ualarm record> is large enough for 4<time>s however only 2 are defined:

And the rest may or may not be used for <time>s in the future, they may be just data.

```
<ualarm record> ::= <ualarm time><ualarm useby><ualarm 0><ualarm 0>
<ualarm time> ::= <time> (the alarm is to go off)
<ualarm useby> ::= <time> (the time the alarm is not to be
  attempted after)
<ualarm 0> ::= a zero of number of octets in <time>.
```

The time format, which defines days, minutes, seconds since 01-Jan.-2000, GMT is:

```
<time> ::= <octet_LSB><octet><octet><octet_MSB> =
  <dddddddddddddddmmmmmmmmmmmssssss>
``` days most significant 15 bits, minutes next 11 bits, seconds least significant 6 bits

```
<Time stamp> ::= <time>
<Local time offset> ::= <octet>
``` specifies signed difference in half-hour increments between local and UTC time.

E.g. 20=+10 hours

To supply an authentication keyword:
<authentication>::=<octet_LSB><octet><octet><octet_MSB>

Command Processor

The command processor task 222 and associated module 322 implements a command line interface for a computer attached via the asynchronous serial interface 115.

For example a "LS" command would produce, as shown in the example Listing 1 below, first a header output and then a listing of the files of the device 100 written out one file per line. The fields in the lines correspond to the fields in the header, and what each field means is described in Table 2 below:

TABLE 2

| Field | Description |
|---|---|
| Na | Directory name, the name in the directory written out as a <byte2> since the file may be incomplete and so that is not printable. |
| N | Name of the file written as a <graphicchar>. If the name is not a graphic char then the "~" is written instead so that the columns stay correctly spaced. Not "~" is 0xxx so it may actually be the name of the file. |
| DN | Directory number of the file written out in <byte8>. |
| TY | File type written out in <byte8>. |
| Length | This is the length of the file in bytes and the value is written out in <byte8>. |
| CRC32 | This is the CRC32 (32 bit CRC) of the file and its value is written out as <byte8>. |
| R Date | This is the Release Date of the file written out in <time>. |
| C Date | This is the Create Date of the file written out in <time>. |
| DQ | The number of Data Quanta for the file in <byte4>. |
| EQ | The number of Erasure Quanta for the file in <byte4>. |
| QS | The Quanta Size for the file in <byte2>. |
| QC | The Quanta Count for the file in <byte2>. |
| EC | The Erasure Correction byte for the file in <byte2>. |
| A | The Access for the file written as a <char>. A "W" means it is read and writeable on the media and "R" means that it is read only on the media. |
| FG | The flag byte which flags various information about the file. The value is written out as <byte2> and the value is the sum of various flags. Their values are:<br>Deleted: 0x01<br>Incomplete: 0x02<br>Complete: 0x04<br>Released: 0x08<br>Locked: 0x10<br>Open: 0x20 |

An example file listing is shown below in Listing 1:

Listing 1

| Na | N | DN | TY | Length | CRC32 | R_Date | C_Date | DQ | EQ | QS | QC | EC | A | FG |
|---|---|---|---|---|---|---|---|---|---|---|---|---|---|---|
| >ls | | | | | | | | | | | | | | |
| 51 | Q | 00 | 00 | 000004E6 | 12B0DD16 | 0F922003 | 0F926EC0 | 000A | 0000 | 80 | 01 | 10 | W | 38 |
| 4D | M | 01 | 00 | 00002A4C | D2E930D3 | 0F921FDC | 0F926E95 | 0055 | 0000 | 80 | 01 | 10 | W | 38 |
| 00 | ~ | 02 | 00 | 000004F6 | FD16F9E8 | 0F92689E | 0F926E91 | 000A | 0000 | 80 | 01 | 10 | W | 08 |
| 31 | 1 | 03 | 00 | 00006950 | 76BED359 | 0F92689E | 0F926E28 | 00D3 | 0000 | 80 | 01 | 10 | W | 38 |
| 32 | 2 | 04 | 00 | 00006D08 | CD49541C | 0F92689E | 0F926DC0 | 00DB | 0000 | 80 | 01 | 10 | W | 08 |
| 33 | 3 | 05 | 00 | 0000736A | 23BCF15C | 0F92689E | 0F926D4E | 00E7 | 0000 | 80 | 01 | 10 | W | 08 |
| 3A | : | 06 | 00 | 00000B4B | 44658709 | 0F92689E | 0F926D43 | 0017 | 0000 | 80 | 01 | 10 | W | 38 |
| 40 | @ | 07 | 00 | 0000001E | 7AO9C6EA | 0F92689E | 0F928D43 | 0001 | 0000 | 80 | 01 | 10 | W | 18 |
| 41 | A | 08 | 00 | 00002A0C | 58EC9718 | 0F92689E | 0F926D18 | 0055 | 0000 | 80 | 01 | 10 | W | 08 |
| 5F | _ | 09 | 00 | 00000001 | D202EF8D | 0F92689E | 0F926D17 | 0001 | 0000 | 80 | 01 | 10 | W | 18 |
| 4B | K | 0A | 00 | 0000EA60 | 944B18FD | 0F9261E0 | 0F9468AE | 01D5 | 0000 | 80 | 01 | 10 | W | 02 |
| >>ls Q | | | | | | | | | | | | | | |
| 51 | Q | 00 | 00 | 000004E6 | 12B0DD16 | 0F922003 | 0F926EC0 | 000A | 0000 | 80 | 01 | 10 | W | 38 |

2. Transmission System Infrastructure

2.1 File Transmission

The files to be transmitted to the device 100 are each first broken up into a size that can be encapsulated by the air protocol and sent using a server transmission system, described below and shown in FIG. 23. The file fragments produced in accordance with the air protocol can also be transmitted to the device 100 using a remote relay unit (RRU) 1900, as described below and shown in FIG. 22.

Figure 10:
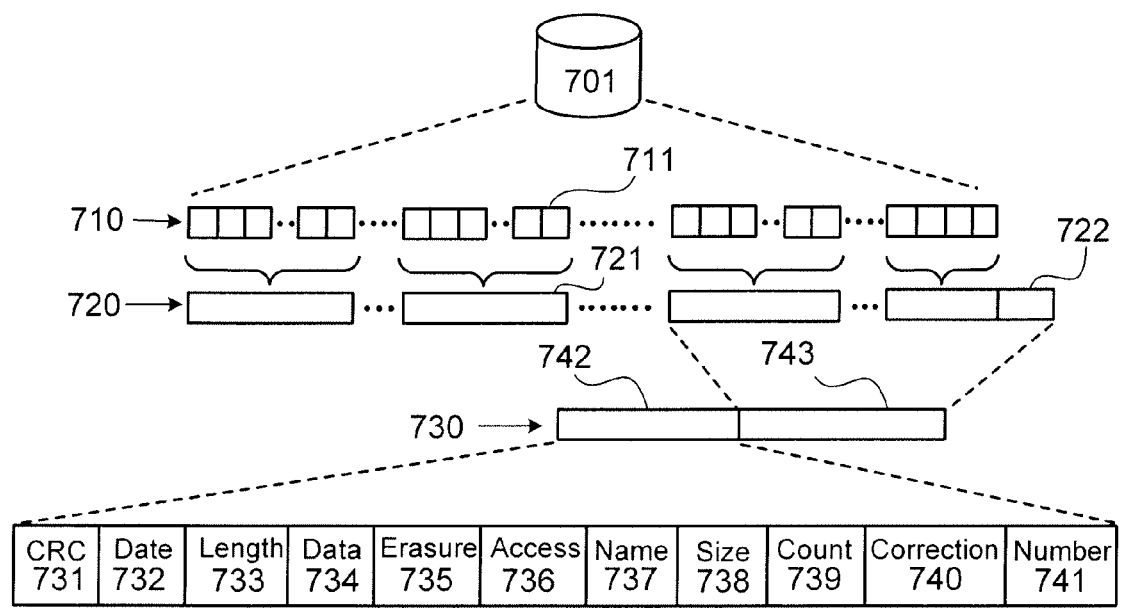
FIG. 10 is a block diagram of a file transmission system of the client processor device.

The file to be transmitted 701, as shown in FIG. 10, is treated as an arbitrary sequence of bytes, 710, up to the limit supported by the flash file system described above. Each byte, 711 is an 8-bit binary value. Consecutive sequences of bytes 721 are assembled into equal length groups of quanta 720. The last quanta 722 to be transmitted is padded with zeros, as required, to ensure that the last quanta 722 has the same size as the other quanta (e.g. 720) being transmitted. Quanta are all equal length for a particular file and are numbered consecutively starting at zero.

A file fragment 730 suitable for transmission consists of a header 742 followed by data 743. The data is a sequence of quanta 720. The data in the last fragment is padded with zeros as required.

The header 742 contains information related to the data 743 in a file fragment 730, and consists of a number of parameters (described as follows) transmitted in little endian order for compatibility with the representation used by the firmware compiler 2002. Each header 742 starts with a 32-bit cyclic redundancy check 731 calculated for the data 743 contained in the file fragment 730. This is followed by a 32-bit date/time stamp 732 for the file 701 in the format described in the air protocol section above, and a 32-bit length 733 representing the total length of the file 701 (e.g. in bytes), both of which may be derived from the file's 701 directory information. This is followed with a 16-bit count of the total number of data quanta 734 required to send the whole file 701 (i.e the core data quanta, or the data corresponding to the actual data in the file 701), and the total number of erasure correction quanta 735 generated for the file 701, as described below. A 16-bit quanta number 736 identifies the number assigned to the data quanta that first appears in the current file fragment 730 being transmitted. If the quanta number 736 in the current file fragment 730 is greater than the number of data quanta required to send the whole file 701 (i.e. as represented by 734), then the data 743 in the fragment 730 is erasure correction data. An 8-bit access field 736 determines if the file 701 is to be placed into read/write 420 or write-protected 410 section of the file flash system 400, based on the value represented by the access field 737 (e.g. as "0" for read/write access and "1" for write-protected access). Files (e.g. 701) are given a single 8-bit name 737 (e.g. an 8-bit binary number) of which typically the last 255 values represented by the 8-bits are available for use. The number of bytes per quanta size and the number of quanta per fragment are represented by 8-bit values 738 and 739, respectively. The correction information 741 represents an 8-bit value and identifies the level of erasure correction used, the nibbles at the upper and/or lower nibble locations, representing as k and n-k respectively (where k is an integer with a predetermined value and n is the total number of fragments in the group). For a particular file all parameters in the header are held constant with exception of the quanta number 736 which corresponds to the file location of the data being transmitted.

File fragments may be transmitted in any order and there is a benefit to be gained by interleaving fragments to improve system performance if a number of consecutive fragments are lost by the transmission system. The system also allows a file fragment to be transmitted repetitively to increase the probability the complete file is received.

If desired, erasure correction fragments (ECFs) can be additionally generated from the fragments derived from the file data. ECFs allows lost file fragments to be recovered more efficiently than relying on multiple transmissions of the sample fragment. This redundancy greatly improves reception performance under adverse signal conditions. The level of redundancy is set on a file by file basis depending on the reliability desired based on transmission loss, number of fragments, etc.

Figure 11:
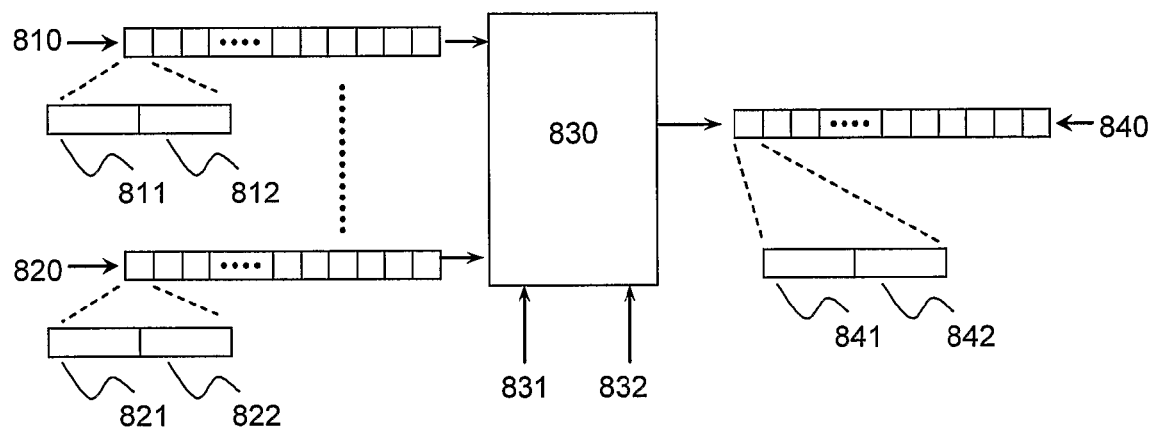
FIG. 11 is a block diagram of an erasure correction fragment generation process of the client processor device.

FIG. 11 is a schematic diagram showing how erasure correction fragments are generated. A set of k consecutive fragments (e.g. 810, 820), are used to generate one or more (ie n-k) erasure correction fragments 840 using an ECF process performed by an ECF module 830. In addition to the data in the sets of fragments 810, 820 received by the module 830, the module 830 accepts further input for determining the number of k groups of fragments 831 in each set and the desired number of erasure correction fragments 832 to be generated based on the groups of fragments in each set. The size of the erasure correction fragment 840 is the same size as the original fragments as received by the ECF module 830.

The ECF module 830 generates the desired erasure correction fragment using finite field arithmetic on a nibble-by-nibble basis. For example, lower nibbles from the same locations from each of the original fragments in each set (e.g. nibbles 811 to 821) are each used to generate a single corresponding erasure correction nibble (e.g. 841). Similarly, the upper nibbles at locations (e.g. 812 to 822) are used to generate a corresponding upper erasure correction nibble (e.g, 842). A field size of 16 is therefore sufficient and means an efficient implementation of the finite field arithmetic using 8-bit arithmetic natively supported by the processor 150.

Figure 12:
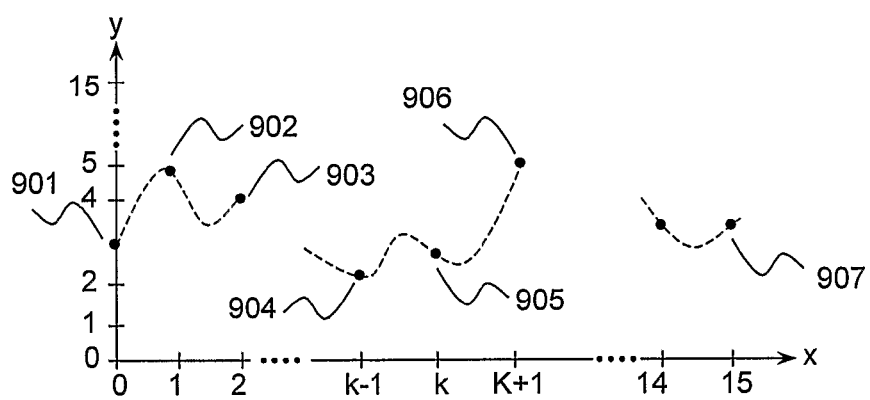
FIG. 12 is a block diagram of a Lagrange polynomial interpolation process of the client processor device.

The ECF process may use a Lagrange polynomial function to generate erasure correction data. For example, each integer value of x (along the x-axis, as shown in FIG. 12) corresponds to a nibble in their order of appearance in each set (e.g. 811 to 821). The value on the y-axis of FIG. 12 at each x-location corresponds to a numeric value represented by each nibble respectively. The polynomial coefficients of the Lagrange function are determined such that the function uses the data values of the nibbles at their equivalent x-locations 901, 902, 903, 904, as depicted in FIG. 12 (i.e. the coefficients define an approximated function that passes through the y-axis value corresponding to each x-location 901, 902, 903, 904, etc.). The erasure correction data may also be generated by evaluating the polynomial at other points 905, 906, 907 as required. The finite field arithmetic limits the sum of the number of erasure correction fragments and original fragments to less or equal to 16.

In the client processor device 100, the Lagrange polynomial interpolation may be used in a similar fashion to retrieve any missing fragments provided that at least a unique k (as defined by the correction information 741) of the original number of n transmitted file fragments 730 have been received.

2.2 Web Server System

A user is able to control one or more client devices 100, and these can be allocated to an identified group using a group Id, as discussed above for the air protocol.

A web server system 1005, as discussed below, is provided for users to access and enable them to:

(i) Create a group;

(ii) Change a group's details;

(iii) Change devices in a group;

(iv) Remove a group;

(v) Configure a group of devices 100;

(vi) Display data received from one or more devices 100.

2.3 Transmission System

Figure 23:
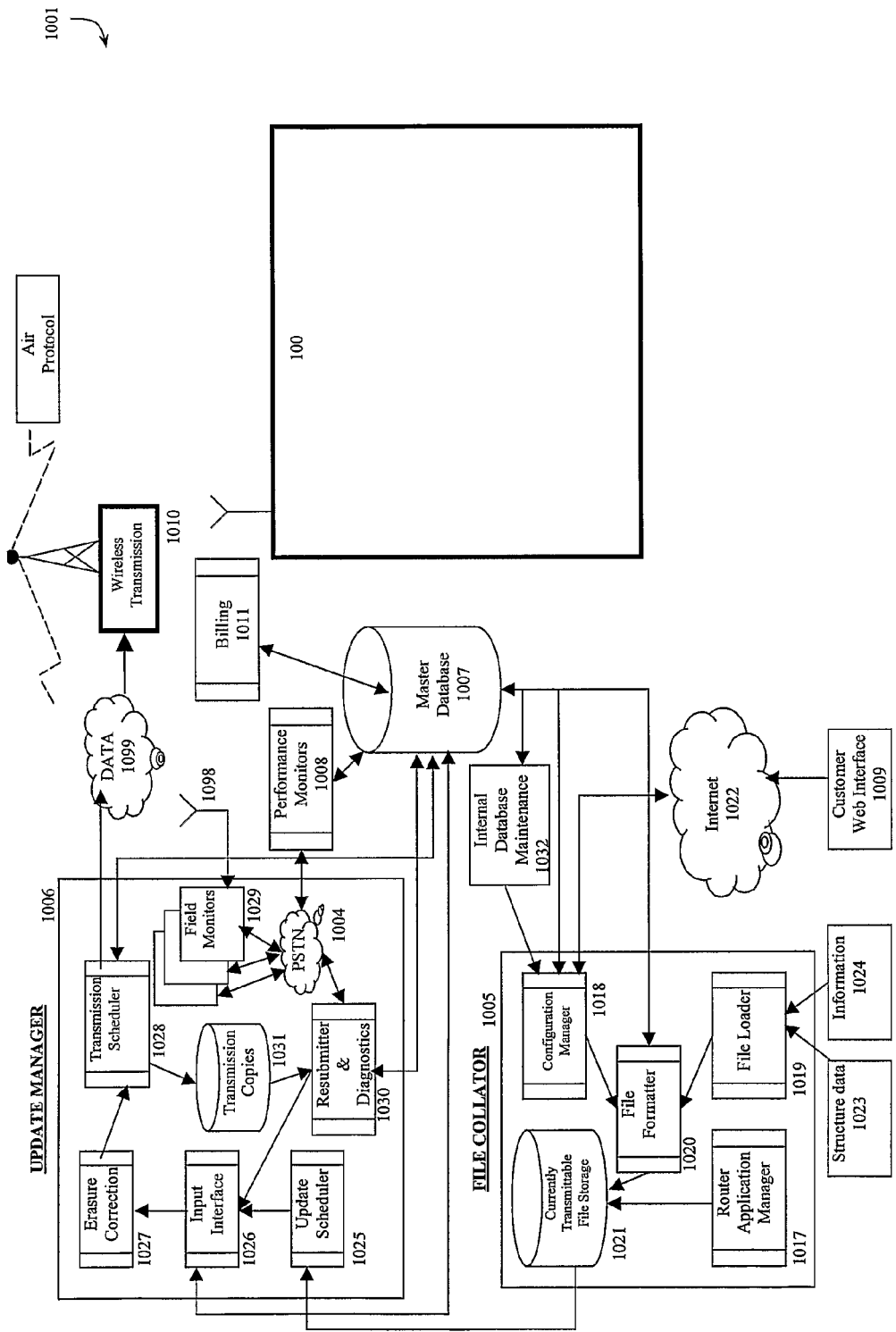
FIG. 23 is a block diagram of a server transmission system for communicating with the client processor device.

The infrastructure includes a server transmission system, as shown in FIG. 23, having a file collator 1005, an update manager 1006, a master database 1007, performance monitor 1008 and a wireless transmission apparatus 1010. The server transmission system also provides a customer web interface 1009 via a web server provided by the file collator 1005.

The file collator 1005 (or central transmission server) loads and maintains information that controls the operation of the device 100, and to create and store instruction and data files used by that device. The data is stored in a relational database 1007, and data file suitable for transmission to the device are created by a file formatter 1020 and kept on disk in a currently transmittable file storage database 1021 from where they can be retrieved by an update scheduler 1025 as required. Instruction files used by the device 100 are also stored in the currently transmittable file storage database 1021. The file collator 1005 includes a router application manager 1017, a configuration manager 1018, a file loader 1019 and a file formatter 1020, in addition to the currently transmittable files storage database 1021.

The master database 1007 interfaces with a billing module 1011, which enables the data files for transmission to the devices to be updated with a range of billing data. For example, the master database 1007 may retrieve call tariff rates for different carriers, carrier rate structure (e.g. peak and off peak rates), carrier billing data and customer billing data via the billing module 1011 for storage in the master database 1007.

The router application manager 1017 generates files for transmission to the device 100. Modifications to the manner in which a task is performed by the device 100 are achieved by sending a new version of the relevant file to the device 100. The file is written directly to the current transmittable file storage database 1021 from the file formatter 1020. From this database 1021, the update scheduler 1025 forming part of the update manager 1006, retrieves the file for transmission at an appropriate time.

The configuration manager 1018 enables manual changes to be made to the information maintained in the master database 1007. The configuration manager 1018 includes a number of screen layouts that can be used to review and change a different section of the database 1007. Each user of the system is issued a user name and password that determines which screen the user can access. Screens that are used to maintain a particular client's information are accessible only to that client, using the Internet 1022, and a suitable web browser constituting the customer web interface 1009, and authorised company personnel. The configuration manager 1018 also interfaces with the internal database maintenance module 1032, which maintains the consistency of the data in the master database 1007 and may provide the configuration manager 1018 with an updated view of the database 1007.

The configuration manager 1018 includes two sub modules (not shown in FIG. 23), namely a transmission manager and a client web interface. The transmission manager enables user control of the schedule for transmission of files maintained in the currently transmittable file storage database 1021 to the device 100. Files can be transmitted regularly either at a set interval or at a specific day and/or time, or a file can be transmitted on a one off basis. Files can be assigned a priority when transmitted. The client web interface enables users to maintain personal information and device configuration information, as discussed previously.

The file loader 1019 provides a consistent process by which data contained in externally sourced files is loaded into the master database 1007 (via file formatter 1020), and is tested and released to production in a controlled manner. Given the differing nature of the various files that need to be loaded, the file loader 1019 is modular in nature so that each type of file can be handled individually when necessary, whilst assuring the same overall process is followed. Externally sourced files, such as structure data files 1023, and external entity information files 1024, are shown in FIG. 23, and may be provided by an infrastructure provider or service provider. The information files may include costing information and other data.

The file loader 1019 ensures that the following steps are undertaken during the loading of a file:

(1) Parsing. Errors in file formats are detected and handled.

(2) Preliminary load. The data is first loaded into a "staging" area within the database so that it can be verified.

(3) Redundancy checks. New data is compared against data maintained in the master database 1007, if there is no difference, the new data is discarded. If differences are found however, the nature of the differences are gauged so that appropriate levels of testing can be performed.

(4) Testing. The new data is tested in an appropriate fashion.

(5) Approval. Authorised personnel check the results of the previous stages and approve, or not, the new data as suitable for production.

(6) Release. The new data is released to production and the file formatter 1020 is instructed to regenerate the affected files in the current transmittable file storage database 1021. This typically involves scheduling one or more files for transmission to devices 100, depending upon the importance of the new data.

The file formatter 1020 provides a consistent framework for the generation of files that are required for operation of the device 100. Similar to the file loader 1019, the file formatter 1020 provides a consistent structure for the files whilst still allowing for the individual requirements of each type of file. The file formatter 1020 places the generated files in the current transmittable file storage database 1021 where the files are accessible by the process responsible for initiating the transmission of the files (e.g. the update scheduler 1025). The current transmittable file storage database 1021 forms part of the directory hierarchy on a main server's disk which is accessible to all processes involved in the generation and transmission of files, namely the router application manager 1017, the file formatter 1020, and the customer web interface 1009.

The update manager 1006 selects the appropriate transmissions medium, controls the packaging of data and schedule delivery of the data (via the selected transmission medium) to the wireless transmission apparatus 1010 and/or the Remote Relay Unit (RRU) 1900, for subsequent delivery to the device 100. The update manager includes an update scheduler 1025, an input interface 1026, and an erasure correction routine 1027, a transmission scheduler 1028, in-field monitors 1029, and a re-submitter and diagnostics system 1030, in addition to a transmission copies database 1031. The update scheduler 1025 is a software process that runs continuously reading the master database 1007 to retrieve the schedule for file transmission and sending requests to the input interface 1026 as required. The input interface 1026 is an executable program that extracts prioritised and formatted data from the current transmittable file storage database 1021. This data is passed directly through to the erasure correction routing 1027. As data is passed through this routine, it is prefixed with the appropriate device header information.

The erasure correction routine 1027 transforms the input data into a number of redundant blocks (or error correction fragments) that improve the reliability of reconstruction of the original data, provided a given number of the redundant blocks are received unchanged by the device 100. The redundant blocks may be generated using the process described above in relation to FIGS. 11 and 12. The redundant blocks are packaged and sent to the transmission scheduler 1028 individually. The transmission scheduler 1028 selects the appropriate medium for transmission (e.g. a wireless network used by the wireless transmission apparatus 1010). The transmission scheduler 1028 receives and stores packets passed from the erasure correction routine 1027, and periodically forwards the highest priority data packets to, for example, the wireless transmission apparatus 1010 for transmission via the selected transmission medium (e.g. a wireless network). A copy of the packets sent to the wireless transmission apparatus 1010 is written into the transmission copies database 1031 and removed from storage. The in-field monitors 1029 are modified versions of the client device 100, with modems attached to a dedicated link to, for example, the PSTN network. These monitors receive all data transmissions to the devices 100 in their locality. This data is forwarded to the resubmitted and diagnostics system 1030 via the PSTN network.

The resubmitter and diagnostics system 1030 includes multiple input lines from the PSTN network 1004, and executes a comparison process per input line and a single resubmit process. The comparison process for each input line compares data received by the corresponding in-field monitor 1029 with data written to the transmission copies database by the transmission scheduler 1028. The resubmit process performed by the resubmitter and diagnostics system 1030 periodically reviews the comparison results and resubmits to the input interface 1026 any packets or files as required. The in-field monitors 1029 also transmit information for the purpose of assessing the performance of the selected transmission medium/network (e.g. by transmitting data via antennas 1098). All information of this nature is stored in the master database 1007 for analysis. The information is used on an ongoing basis to ensure that the selected transmission medium/network performs at a required specification.

The file loader 1019 and configuration manager 1018 maintain the information stored in the master database 1007. The file loader 1019 performs routine loading of data contained in files with known formats. The configuration manager 1018 is used for manual entry of data that is not available in files, and for manual adjustment of other data as required via an internal database maintenance module 1032.

The performance monitor 1008 is a group of processors that monitor the operation of the support systems on a day to day basis. The performance monitor 1008 provides a means of visual inspection of resource usage levels, as well as standard reports at periodic intervals. It also issues warnings when the system becomes overloaded in any way. Components that are monitored in this way include:

(1) Files transmission. The number of errors and hence retransmissions are monitored to determine transmission quality in the various areas covered by the network.
(2) Database host. System resources on the database hose machine(s) such as CPU, disk and memory are monitored to ensure performance targets are met.
(3) Database server. Inbuilt capabilities of the database service software are used to ensure that the database is running efficiently.
(4) Web host. System resources on the web-server host machine(s) such as CPU, disk and memory are monitored to ensure performance targets are met.
(5) Web server. The inbuilt capabilities of web server software are used to ensure that the database is running efficiently.

The wireless transmission apparatus 1010 uses the air protocol and enables information to be efficiently distributed from a central location to a large number of devices 100 using, for example, the existing pager communication network.

2.4 The Remote Relay Unit (RRU)

Figure 22:
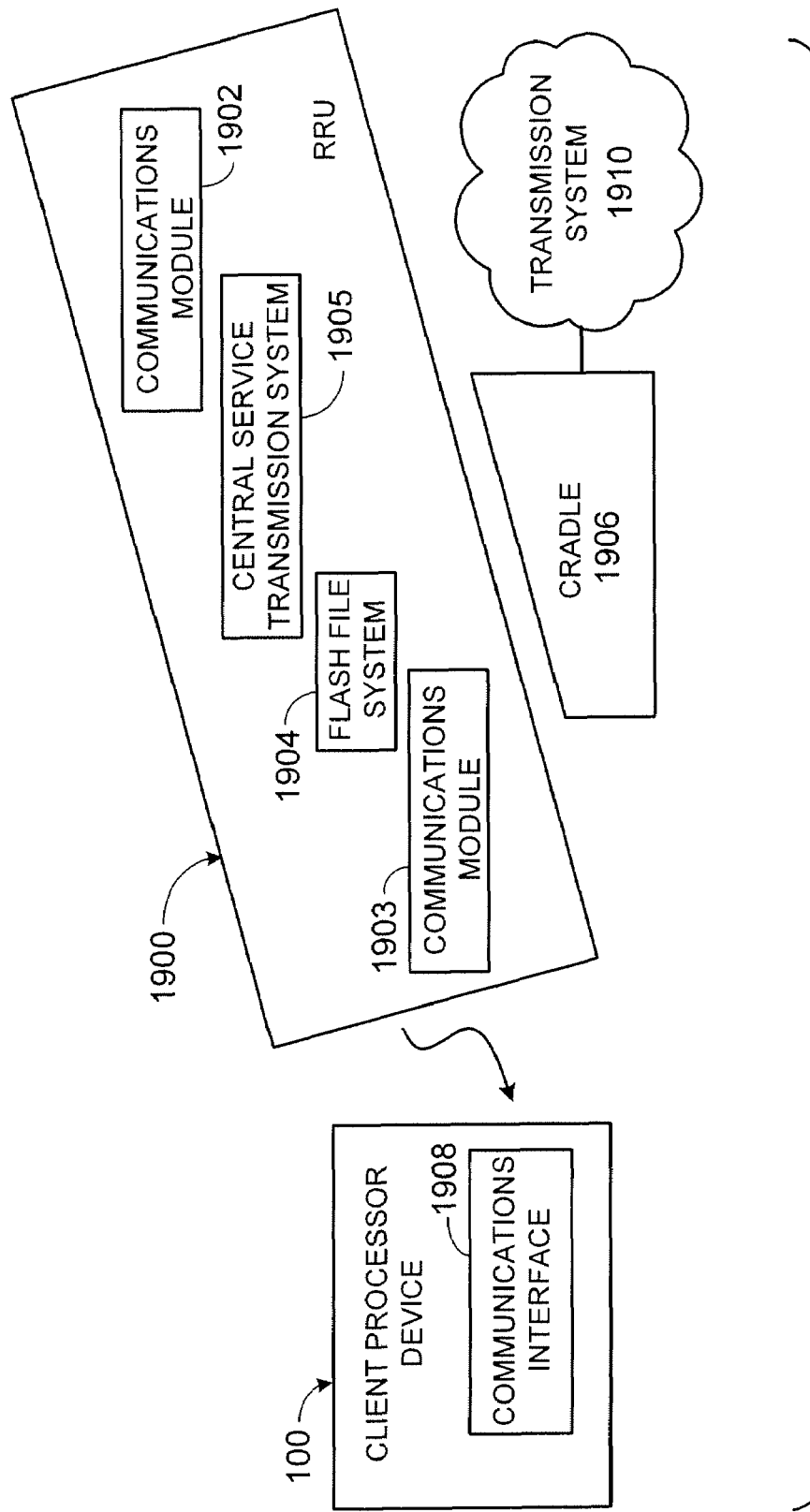
FIG. 22 is a block diagram of a remote relay unit for communicating with the client processor device.

The remote relay unit 1900, as shown in FIG. 22, is a handheld device that can be used by service personnel or a user of the device 100 to transmit file fragments to the device 100. The RRU 1900 is particularly useful in situations where the wireless communications network, eg the pager network, is unable to communicate with the device 100, for example if coverage of the network does not extend to the location of the device 100. The RRU 1900 is able to obtain the file fragments from the update manager 1006 using online connection methods, or by direct connection, to the transmission system 1910 (e.g. via the data network 1099 as shown in FIG. 23). Once the RRU has received the file fragments, the fragments can be sent to the device 100 using a short range wireless communications protocol, such as Bluetooth or ZigBee (http://www.zigbee.org), or an infrared protocol, such as one that complies with the standards of the Infrared Data Association (IrDA) (http://www.irda.org). One RRU 1900 may be used to communicate and configure a number of devices 100. The RRU 1900 may also be used to program and/or control other items in a user's household, such a VCR, DVD, TV, lights etc, either autonomously or by user intervention. The control of these items, together with the devices 100, can be based on data dynamically available and updated from the central transmission system 1910. The data and file fragments can be delivered to the RRU 1900 based on user preferences stored as part of the transmission system, or based on direct instructions from the user, eg by interrogating the transmission system over the Internet.

The RRU 1900 is also configured to enable information to be extracted from local units, such as the household items and the devices 100, so as to obtain diagnostic status, statistic and event log data. A wireless interface, such as an IrDA or ZigBee interface, can be used for retrieval of the information, but again may be under the direct control of the user or performed autonomously when a connection can be established. Information retrieved from the local unit is stored on the RRU 1900 and then made available to be sent to the central transmission system 1910 or for upload to a user's computer device, e.g. personal computer system or PDA. The computer device is able to access the RRU 1900 using an IP connection.

The RRU 1900 includes a communications module 1902 that enables the RRU 1900 to connect to the transmission system using at least one of the following: GPRS; CMDA-1X; Ethernet; WLAN; or IP Dial-up. The connection normally would be always online. If not, the connection is either established by either the central server 1005 or the RRU 1900 on demand. The central server 1005 would typically use the IP based protocols for connection, but a simplex download connection to the RRU 1900 would suffice.

The RRU 1900 includes a flash file system 1904 that allows information to be received locally in addition to being downloaded from the central server transmission system 1005. The file system 1904 is scaled appropriately to cater for the number and size of files required. The size of this file system 1904 may directly relate to the number of local units 100 associated with it.

The RRU 1900 has a second communications module 1903 to allow information to be distributed to its associated local units, ie the devices 100, and support retrieval of information from the local units. The second module 1903 provides the wireless communcations interfaces, such as ZigBee, IrDA, and/or pager (POCSAG) interface.

The RRU 1900 has a microcontroller system 1905 that maintains a real-time clock for synchronising the time in the associated local units when required. The clock is set using a network time protocol from the server transmission system 1005. The system 1905 includes a user display that can be used to show status information and to facilitate the user interface. The system 1905 also has buttons and/or a keypad to provide user interaction/control.

A RRU 1900 can be associated with a number of user local units that include third-party consumer devices (e.g. VCRs, TVs) in addition to the client processor devices 100. The user registers the make and model number of each of the consumer devices on the central server transmission system 1005 via the web interface 1009. Depending on support for the third party devices, configuration information is generated on the central server 1005 and sent to the RRU 1900 to allow the devices to be controlled. The serial number of each of the client processor devices 100 is similarly registered on the web interface 1009. The central server 1005 controls the number and type of associated devices 100 depending on the resources (power, memory and communications bandwidth) associated with the remote relay unit 1900. A particular device 100 is normally associated with a single remote relay unit 1900.

In order that a relay unit 1900 can communicate with a particular device 100 it may, depending on the transmission method, need to be in the vicinity or close line-of-sight of the device. This means the RRU 1900 is normally a portable device similar to a mobile phone. It is returned to a cradle 1906 to recharge and/or make a wired connection to server transmission system 1005, if required.

In order that the client processor devices 100 can communicate with the relay unit 1900, they are provided with the I/O module 130. This provides a corresponding communications interface 1908, such as ZigBee or IrDA. These interfaces support relatively high-speed bidirectional communication and this ensures that the data is transferred in a reliable and timely manner. The device 100 monitors the alternate interface 1908 and communications over this interface 1908 would normally override that received on the pager receiver 110.

After the RRU 1900 and associated local units are registered, the file system 1904 is then able to accept updates from the central server 1005. The user may chose to make changes (i.e. configuration or otherwise) using the web interface 1009 or new data may be available from the server 1005 depending on the service(s) the user is subscribed to. Subscription data indicating the services subscribed by a user may be maintained, for example, on the central server 1005. If new data is available the central transmission server 1005 checks the online status of user's the RRU 1900 and indicates this status to the user during the time the user is using the web interface. Once the changes are sufficiently completed the server 1005 attempts to download the data to the remote unit 1900. Once the data is fully downloaded, the RRU 1900 indicates this as fresh data available (e.g. as a flashing light or textual display) and then proceeds to automatically transfer the data to the associated local units. If the RRU 1900 cannot be contacted from the server 1005, the user needs to take action such as manually starting the connection by returning the RRU 1900 to the cradle 1906. If the RRU 1900 has data for an associated client processor device 100 but cannot connect to it, the user is instructed to take appropriate action (i.e. to bring the remote relay unit 1900 to the client processor device 100). The client processor device 100 may similarly indicate that it has received fresh data (e.g. by flashing a light).

3. Travel Alert Device

Figure 24:
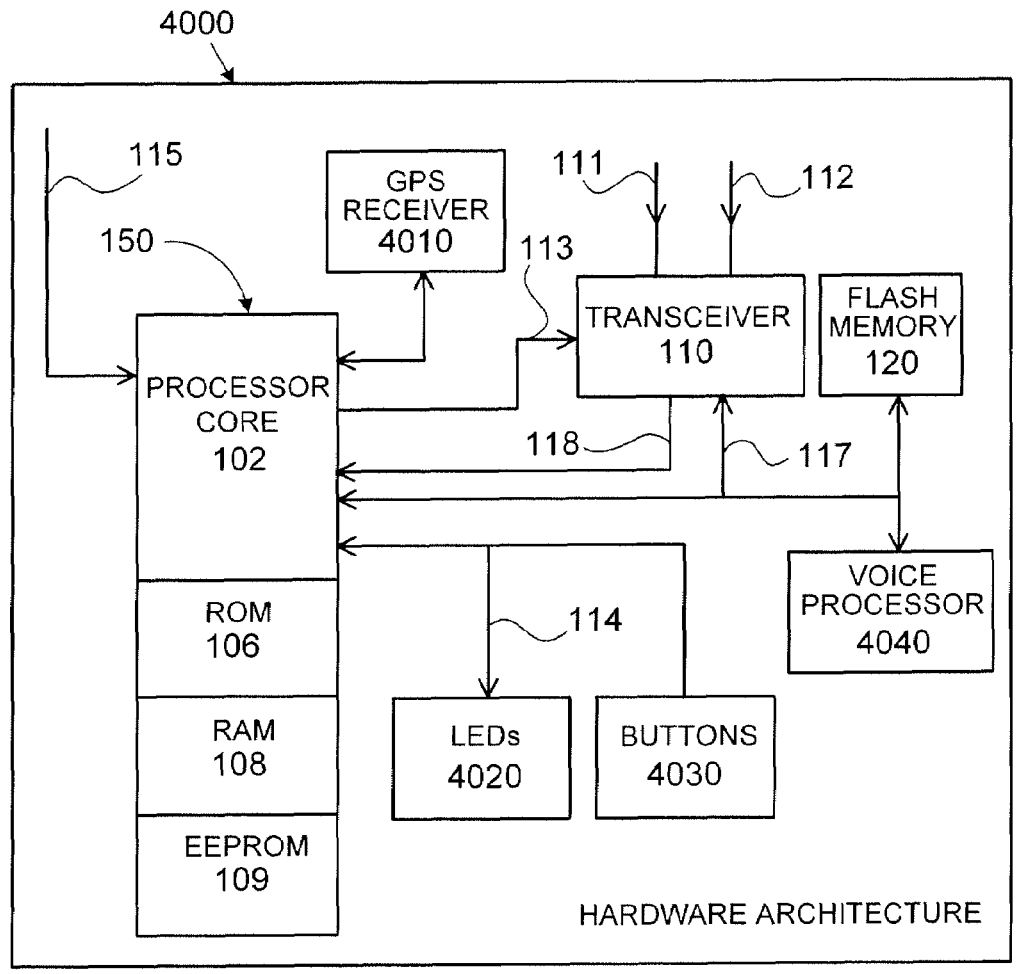
FIG. 24 is a block diagram of a client processor device configured as a travel alert device.
Figure 25:
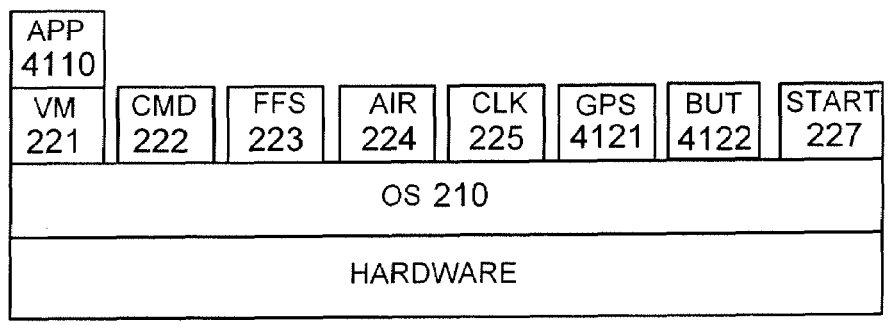
FIG. 25 is a block diagram of the logic architecture of the device for the travel alert device.

The client processor device 100 can be mounted in vehicles and application and data files stored therein to run a travel alert application 4110, as part of a travel alert system 1001, as shown in FIG. 23. The client processor device 100 then has a hardware architecture 4000, as shown in FIG. 24, and a logical architecture 4120, as shown in FIG. 25. When the device 100 runs the travel alert application 4110, the device 4000 is able to receive and process text messages sent to the device 4000. The text messages may originally have been sent from a communications terminal using the Short Message Service (SMS) of a GSM network. A Mobile Subscriber ISDN (MISDN) number (i.e. an international telephone number) is allocated to each device 4000, so that SMS messages sent to a destination identified by the MISDN number are routed by an SMS server to an SMS translation server of the travel alert system 1001. The SMS translation server also provides a server transmission system of the travel alert system. The translation server matches the destination MISDN number to the address of a client processing device 4000 and converts the SMS message into packets to send to the device 4000 using the air protocol.

The hardware architecture of the client processor device 4000 when configured for running the travel alert application is the same as that described previously with reference to FIG. 1, with the addition of specific I/O components, being Light Emitting Diodes (LEDs) 4020 and buttons 4030 (both of which are connected to the data and address bus 114), a voice processor 4040 connected to the bus 117 to make voice announcements, and a Global Positioning System (GPS) receiver 4010. Specific tasks are also included, such as the GPS task 4121, the button task 4122 and a voice task (not shown), for use with the application files 4110.

The travel alert application 4110 can perform varying processes based on an activation level which is stored in EEPROM. The activation level may be set to an initial value when the client processor device 4000 is initially loaded and the activation level may later be set to differing levels as required by data transmitted to the device 4000 using the air protocol. When a new activation level is transmitted to the device 4000, a contract length is also defined which determines for how long the travel alert application 4110 will operate at the new level. After the contract length period has elapsed since the activation level was initially received by the device 4000, the activation level will revert to the initial level until new activation level data is received. If the device 4000 has never received new activation data since the device's initial loading and a certain period has elapsed, the travel alert application 4110 will cease to provide any alert information until new activation data is received.

Figure 26:
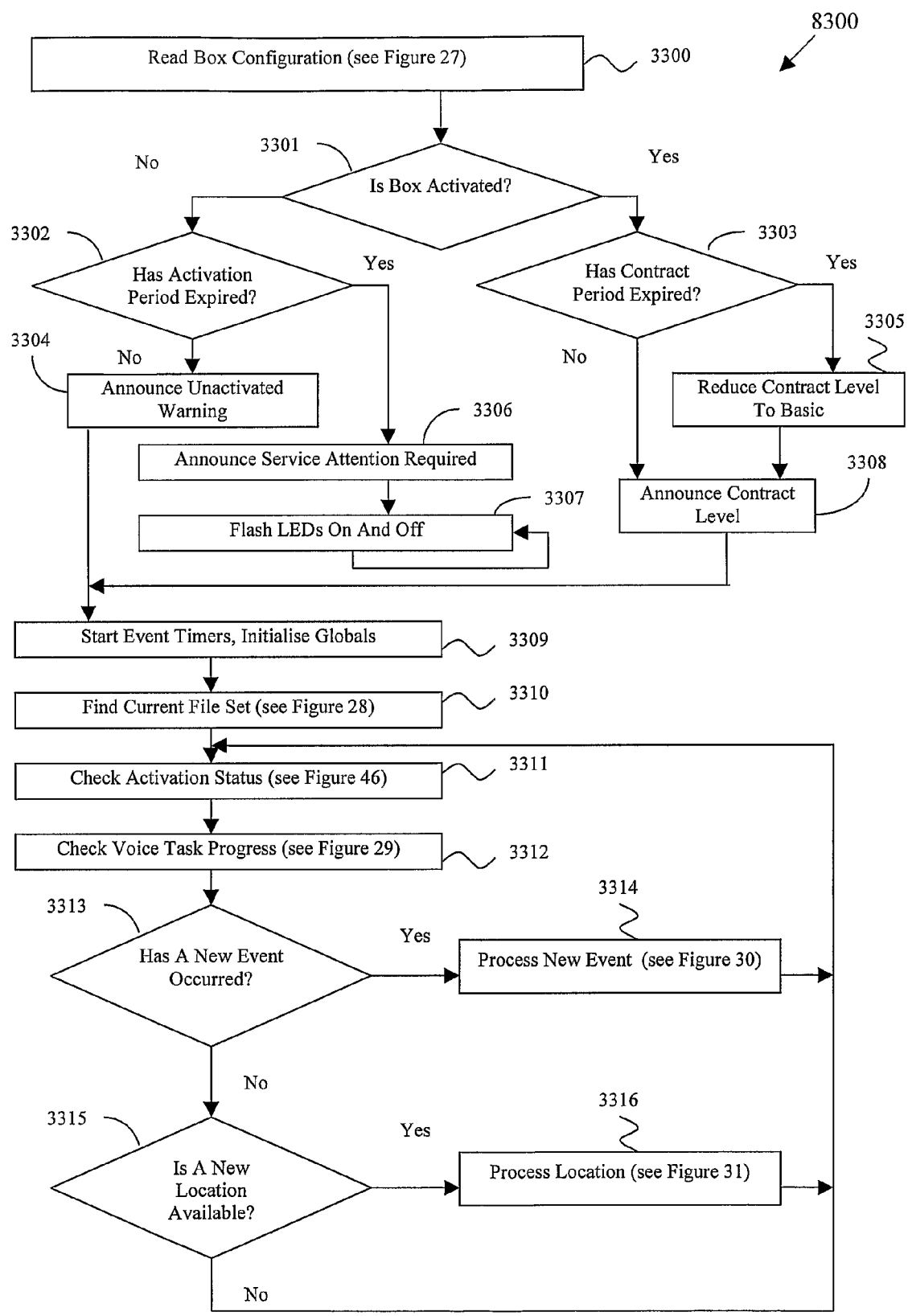
FIG. 26 is a flow diagram of a top level process for the travel alert device.
Figure 27:
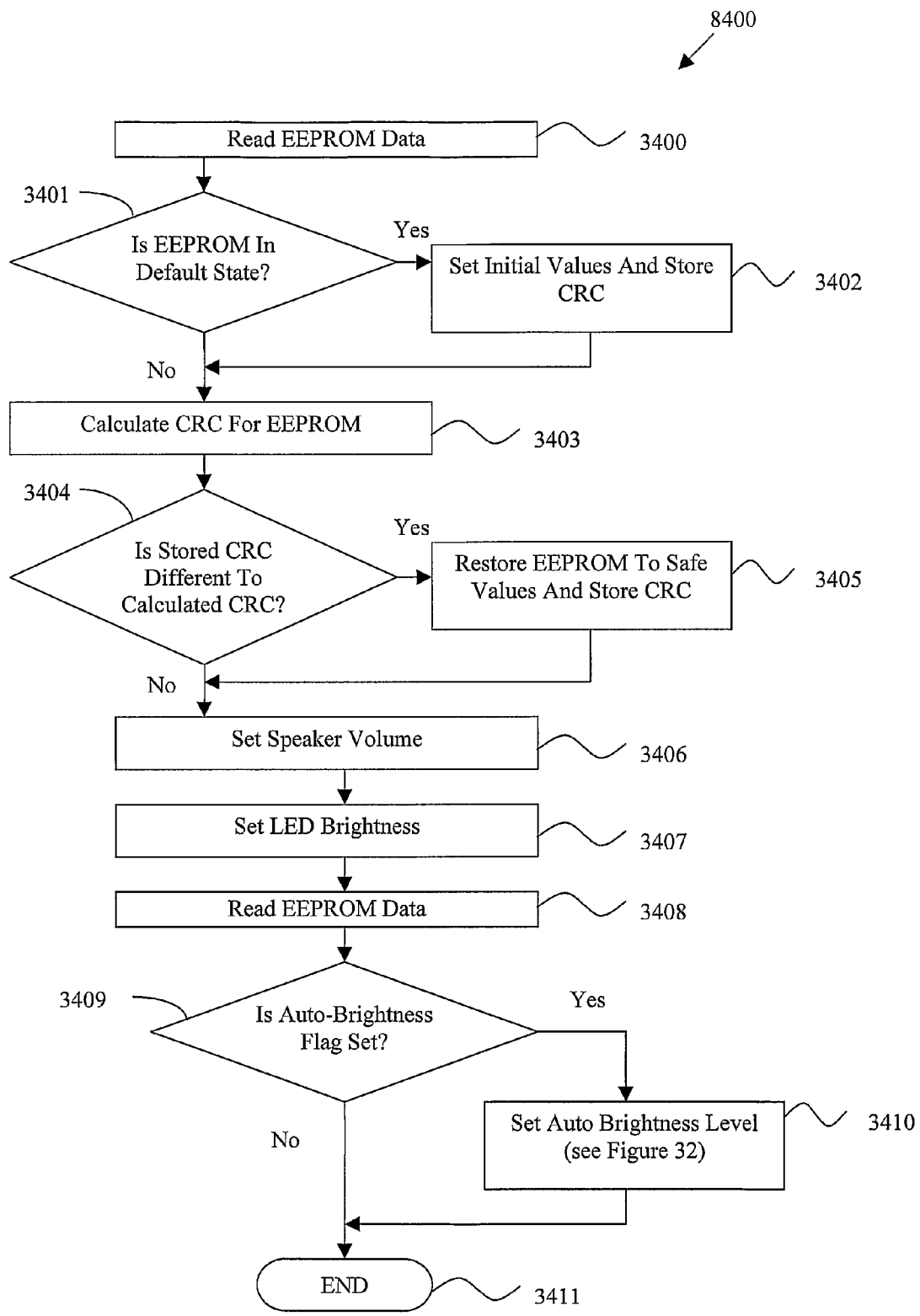
FIG. 27 is a flow diagram of a read box configuration process for the travel alert device.

The client processor device 4000 performs the processes described below, with reference to FIGS. 26 to 39 and 46, when executing the travel alert application 4110. The travel alert application 4110 initially executes process 8300, as shown in FIG. 26. Process 8300 begins at step 3300 by executing process 8400 (as shown in FIG. 27) to read configuration parameters from EEPROM and perform corresponding actions.

The comparison at step 3301 determines whether the device 4000 has current activation level data. If current activation data exists, step 3301 proceeds to step 3303, otherwise step 3301 proceeds to step 3302. The comparison at step 3303 determines whether time equivalent to the contract length for this activation level has elapsed since the activation level was received by the device 4000. If so, step 3303 proceeds to step 3305, where the activation level is changed to the basic level, and step 3305 proceeds to step 3308. If the contract length has not elapsed, step 3303 proceeds to step 3308. At step 3308, the voice task run by the device 4000 for announcing the activation level is executed, and step 3308 proceeds to step 3309. Step 3302 determines whether a certain period (e.g. 13 months) has elapsed since the device 4000 was initially loaded, and if so proceeds to step 3306. Otherwise, step 3302 proceeds to step 3304, where the voice task run by the device 4000 for announcing a warning that the device is unactivated is executed, and step 3304 proceeds to step 3309. At step 3306 the voice task run by the device 4000 for announcing that service attention is required is executed, and step 3306 proceeds to step 3307. At step 3307, the LEDs 4020 are toggled, e.g. switched on if off and vice-versa, and then a small (e.g. less than 5 seconds) delay is performed, and step 3307 then proceeds to step 3307.

Step 3307 will continue to be performed until the device 4000 is reset. At step 3309, the timers which initiate timed actions are started, and global variables are initialised. The global variables initialised at step 3309 define, for example, the timing of certain actions including checking whether new files have arrived (e.g. every 2 minutes), checking whether new messages have arrived (e.g. every minute), and setting the restart flag (e.g. every 3 hours). Step 3309 then proceeds to step 3310.

Figure 28:
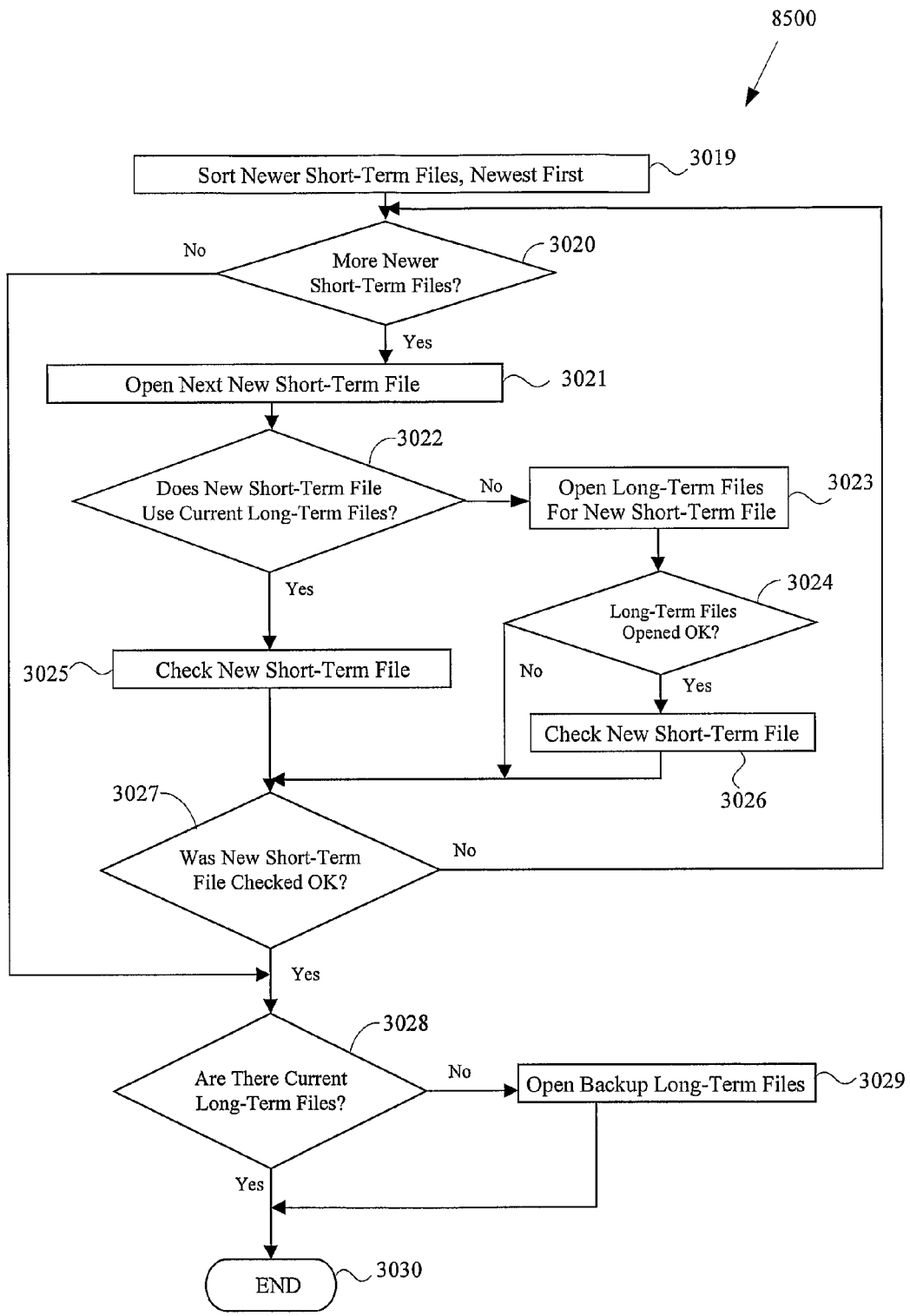
FIG. 28 is a flow diagram of a find current file set process for the travel alert device.

At step 3310, the most up-to-date set of data files is determined and opened using process 8500 (as shown in FIG. 28). Step 3310 then proceeds to step 3311.

Figure 46:
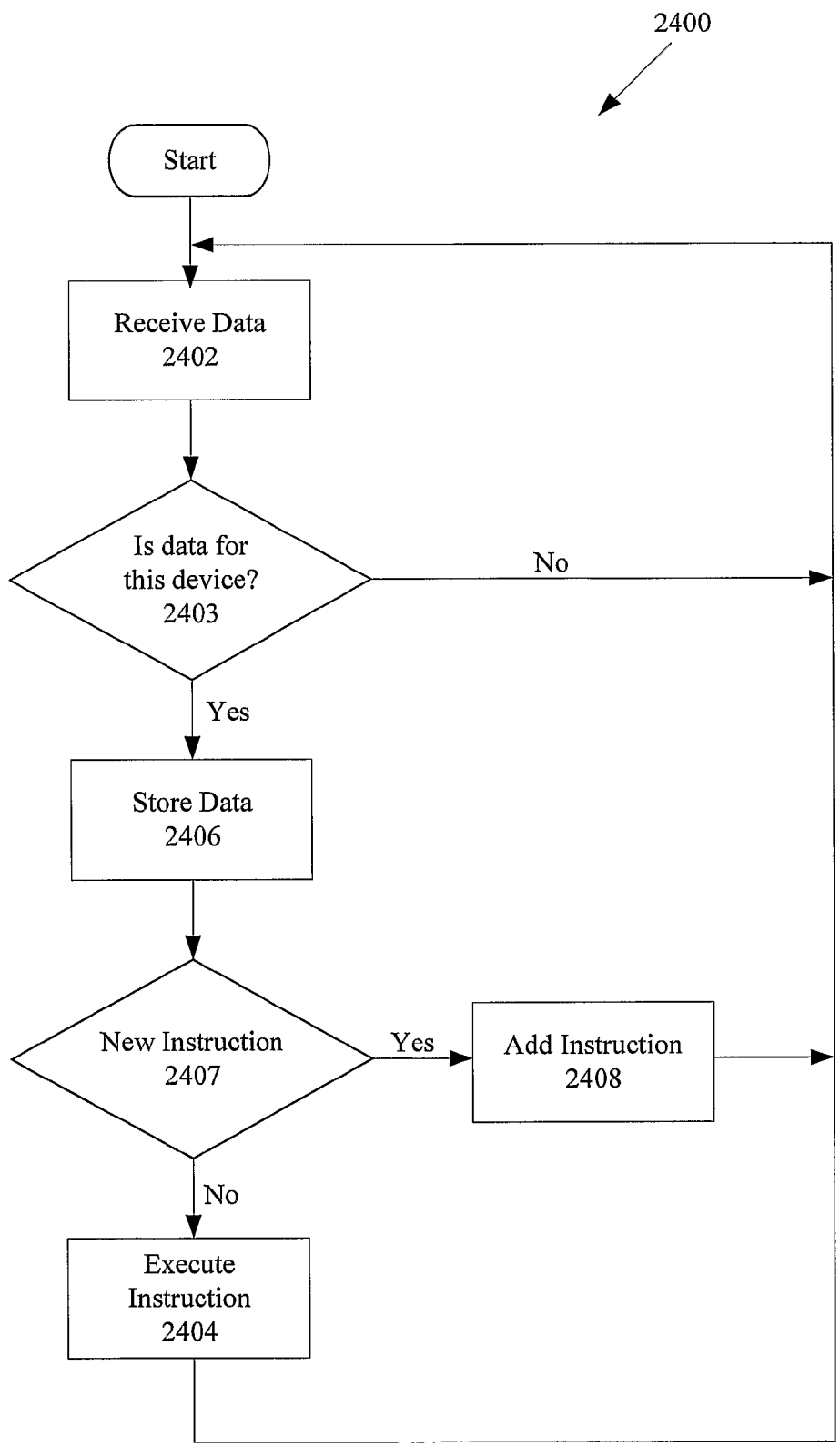
FIG. 46 is a flow diagram of a check activation process for the travel alert device.

Step 3311 checks for newly received activation data using process 9800 (as shown in FIG. 46), and then proceeds to step 3312.

Figure 29:
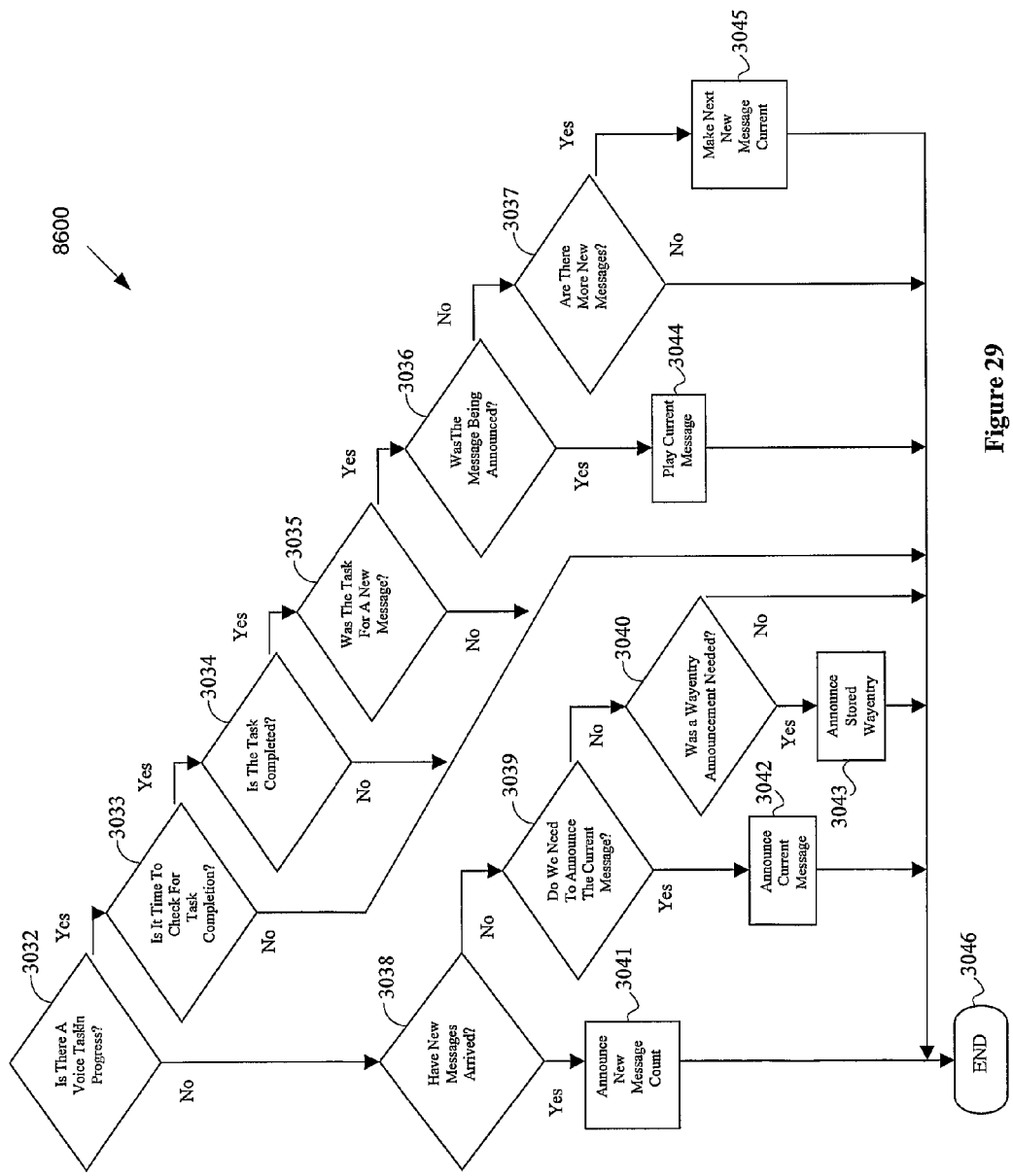
FIG. 29 is a flow diagram of a check voice task progress process for the travel alert device.
Figure 30:
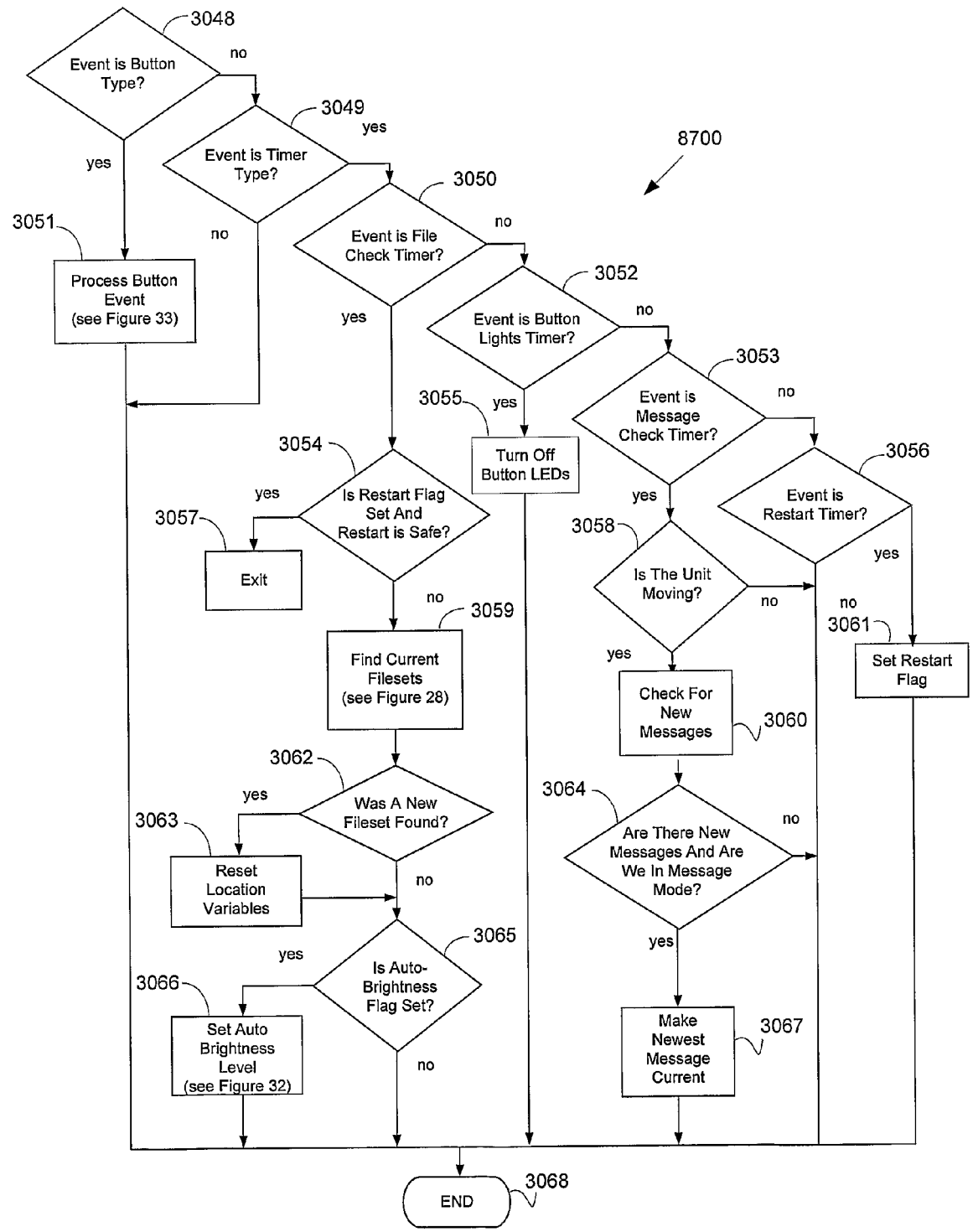
FIG. 30 is a flow diagram of a process new event process for the travel alert device.
Figure 31:
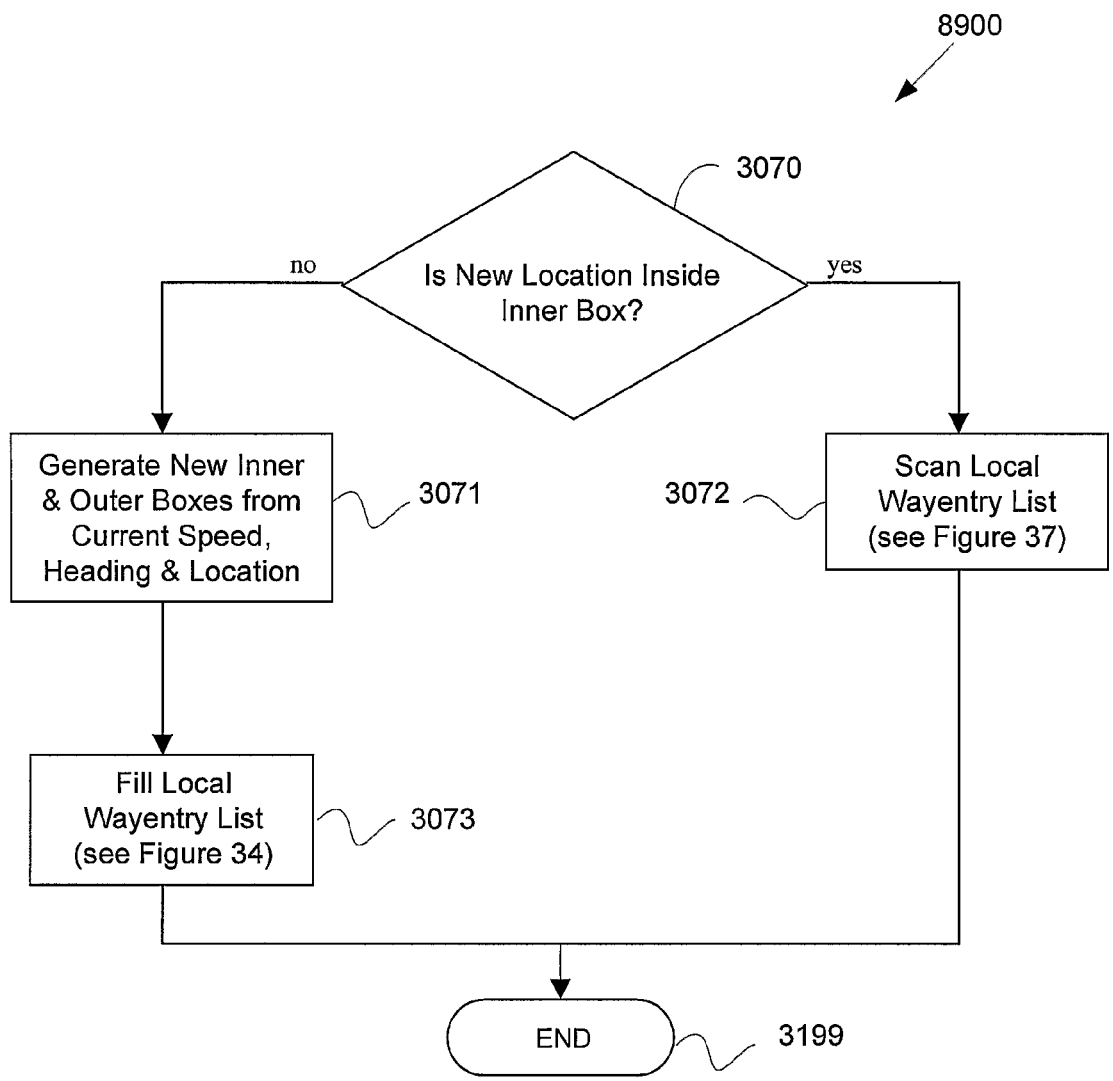
FIG. 31 is a flow diagram of a process new location process for the travel alert device.

Step 3312 determines, using process 8600 (as shown in FIG. 29), whether the current voice task (if any) has completed, and if so whether there are any queued voice tasks which should now be started. At step 3313, the system event queue is polled for a new event, such as a button press or timer expiry. If an event has occurred, step 3313 proceeds to step 3314 to process the event using process 8700 (as shown in FIG. 30) depending on the nature of the event that has occurred. If step 3313 determines that no event has occurred, step 3313 proceeds to step 3315 to continue processing without waiting for an event. At step 3315, the GPS unit 4010 is queried and it is determined whether the current location coordinates have changed. If the GPS unit 4010 detects a change in location, step 3315 proceeds to step 3316 to carry out the appropriate action using process 8900 (as shown in FIG. 31) using the new location coordinates as the unit location. Otherwise, step 3315 proceeds to step 3311.

FIG. 27 is a flow diagram of the configuration process 8400 for initialising the client processor device 4000 with configuration data stored on the EEPROM 109. The configuration procedure 8400 starts at step 3400 by reading configuration values from EEPROM 109 and resetting the internal variables in the processor device 4000 accordingly. This may occur when the application 4110 has started and after the user has finished accessing the configuration menu. Each configuration item has a predefined EEPROM 109 location and data format. The EEPROM 109 also contains Cyclic Redundancy Check (CRC) values calculated from the configuration data.

The items are read from EEPROM 109 into working memory (ie the RAM 108), and then proceeds to step 3401 which checks the EEPROM 109 value which indicates that the EEPROM 109 is still in its initial state, i.e. the application 4110 has not been executed previously on this device 4000. If this is the case, step 3401 proceeds to step 3402 where the EEPROM 109 is set to the default configuration and stored, and the stored CRC for the configuration data is refreshed, and step 3402 proceeds to step 3403. Otherwise, step 3401 proceeds to step 3403.

Step 3403 calculates the CRC for the configuration data in EEPROM 109 and then proceeds to step 3404, which determines whether the stored CRC value differs from the calculated CRC value. If the CRC values differ, step 3404 proceeds to step 3405, where the configuration data is restored to safe values and the stored CRC is refreshed, and step 3405 proceeds to 3406. Otherwise, step 3404 proceeds to step 3406.

Figure 32:
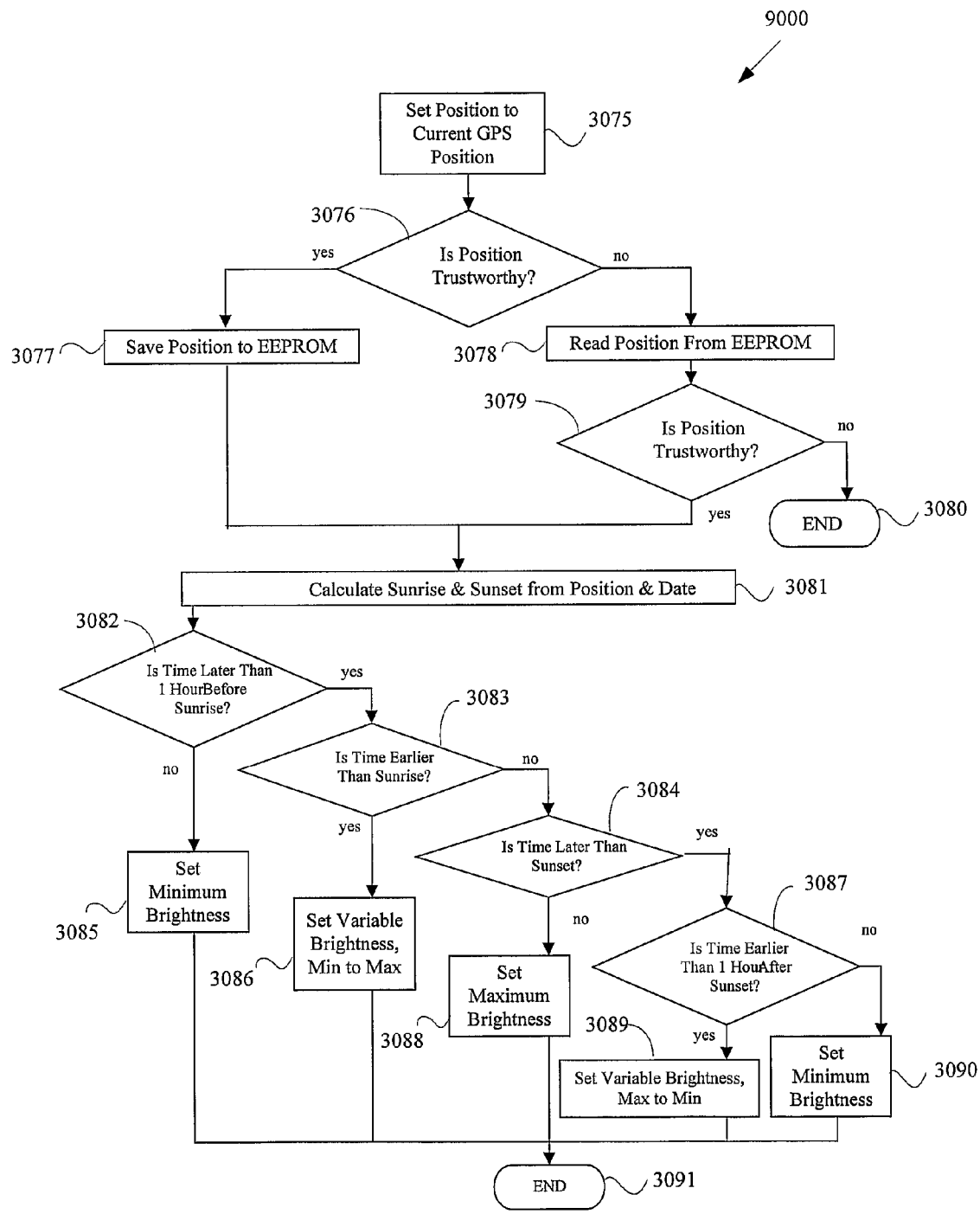
FIG. 32 is a flow diagram of a set auto brightness process for the travel alert device.

At step 3406, the EEPROM 109 value for the speaker volume is checked to ensure it holds a legal variable (and is corrected if not) and the volume is set to the appropriate value. At step 3407, the EEPROM value for the LED brightness is checked to ensure it holds a legal variable (and is corrected if not) and the brightness is set to the appropriate value. At step 3408, global flags variables are set as a copy of the values corresponding to the EEPROM flags which affect the behaviour of the application, such that in doing so, the EEPROM 109 does not have to be read every time the flags need to be inspected. At step 3409, the EEPROM flag for automatic LED brightness setting is checked to determine whether automatic setting of the LED brightness is required. If the flag for automatic LED brightness setting has been set, step 3409 proceeds to step 3410, where the LED brightness is set automatically based on the time of day and the current location using process 9000 (as shown in FIG. 32), and step 3410 proceeds to step 3411. Otherwise, if the flag is not set, step 3409 proceeds to step 3411, where the process of reading the EEPROM 109 configuration concludes.

The process 8500 for finding the current file set, as shown in FIG. 28, determines and prepares for use the most up-to-date complete set of data files for the travel alert application 4110. Process 8500 begins at step 3019, where the files (which store short-term data) are inspected and files newer than the current short-term file (which includes all files if no current short-term file exists, e.g. at application 4110 start) are sorted into a list with the newest file first. At step 3020, the list of new short-term files is navigated from the start, where the newest file is inspected first. The comparison at step 3020 tests whether there are any more new files still to process. If not, step 3020 proceeds to step 3028. Otherwise, step 3020 proceeds to step 3021, where the next new short-term file in the sorted list is opened.

The short-term files contain an identifier for the long-term file set with which those short-term files are associated. At step 3022, this identifier in the new short-term file is read and compared to the current long-term file set, and if no current long-term file set exists (e.g. at application start) step 3022 determines that the short-term file belongs to a different long-term file set and step 3022 proceeds to step 3025. Otherwise, step 3022 proceeds to step 3023, where the short-term file is opened and checked for validity. At step 3023, the file(s) in the long-term file set which match the identifier in the short-term file are opened and checked for validity and completeness. Step 3024 checks the success of the attempt to open the long-term file set. If step 3024 determines that the long-term file set can be successfully opened, step 3024 proceeds to step 3026, where the short-term file is opened and checked for validity. Otherwise, step 3024 proceeds to step 3027. Since short-term files are single-part, a completeness check is not required (e.g. at step 3025 and 3026).

Step 3027 checks the success of the attempt (if any) to open the short-term file. If no attempt was made due to the long-term file set not being opened successfully, this is treated as a failure to open the short-term file successfully. If step 3027 determines that the short-term file was opened unsuccessfully, step 3027 proceeds to step 3020. Otherwise, step 3027 proceeds to step 3028. Step 3028 checks whether there is an open set of long-term files, and if not, step 3028 proceeds to step 3029 to open the backup set of long-term files. These files do not have any facility for accessing short-term data and will not be broadcast; they are loaded onto the device in the factory to serve as a backup in case the transmitted files are unusable for any reason. Step 3029 proceeds to step 3030, where the process for opening the best available file set is concluded. Similarly, if step 3028 determines that there is an open set of long-term files, step 3028 proceeds to step 3030.

The process 8600 for checking the status of voice task progress, as shown in FIG. 29, is performed at regular intervals since there is no event which signals when a task is completed. Process 8600 checks the voice task progress and performs some automatic processing when various types of voice task are found to be complete. Process 8600 begins at step 3032 by determining whether a voice task is currently in progress. A voice task that is currently in progress is indicated by the value of a corresponding global variable. The value of that global variable is queried at step 3032 for determining whether a voice task is currently in progress. If step 3032 determines that a voice task is in progress, step 3032 proceeds to step 3033 to check whether an in-progress voice task has completed and this, for example, may be done intermittently in order to limit the resources used for these checks. Otherwise, step 3032 proceeds to step 3038.

The comparison at step 3033 tests whether a completeness check should be performed now, and if so, step 3033 proceeds to step 3034 where the voice hardware is interrogated to determine whether it is busy or not. Otherwise, step 3033 proceeds to step 3046.

If step 3034 determines that the voice hardware is no longer busy, step 3034 proceeds to step 3035 to determine whether the completed voice task was for a new message (by querying the voice task global variable which records the nature of the voice task). Otherwise, step 3034 proceeds to step 3046.

If step 3035 determines that the voice task was for a new message, step 3035 proceeds to step 3036, which determines whether the voice task was the announcement or playing of a previously unplayed message. The comparison at step 3036 tests whether a new message announcement was in progress. If so, step 3036 proceeds to step 3044 where a new voice task is started in order to play the current message, and step 3044 then proceeds to step 3046. Otherwise, step 3036 proceeds to step 3037. A list of whether each message on the unit has been played is maintained during message reception and playing, and this map is consulted at step 3037 to determine whether there are any unplayed messages. If there are unplayed messages in the list, step 3037 proceeds to step 3045 to select the next unplayed message as the current message and the global variable indicating that the current message needs to be announced is set, and step 3045 then proceeds to step 3046. Otherwise, step 3037 proceeds to step 3046.

If step 3032 determines that there is no voice task currently in progress, step 3032 proceeds to step 3038, which determines whether new messages have been received. Messages may originate from SMS, call centre contacts or direct entry via a website, such as the one provided by the configuration manager 1018. When new messages are received, a global variable is set to initiate their announcement. The comparison 3038 checks that global variable, and if that global variable indicates that the new messages should be announced, step 3038 may proceed to step 3041 to initiate a new voice task to announce the number of proceeds to step 3039.

When the current message changes (including when first entering message mode) or when a warning interrupts a new message, a global variable is set to indicate that the current message needs to be announced. The comparison 3039 checks that global variable, and if that global variable indicates that the current message should be announced, step 3039 may proceed to step 3042 to initiate a new voice task to announce the current message. Otherwise, step 3039 proceeds to step 3040.

When a user presses an "Announce Waypoint" button (e.g. one of the buttons defined as 4030) on the device 4000, a global variable is set to indicate that the stored waypoint and its location needs to be announced. A waypoint (or wayentry) is a location item, such as a speed zone, speed camera or radar, or other traffic or travel feature. The comparison at step 3040 checks that global variable, and if that global variable indicates that the waypoint should be announced, step 3040 proceeds to step 3043, where a new voice task is started in order to announce the stored waypoint. Otherwise, step 3040 proceeds to step 3046, where the process 8600 for checking the progress of the current voice task concludes.

Figure 33:
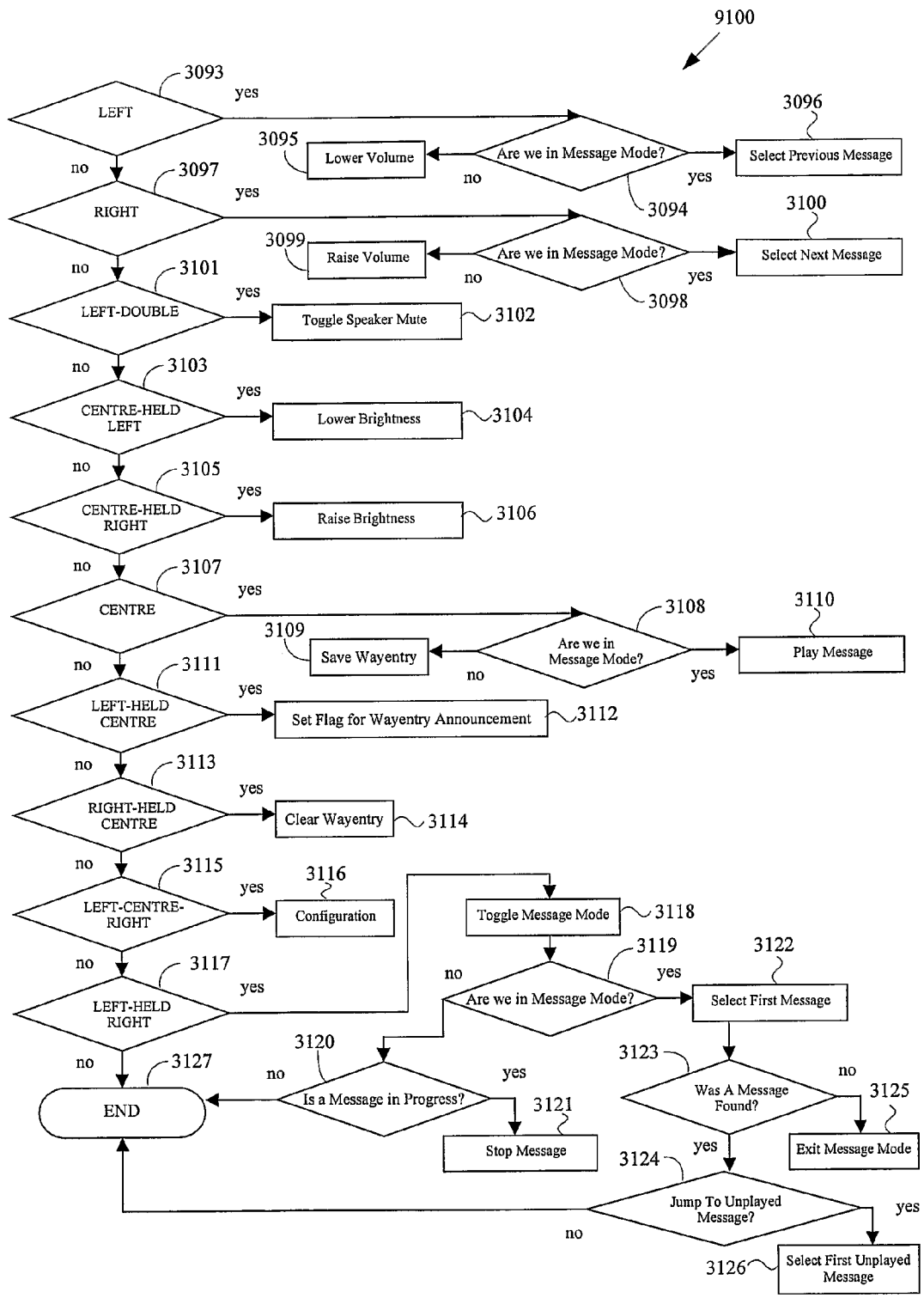
FIG. 33 is a flow diagram of a process button event process for the travel alert device.

When a new event is taken from the system queue, the process 8700 for handling the new event (as shown in FIG. 30) determines the type of the event and carries out the appropriate actions. Process 8700 begins at step 3048, where the nature of the event is known at this point. The comparison at step 3048 determines if the event is due to a button-press. If so, step 3048 proceeds to step 3051 to process the button event, and step 3051 proceeds to step 3068. Otherwise, step 3048 proceeds to step 3049. Step 3051 may involve determining whether the Button Lights timer has been started (this timer may be set to expire in 10 seconds), setting the Button LEDs 4030 to illuminate, and then proceeding to process 9100 (as shown in FIG. 33) to handle the button event.

The comparison at step 3049 determines if the event is due to a timer expiring. If not, step 3049 proceeds to step 3068. Otherwise, step 3049 proceeds to step 3050. The comparison at step 3050 checks the timer event and determines if the event is due to the File Check timer expiring. If not, step 3050 proceeds to step 3052. Otherwise, step 3050 proceeds to step 3054.

The comparison at step 3054 tests the restart flag and also checks that it is safe to restart. Restart is considered safe when either the vehicle speed is below a specified limit or there are no wayentries in the local wayentry list. A wayentry is a geographical area or location defined by location data and representing one or more items at that location for which the device can provide an alert, eg a speed zone, speed camera or radar, accident, school zone, or other traffic or travel feature. If step 3054 determines that the restart flag has been set, and that restart is safe, the travel alert application 4110 is terminated, and at step 3057, control returns to the Init process (i.e. process 8300 as shown in FIG. 26). Otherwise, step 3054 proceeds to step 3059 to find the current filesets (e.g. using process 8500 as shown in FIG. 28), and step 3059 proceeds to step 3062. The comparison at step 3062 tests whether a new set of data files was opened. If not, step 3062 proceeds to step 3065. Otherwise, step 3062 proceeds to step 3063, where the current location variables (e.g. the local wayentry list and the inner and outer area boxes monitored) are cleared so that they will be rebuilt using the new file set when the next GPS sample is received, and step 3063 proceeds to step 3065. At step 3065, the EEPROM flag is checked to determine whether automatic setting of the LED brightness is required. If so, step 3065 proceeds to step 3066 where the LED brightness is set automatically based on the time of day and the current location (e.g. using process 9000 as shown in FIG. 32), and step 3066 then proceeds to step 3068. Otherwise, step 3065 proceeds to step 3068.

The comparison at step 3052 checks the timer event and determines if the event is due to the Button Lights timer expiring. If so, step 3052 proceeds to step 3055 to turn off the Button LEDs 4030, and step 3055 proceeds to step 3068. Otherwise, step 3052 proceeds to step 3053, which checks the timer event and determines if the event is due to the Message Check timer expiring. If so, step 3053 proceeds to step 3058. Otherwise, step 3053 proceeds to step 3056.

The comparison at step 3056 checks the timer event and determines if the event is due to the Restart Check timer expiring. If so, step 3056 proceeds to step 3061, where the restart flag is set to true so that the unit will restart the next time the File Check timer expires and it is safe to so restart. Otherwise, step 3056 proceeds to step 3068.

The comparison at step 3058 tests whether the unit is moving, so that messages are not announced unless the driver is in the car. If step 3058 determines that the car is not moving, step 3058 proceeds to step 3068. Otherwise, step 3058 proceeds to step 3060, where the most up-to-date set of data files is determined and opened (as described above). At step 3060, the set of files allocated to voice messages is checked for new files, and the current time is saved to EEPROM after each check of this type to enable new messages to be identified (i.e. all message files created after the previous check). Step 3060 then proceeds to step 3064, which determines whether new message files were found and if the unit is currently in message mode. If not, step 3064 proceeds to step 3068. Otherwise, step 3064 proceeds to step 3067, where the most recently received message is selected as the current message, and the global variable indicating that the current message needs to be announced is set. Step 3067 then proceeds to step 3068, where the process 8700 of handling the new event concludes.

Figure 37:
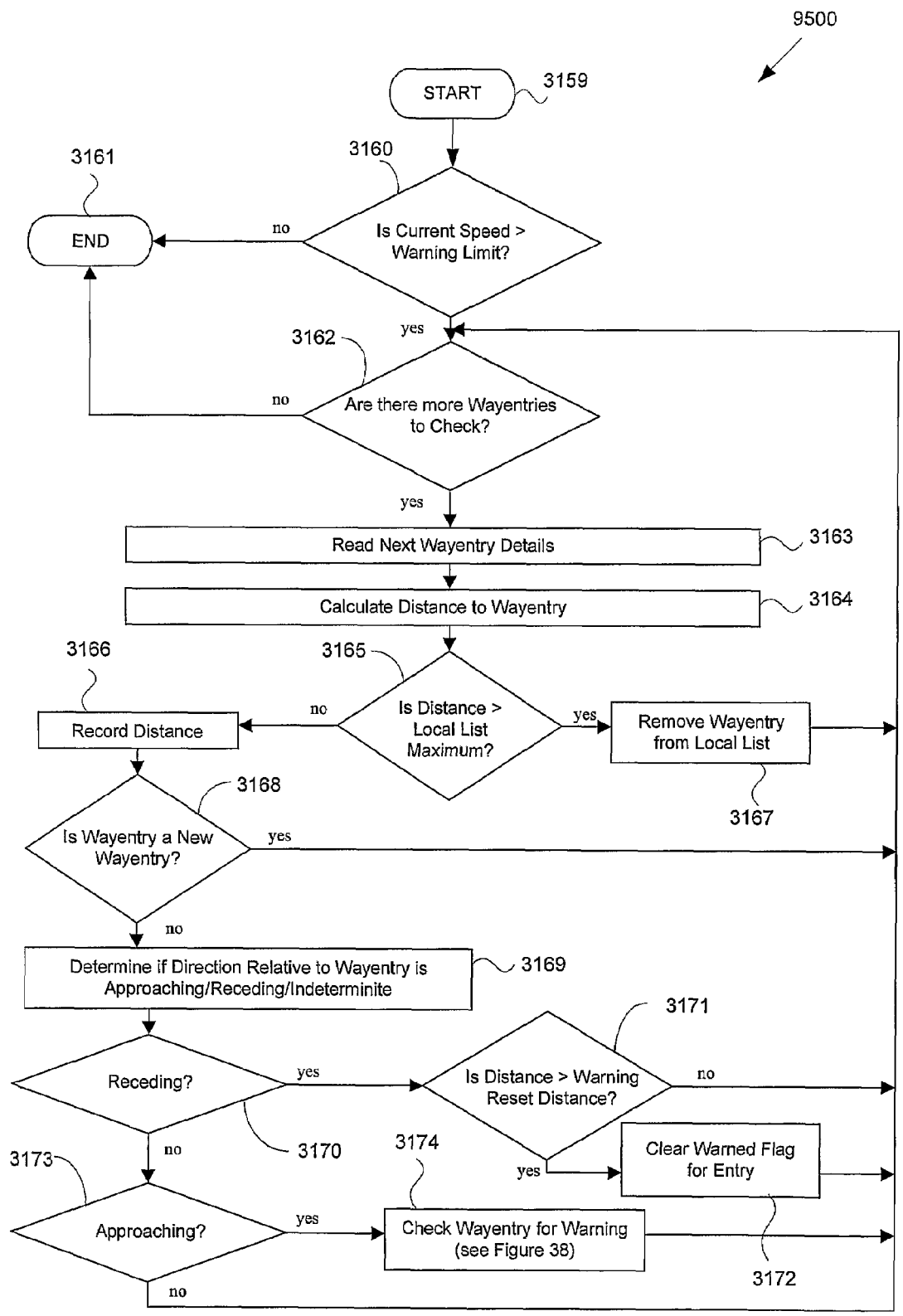
FIG. 37 is a flow diagram of a scan local wayentries process for the travel alert device.

When a changed location has been received from the GPS receiver 4010, the location updating process 8900 (as shown in FIG. 31) carries out the appropriate actions. Process 8900 begins at step 3070, which tests whether the new location received from the GPS receiver lies inside the current inner box. If so, step 3070 proceeds to step 3072, which scans the local wayentry list for nearby wayentries which may require warnings to be issued (e.g. by using process 9500 as shown in FIG. 37), and step 3072 then proceeds to step 3199 where process 8900 ends. Otherwise, step 3070 proceeds to step 3071.

Figure 34:
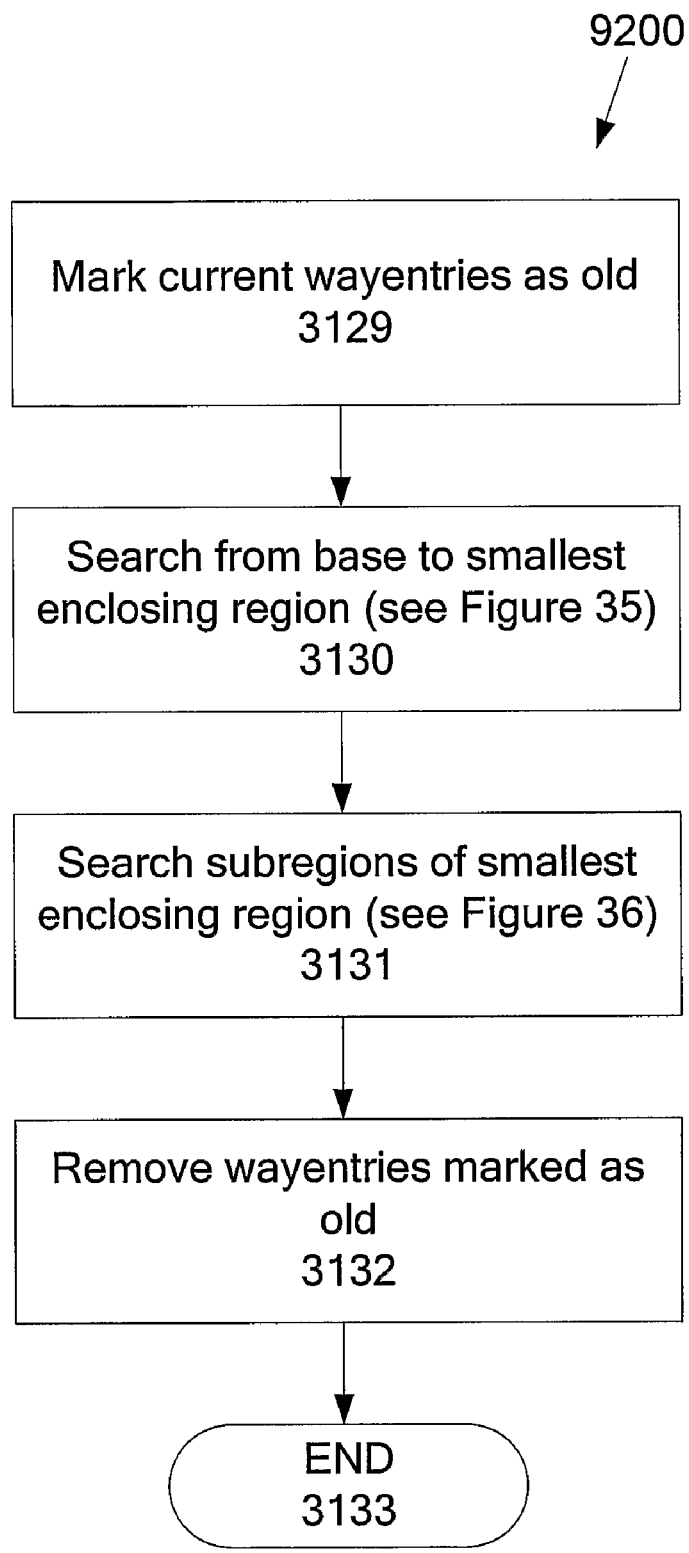
FIG. 34 is a flow diagram of a local wayentry list fill process for the travel alert device.

The inner and outer boxes are geographical areas monitored by the device 4000, and at step 3071, new inner and outer boxes are generated. The new inner box will lie next to the current inner box in the appropriate direction (i.e. in the current direction of travel), and will be sized according to the current speed. The new outer box will lie directly over the new inner box with side lengths triple that of the inner box. Step 3071 proceeds to step 3073, which determines the regions that intersect the current outer box and searches the waylist entries (or wayentries) corresponding to those regions for adding to the local wayentry list (e.g. using process 9200 as shown in FIG. 34). Step 3073 then proceeds to step 3199, where process 8900 for handling a new location ends.

As shown in FIG. 32, the time of day, current location and date are used to determine an appropriate level of brightness for the LEDs. The process 9000 for setting the LED brightness starts at step 3075, where the position as last received from the GPS is retrieved. The position received from the GPS receiver 4010 is examined, at step 3076, to determine whether it is trustworthy (i.e. whether the latitude and longitude values fall into the valid range, e.g. latitudes between −90 and 90 degrees, longitudes between −180 and 180 degrees). If the GPS position received from the GPS receiver 4010 is trustworthy, step 3076 proceeds to step 3077 to save the GPS position to EEPROM 109, and step 3077 proceeds to step 3081. Otherwise, step 3076 proceeds to step 3078, where the last GPS position saved to EEPROM 109 is retrieved. At this stage, it is highly likely that the device 4000 is still near enough to the previous location to make the LED brightness calculations valid when based on the GPS position location stored in the EEPROM 109. At step 3079, the GSP position retrieved from EEPROM 109 is examined to determine whether it is trustworthy (i.e. whether the latitude and longitude values fall into the correct range, as described above). If step 3079 determines that the retrieved GPS location is trustworthy, step 3079 proceeds to step 3081. Otherwise, since no trustworthy position is available, the LED brightness cannot be set and step 3079 proceeds to step 3080 where process 9000 concludes.

At step 3081, the current position and date are used to make a rough estimate of the sunrise and sunset times. The comparison at step 3082 determines whether the current time of day is later than one hour before sunrise. If not, step 3082 proceeds to step 3085 to set a variable representing the LED 4020 brightness to minimum brightness, and step 3085 proceeds to step 3091 where the process 9000 of setting the LED brightness level automatically concludes. Otherwise, step 3082 proceeds to step 3083.

The comparison at step 3083 determines whether the current time of day is earlier than sunrise. If so, step 3083 proceeds to step 3086 to set the variable representing the LED 4020 brightness to a level varying from minimum one hour before sunrise to maximum at sunrise, and step 3086 proceeds to step 3091. Otherwise, step 3083 proceeds to step 3084.

The comparison at step 3084 determines whether the current time of day is later than sunset. If so, step 3084 proceeds to step 3088 to set the variable represent the LED 4020 brightness to maximum brightness, and step 3088 proceeds to step 3091. Otherwise, step 3084 proceeds to step 3087.

The comparison at step 3087 determines whether the current time of day is earlier than one hour after sunset. If so, step 3087 proceeds to step 3089 to set the variable representing the LED 4020 brightness to a level varying from maximum at sunset to minimum one hour after sunset, and step 3089 proceeds to step 3091. Otherwise, step 3087 proceeds to step 3090 to set the variable representing the LED 4020 brightness to the minimum level, and step 3090 proceeds to step 3091.

When the user has pressed a button or combination of buttons, and the button event process 9100, as shown in FIG. 33, determines the appropriate action. Process 9100 begins at step 3093 by determining whether the Left button was pressed. If not, step 3093 proceeds to step 3097. Otherwise, step 3093 proceeds to step 3094, which determines whether the device 4000 is currently in message mode. If not, step 3095 reads the current volume from the EEPROM 109 and, if the current volume is above the minimum level, the current volume is reduced by one increment and the new value is written to EEPROM 109 and the speaker volume adjusted accordingly. Otherwise, step 3094 proceeds to step 3096, where the previous message (in sequence of their arrival) is selected as the current message, and the global variable indicating that the current message needs to be announced is set.

Step 3097 determines whether the Right button was pressed. If not, step 3097 proceeds to step 3101. Otherwise, step 3097 proceeds to step 3098, which determines whether the device 4000 is currently in message mode. If not, step 3099 reads the current volume from EEPROM 109 and, if the current volume is below the maximum level, it is increased by one increment and the new value is written to EEPROM 109 and the speaker volume adjusted accordingly. Otherwise, step 3098 proceeds to step 3100, where the next message (in sequence of their arrival) is selected as the current message, and the global variable indicating that the current message needs to be announced is set.

Step 3101 determines whether the Left button was double-pressed (i.e. pressed twice in short consecutive sequence). If not, step 3101 proceeds to step 3103. Otherwise, step 3101 proceeds to step 3102, where the flag indicating that the speaker be muted is toggled from true to false or vice-versa. If the flag is determined at step 3101 to be true, the speaker volume is set to zero (but the EEPROM 109 volume value is unchanged). If the flag is determined at step 3101 to be false, the speaker volume is set to the EEPROM 109 volume value.

Step 3103 determines whether the Centre button was held down as the Left button was pressed. If not, step 3103 proceeds to step 3105. Otherwise, step 3103 proceeds to step 3104, where the current brightness of the LED 4020 is read from EEPROM 109 and, if the current brightness is above the minimum level, the brightness level is reduced by one increment and the new value is written to EEPROM 109 and the LED 4020 brightness adjusted accordingly.

Step 3105 determines whether the Centre button was held down as the Right button was pressed. If not, step 3105 proceeds to step 3107. Otherwise, step 3105 proceeds to step 3106 where the current brightness is read from EEPROM 109 and, if the current brightness of the LED 4020 is below the maximum level, the brightness level is increased by one increment and the new value is written to EEPROM 109 and the LED 4020 brightness adjusted accordingly.

Step 3107 determines whether the Centre button was pressed. If not, step 3107 proceeds to step 3111. Otherwise, step 3107 proceeds to step 3108, which determines whether the device 4000 is currently in message mode. If not, step 3108 proceeds to step 3109 to save the current GPS position to the EEPROM 109 as a waypoint entry (or wayentry). Otherwise, step 3108 proceeds to step 3110, where a new voice task is started in order to play the current message.

Step 3111 determines whether the Left button was held down as the Centre button was pressed. If not, step 3111 proceeds to step 3113. Otherwise, step 3111 proceeds to step 3112, where the flag is set indicating that the stored waypoint (or wayentry) needs to be announced.

Step 3113 determines whether the Right button was held down as the Centre button was pressed. If not, step 3113 proceeds to step 3115. Otherwise, step 3113 proceeds to step 3114, where the EEPROM 109 flag indicating that a GPS location for a stored wayentry has been cleared.

Step 3115 determines whether the Left, Centre and Right buttons were held down simultaneously. If not, step 3115 proceeds to step 3117. Otherwise, step 3115 proceeds to step 3116, where the user configuration process is performed. When this configuration process is completed, the configuration parameters are read from EEPROM 109 and appropriate actions taken.

Step 3117 determines whether the Left button was held down as the Right button was pressed. If not, step 3117 proceeds to step 3127, where process 9100 ends. Otherwise, step 3117 proceeds to step 3118, where the message mode flag is toggled from true to false or vice-versa. Step 3118 then proceeds to step 3119, which determines whether the device 4000 is in message mode. If not, step 3119 proceeds to step 3120. Otherwise, step 3119 proceeds to step 3122.

Step 3120 determines whether there is a voice task playing a message currently in progress. If so, the current voice task is stopped at step 3121. Otherwise, step 3120 proceeds to step 3127.

Step 3122 selects the most recently arrived message (if any) as the current message, and then proceeds to step 3123, to determine whether a message was selected (i.e. whether any messages exist). If not, step 3125 sets the message mode flag to false. Otherwise, step 3123 proceeds to step 3124, which determines whether the EEPROM 109 flag indicating that unplayed messages should be automatically selected is true and whether there is an unplayed message. If so, step 3126 selects the next unplayed message as the current message, and the global variable indicating that the current message needs to be announced is set. Otherwise, step 3124 proceeds to step 3127. Steps 3095, 3096, 3099, 3100, 3102, 3104, 3106, 3109, 3110, 3112, 3114, 3116, 3121, 3125 and 3126 all proceed to step 3127.

The local wayentry list (e.g. stored in the memory 120 of the device 4000) needs to be refreshed when the outer box changes due to movement, or when a new set of data files has been found and on startup. Updating of the local wayentry list is achieved by process 9200, as shown in FIG. 34. Process 9200 begins at step 3129, where the existing wayentries in the local list are marked as old. If the existing wayentries are still relevant, they will be marked as new instead of being added, so that, for example, warning status signals in respect of those wayentries are not forgotten.

Figure 35:
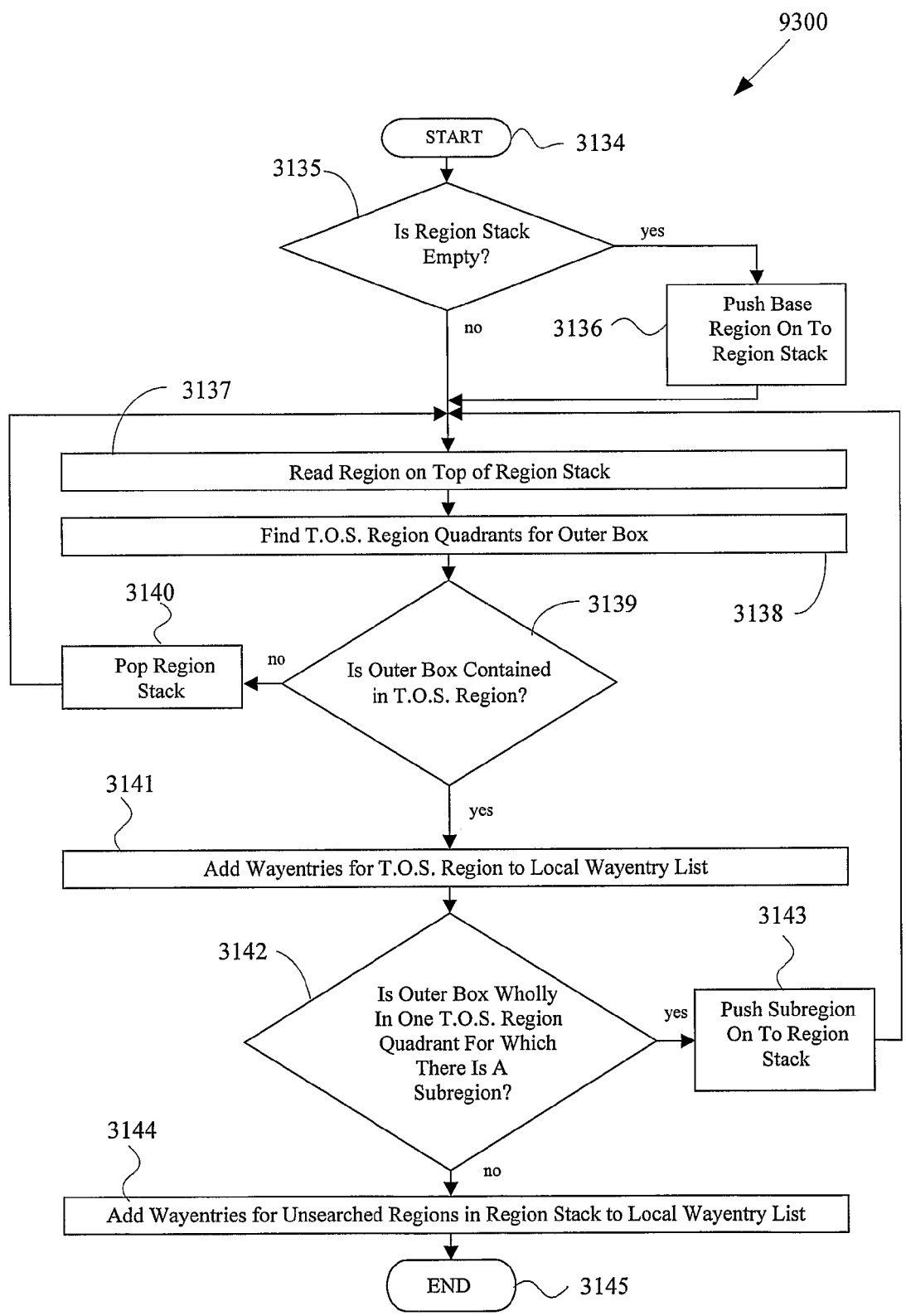
FIG. 35 is a flow diagram of a search from base to smallest enclosing region process for the travel alert device.
Figure 36:
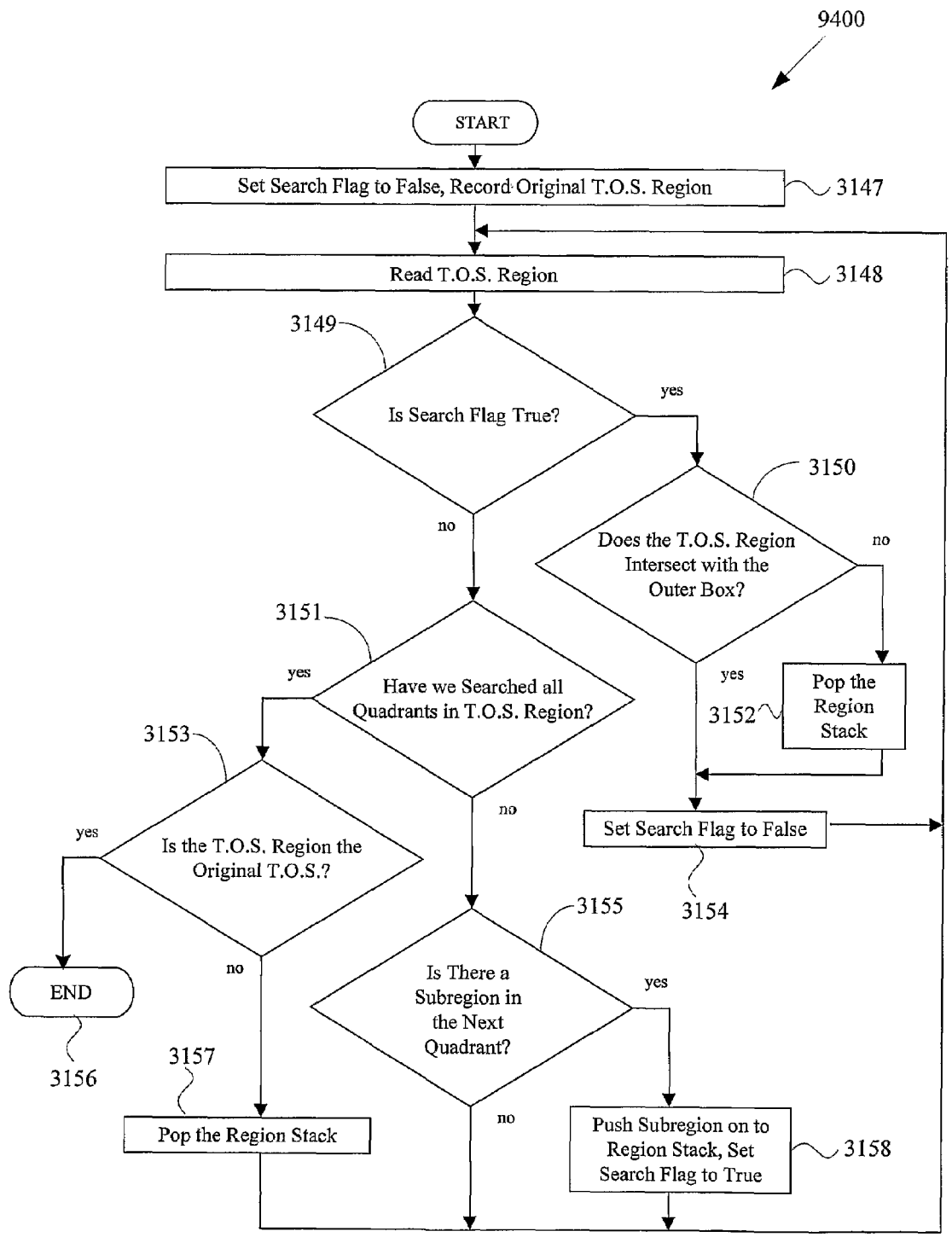
FIG. 36 is a flow diagram of a search subregions of smallest enclosing region process for the travel alert device.

Step 3129 proceeds to step 3130, where process 9300 (as shown in FIG. 35) is used to determine the smallest region that wholly encloses the outer box, and all wayentries for that region and all of its parent regions are added to the local wayentry list. Step 3130 proceeds to step 3131, where process 9400 (as shown in FIG. 36) is used to locate wayentries for all subregions of the enclosing region that intersect the outer box, and add those wayentries to the local wayentry list. Step 3131 proceeds to step 3132, where wayentries in the local wayentry list that are marked as old are removed from the list. Step 3132 then proceeds to step 3133, where the process 9200 for refreshing the local wayentry list concludes.

The outer box lies within a single region in a region tree maintained by the alert application 4110. The process 9300 shown in FIG. 35, commencing at 3134, determines which region that is and adds the wayentries for that region and all regions between it and the base region to the local wayentry list. The travel alert application 4110 maintains a stack of region information from the base region to the smallest region enclosing the outer box. Step 3135 determines whether that stack has been created. If the region stack has been created (i.e. it is not empty), step 3135 proceeds to step 3137. Otherwise, the region stack is empty, and step 3135 proceeds to step 3136 to create the region stack with the base region as the sole entry, and step 3136 proceeds to step 3137.

At step 3137, the details for the region currently on top of the region stack (the TOS region) are read from file. At step 3138, the quadrants of the TOS region (top-left, bottom-left, top-right, bottom-right) into which the top-left and bottom-right corners of the outer box fall are determined (if possible, since one or both of the corners may not lie in the TOS region at all). Step 3139 determines whether both of the outer box corners lie in the TOS region. If not, step 3139 proceeds to step 3140, where the region stack is popped (i.e. the topmost region on the stack is forgotten/removed), and step 3140 then proceeds to step 3137 to read the next region on the top of the region stack. If the topmost region was the base region, a fatal error will occur, since this would imply that the current outer box was not contained in the base region.

Otherwise, step 3139 proceeds to step 3141, where all wayentries referenced by the TOS region are added to the local wayentry list. Step 3142 determines whether the outer box lies within a single subregion of the TOS region. For this to be true, both the outer box corners (top-left and bottom-right) must lie within the same quadrant and there must be a subregion defined for that quadrant. If step 3142 determines the condition to be true, step 3142 proceeds to step 3143, where the subregion referenced by the quadrant in which the outer box corners lie is pushed onto the region stack (i.e. that subregion becomes the new TOS region), and step 3143 proceeds to step 3137. Otherwise, step 3142 proceeds to step 3144.

Depending on the relationship between the previous and new TOS regions, some or all of the regions in the stack may have already had their wayentries added to the local wayentry list. At step 3144, the wayentries for all other regions are added to the local wayentry list. Then, at step 3145, the process 9300 of finding the smallest enclosing region is concluded.

The region currently on top of the region stack is known to be the smallest that wholly encloses the outer box. This region may have subregions that intersect the outer box, and the process 9400 (as shown in FIG. 36) finds those regions and adds their wayentries to the local wayentry list. Process 9400 starts at step 3147, where the current TOS region is recorded and a temporary flag (the search flag) is set to false to begin the process 9400. At step 3148, the details for the TOS region are read from the file for storing the local wayentry list (e.g. as stored in flash memory 120). Step 3149 determines whether the search flag is true. If so, step 3149 proceeds to step 3150. Otherwise, step 3149 proceeds to step 3151.

Step 3150 determines whether the TOS region intersects with the outer box. If not, step 3150 proceeds to step 3152, where the region stack is popped (i.e. the topmost region on the stack is forgotten/removed from the local wayentry list), and step 3152 proceeds to step 3154. Otherwise, step 3150 proceeds to step 3154 to set the search flag to false, and step 3154 proceeds to step 3148 to read the next TOS region.

Step 3151 determines whether process 9400 has searched (i.e. performed step 3155) all the four quadrants for the TOS region. If so, step 3151 proceeds to step 3153. Otherwise, step 3151 proceeds to step 3155.

Step 3153 determines whether the current TOS region was the TOS region recorded at the beginning of this process 9400 (i.e. at step 3147). If so, the process 9400 for searching subregions of the TOS region ends at step 3156. Otherwise, step 3153 proceeds to step 3157, where the region stack is popped (i.e. the topmost region on the stack is forgotten/removed from the local wayentry list), and step 3157 proceeds to step 3148.

Step 3155 determines whether the next quadrant of the TOS region (the quadrants are searched in the order TL, BL, TR, BR) has a subregion defined for it). If so, step 3155 proceeds to step 3158, where the subregion referenced by the quadrant of the TOS region that is currently being searched is pushed onto the region stack (i.e. becomes the new TOS region), and step 3158 proceeds to step 3148. Otherwise, step 3155 proceeds to step 3148.

FIG. 37 is a flow diagram of the process 9500 that forms the basis of the travel alert application 4110. When process 9500 starts, at step 3159, the inner and outer boxes have been defined and the local wayentry list has been refreshed to take into account the most recent location read from the GPS receiver 4010. Step 3160 then determines whether the current speed of the vehicle is high enough to usefully issue warnings.

If not, step 3160 proceeds to step 3161, where the process 9500 to scan the local wayentry list is concluded.

Otherwise, step 3160 proceeds to step 3162, where the process 9500 of scanning the local wayentry list cycles through each wayentry in the list and performs certain actions with that wayentry. If step 3162 determines that there are no more wayentries to check, step 3162 proceeds to step 3161, where process 9500 ends. Otherwise, if the comparison 3162 determines that there are more wayentries to check, step 3162 proceeds to step 3163, where the details of the next wayentry in the local wayentry list are read from file. This is required because only a reference to the wayentry is held in the local wayentry list, not the wayentry's full details.

At step 3164, the distance from the device 4000 to the wayentry is determined trigonometrically. Step 3165 then determines whether the distance from the device 4000 to the wayentry is more than a specified maximum, so that wayentries far removed from the unit need not be considered for warnings. Such wayentries may appear in the local wayentry list if they fall across a region boundary and so are added to a region one or more levels higher than the smallest enclosing region. If step 3165 determines that the distance is more than the specified maximum, step 3165 proceeds to step 3167 to remove the wayentry from the local wayentry list, and step 3167 then proceeds to step 3162. Otherwise, step 3165 proceeds to step 3166.

At step 3166, the distance from the unit to the wayentry is recorded in the local wayentry list. This is so that the relative movement between the device 4000 and the wayentry (e.g. approaching or receding) can be determined by comparing successive distances recorded between the two. Step 3168 determines whether the wayentry is a new addition to the list. If so, step 3168 proceeds to step 3162. Otherwise, step 3168 proceeds to step 3169, where the relative movement between the device 4000 and the wayentry is determined as one of approaching, receding or indeterminate.

Step 3170 determines whether the wayentry is receding relative to the device 4000. If so, step 3170 proceeds to step 3171. Otherwise, step 3170 proceeds to step 3173. Step 3171 determines whether the distance from the device 4000 to the wayentry is more than the specified distance at which the warning status for the wayentry is reset. If so, step 3172 resets the warning status for the wayentry, and step 3172 proceeds to step 3162. This means that if the unit once again begins to approach the wayentry, warnings may be issued. Otherwise, step 3171 proceeds to step 3162.

Figure 38:
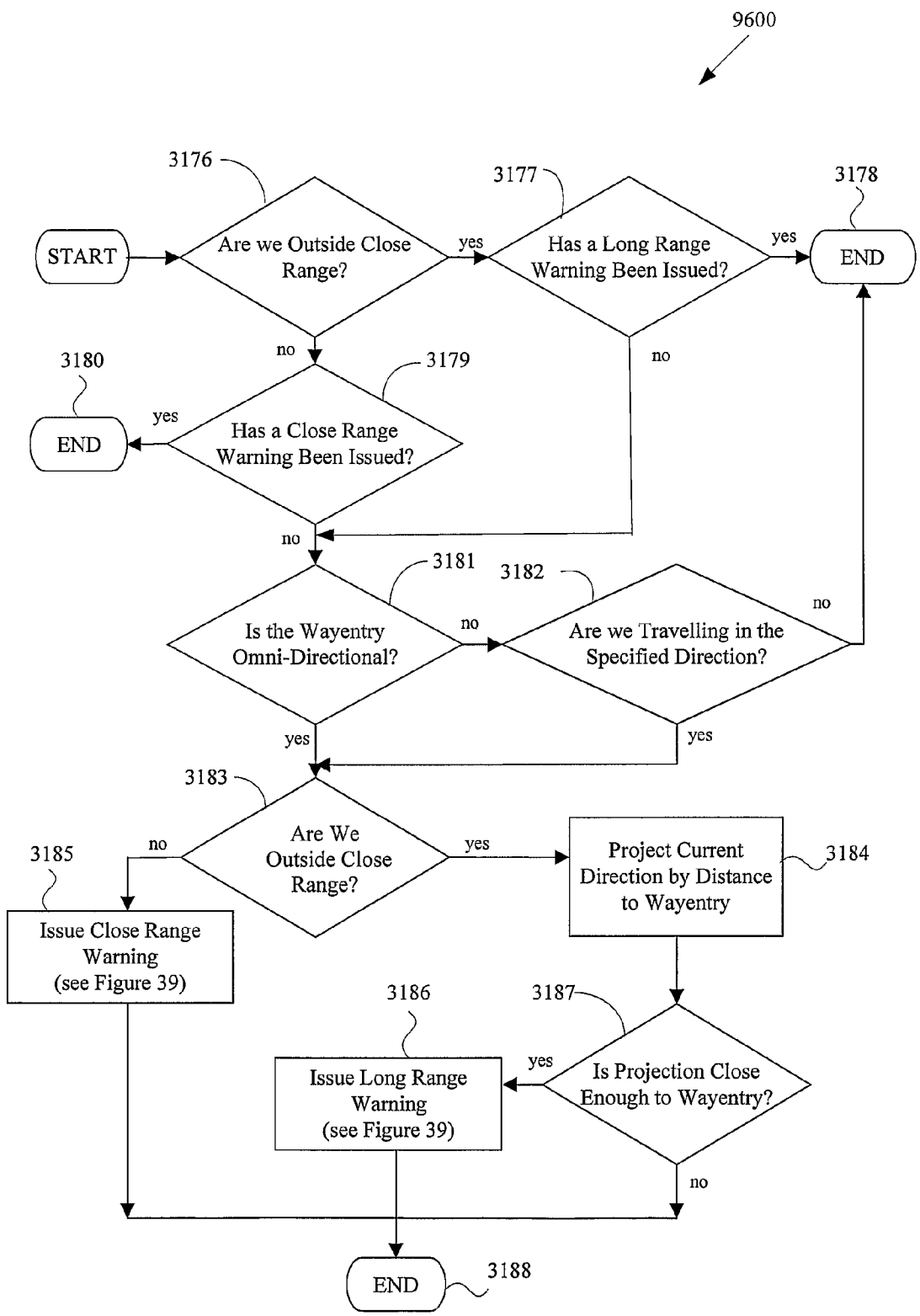
FIG. 38 is a flow diagram of a check wayentry for warning process for the travel alert device.

Step 3173 determines whether the wayentry is approaching relative to the device 4000. If the travel alert application 4110 has determined that the unit is approaching the wayentry, step 3173 proceeds to step 3174 to determine whether a warning should be issued and if so of what type (e.g. by performing process 9600 as shown in FIG. 38). Otherwise, step 3173 proceeds to step 3162.

The device 4000 is approaching a wayentry, and the device 4000 therefore needs to determine whether a warning should be issued for that wayentry, and if so, what type of warning to issue. This is determined by the process 9600 as shown in FIG. 38. Process 9600 begins at step 3176, which determines whether the distance from the device 4000 to the wayentry is outside the distance specified as close range. If not, step 3176 proceeds to step 3179. Otherwise, step 3176 proceeds to step 3177, which determines whether a long range warning for this wayentry has been issued, and if so, the process 9600 of checking a wayentry for warnings concludes with no warning issued. Otherwise, step 3177 proceeds to step 3181.

Step 3179 determines whether a close range warning for this wayentry has been issued. If so, the process 9600 of checking a wayentry for warnings concludes with no warning issued at step 3180. Otherwise, step 3179 proceeds to step 3181, which determines whether the wayentry is an omnidirectional wayentry (i.e. the vehicle to which the device 4000 is mounted should be warned of the wayentry when approaching the wayentry from any direction). If not, step 3181 proceeds to step 3182. Otherwise, step 3181 proceeds to step 3183.

Step 3182 determines whether the device 4000 is travelling in a direction which is within the range of directions specified as relevant to the wayentry. If not, step 3182 proceeds to step 3178, where the process 9600 of checking a wayentry for warnings concludes with no warning issued. Otherwise, step 3182 proceeds to step 3183.

Figure 39:
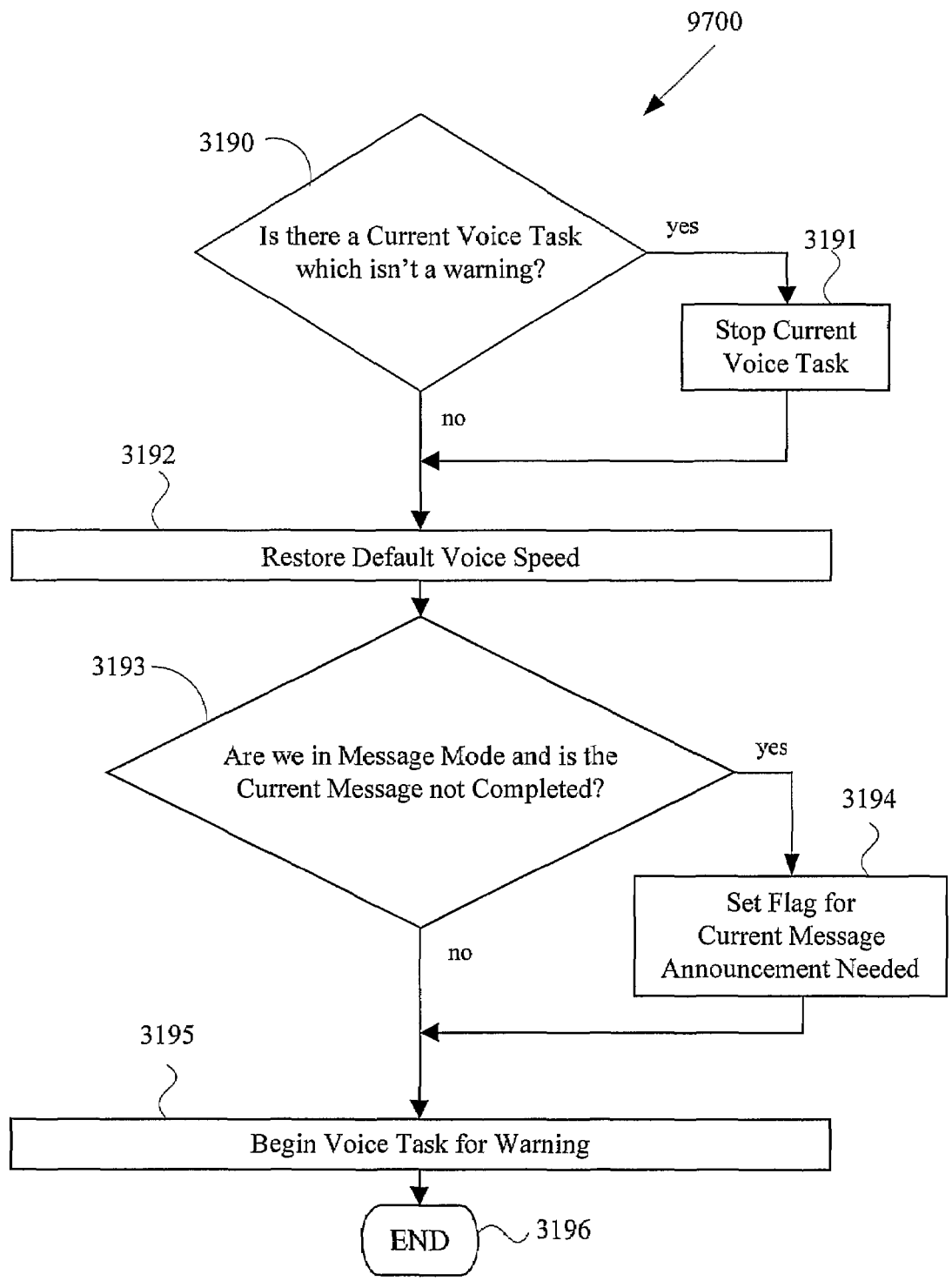
FIG. 39 is a flow diagram of an issue warning process for the travel alert device.

Step 3183 determines whether the distance from the device 4000 to the wayentry is outside the distance specified as close range. If not, step 3185 issues a close range warning for the wayentry (e.g. using process 9700 as shown in FIG. 39), and step 3185 proceeds to step 3188, where process 9600 ends. Otherwise, step 3184 uses the device's 4000 current direction and distance from the wayentry to construct a projected location for the unit. This location represents where the device 4000 would be if it traveled in its current direction for the distance by which the device 4000 is separated from the wayentry. Step 3184 proceeds to step 3187, which determines whether the distance of the device 4000 from the projected location to the wayentry is within the range specified as requiring a long range warning to be issued. If not, step 3187 proceeds to step 3188, where the process of checking a wayentry for warnings concludes. Otherwise, step 3187 proceeds to step 3186, where a long range warning is issued for the wayentry (e.g. using process 9700 as shown in FIG. 39), and step 3186 then proceeds to step 3188.

A warning (either close or long range) is to be issued and certain tasks need to be carried out before the voice task for the warning can be begun, as shown in process 9700 of FIG. 39. Process 9700 begins at step 3190, by determining whether there is a current voice task which is not a wayentry warning. If so, step 3190 proceeds to step 3191, where the current voice task is stopped, and step 3191 proceeds to step 3192. Otherwise, step 3190 proceeds to step 3192.

Step 3192 restores the voice hardware (e.g. by controlling the voice processor 4040) to its default voice speed. Step 3193 then determines whether the device 4000 is in message mode and that the current message has not been fully played. If so, step 3193 proceeds to step 3194, where the global variable indicating that the current message needs to be announced is set, and step 3194 proceeds to step 3195. Otherwise, step 3193 proceeds to step 3195.

At step 3195, the voice task run by the device 4000 for issuing the required warning is executed, and step 3195 proceeds to step 3196, where process 9700 ends.

Figure 40:
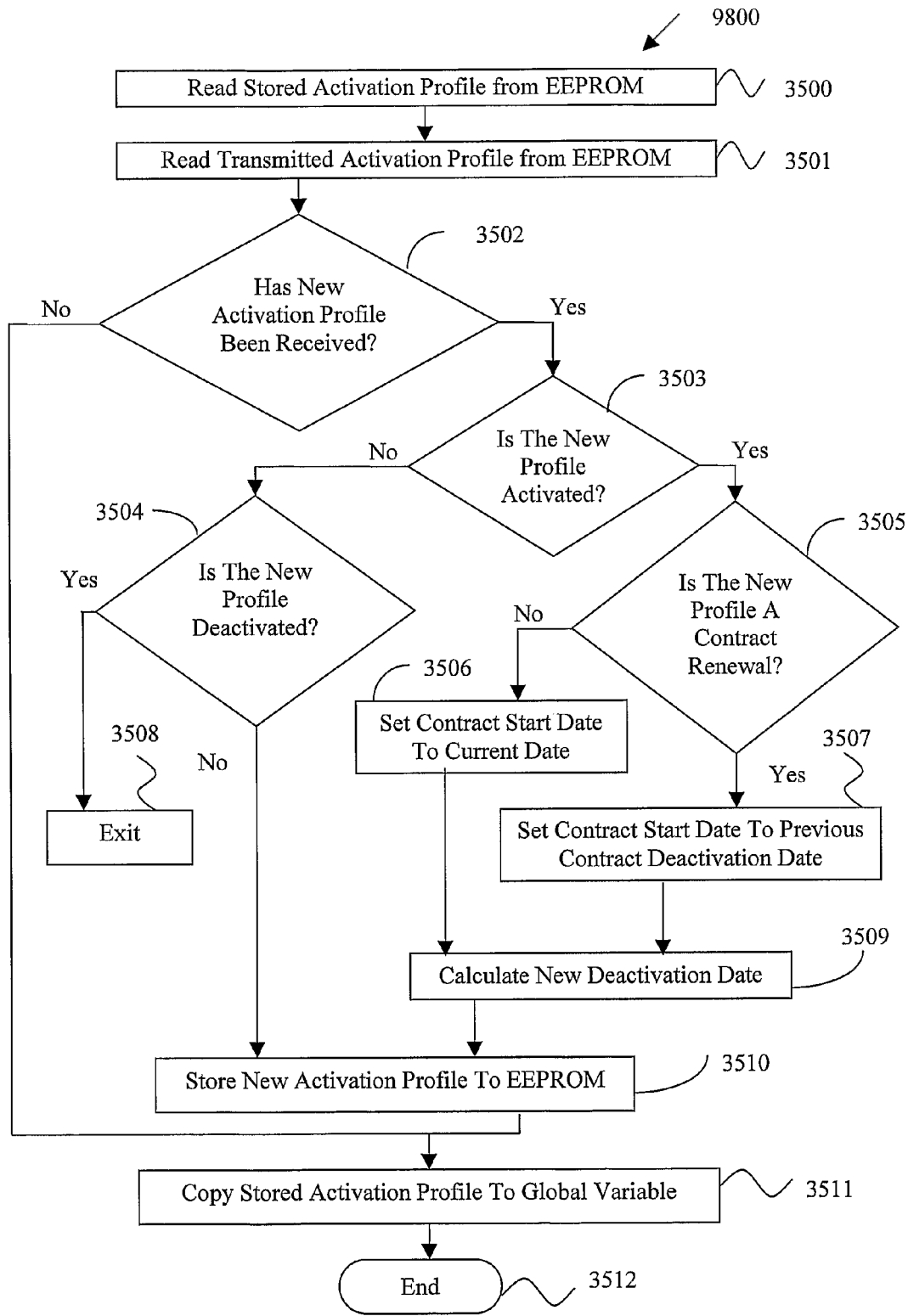
FIG. 40 is a block diagram of a server transmission system for a client processor device configured as a theft indicator device.

The process 9800 for checking for new activation data, as shown in FIG. 40, determines whether new activation data has been received by the device 4000 and carries out required adjustments to the configuration data for the travel alert application 4110 in the event that it has been received.

Process 9800 begins at step 3500, which reads from EEPROM 109 the activation level data which was stored by the application 4110, and step 3500 proceeds to step 3501. Step 3501 reads from EEPROM 109 the activation level data which may have been stored by other tasks, e.g. air task 224 or command interface task 222, and step 3501 proceeds to step 3502.

Step 3502 determines whether new activation level data has been stored by the device 4000 by comparing the timestamps contained within the stored and transmitted activation level data. If new activation data has been received, step 3502 proceeds to step 3503, otherwise step 3502 proceeds to step 3511.

The comparison at step 3503 determines whether the new activation data indicates that a contract for the application 4110 has been activated. If so, step 3503 proceeds to step 3505, otherwise step 3503 proceeds to step 3504.

The comparison at step 3505 determines whether the new activation data is for a contract renewal as opposed to a contract initialisation. If so, step 3505 proceeds to step 3507, where the reference date for the new contract's deactivation date is set from the previous contract's deactivation date, and then step 3507 proceeds to step 3509. Otherwise, step 3505 proceeds to step 3506, where the reference date for the new contract's deactivation date is set from the current date, and then step 3506 proceeds to step 3509. Step 3509 calculates the new contract deactivation date from the reference date and the new contract's length, then proceeds to step 3510.

The comparison at step 3504 determines whether the new activation data indicates that the contract for the application 4110 has been deactivated. If so, step 3504 proceeds to step 3508, where the application 4110 exits, otherwise step 3504 proceeds to step 3510.

Step 3510 stores the new activation data in EEPROM 109 and proceeds to step 3511, where the stored activation data is copied to a global memory location so that the application 4110 can conveniently refer to this information when required. Step 3511 then proceeds to step 3512 where process 9800 ends.

4. Theft Indicator Device

Figure 41:
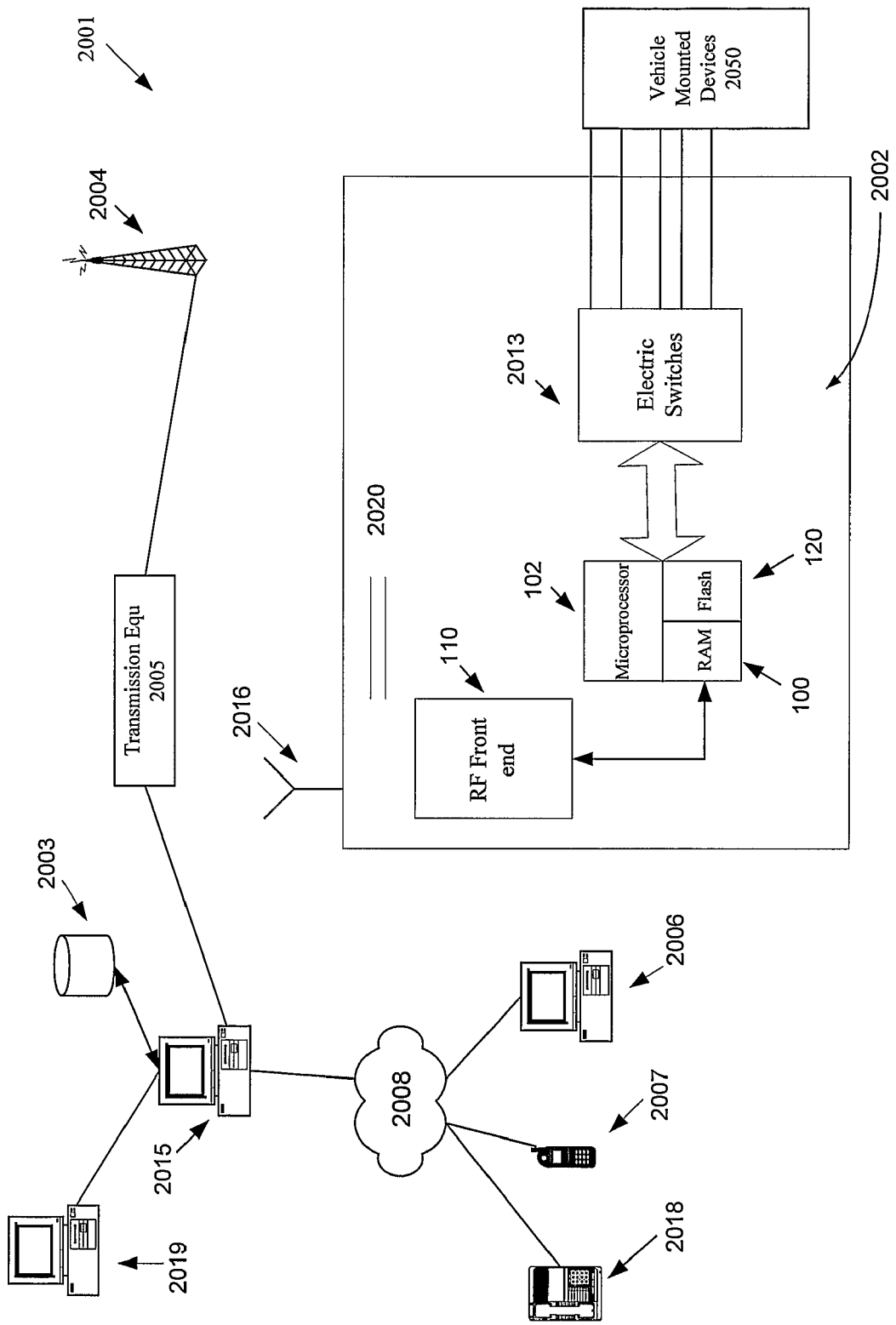
FIG. 41 is a block diagram of a hardware architecture for a client processor device for a theft indicator device.

A theft alert system 2001 for indicating theft of a vehicle, as shown in FIG. 41, includes a theft indicator 2002, a database 2003 for matching a vehicle identifier with a theft indicator 2002, a transmitter 2004 and remote terminal (e.g. a computing apparatus 2006, mobile telephone 2007 or a standard telephone 2018) for automatically extracting a vehicle identifier from a signal sent to the database 2003 via a communications network 2008. The computing apparatus 2006 may be a standard desktop computer from IBM <http://www.ibm.com> running on a standard operating system (such as Microsoft Windows <http://www.microsoft.com/windows> or Linux <http://www.linux.org>). The communications network 2008 includes an IP-based communications network (such as the Internet) for the server 2015 to communicate with the computing apparatus 2006. The network 2008 also includes a telecommunications network (such as a Public Switched Telephone Network (PSTN) or GSM network) for the server 2015 to communicate with the mobile telephone 2007 or a standard telephone 2018.

The server 2015 communicates with the database 2003, and provides suitable interfaces for other devices (e.g. 2006, 2007 and/or 2018) to communicate with the database via the communications network 2008. The server 2015 communicates with and may be controlled by a control station 2019. The server 2015 also interfaces with transmission equipment 2005, which interfaces with a radio transmitter 2004, such that signals sent from the server 2015 are converted by the transmission equipment 2005 into suitable signals for transmission to other devices (e.g. a theft indicator device 2002) via the radio transmitter 2004.

The server 2015, the database 2003, and the transmission equipment 2005 have the architecture described previously for the server transmission system 1001 of FIG. 23 and use the air protocol.

Figure 42:
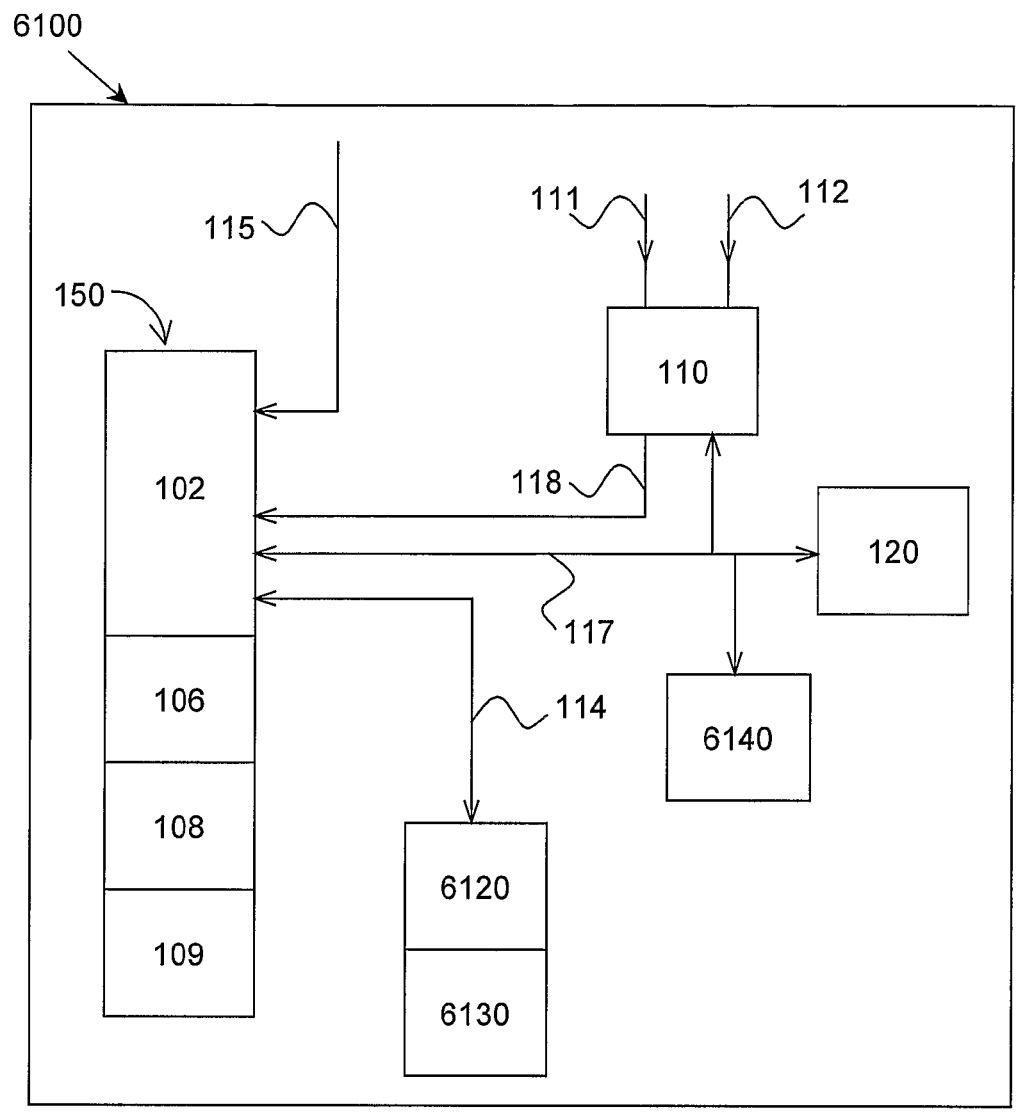
FIG. 42 is a logic architecture for the device for the theft indicator device.
Figure 43:
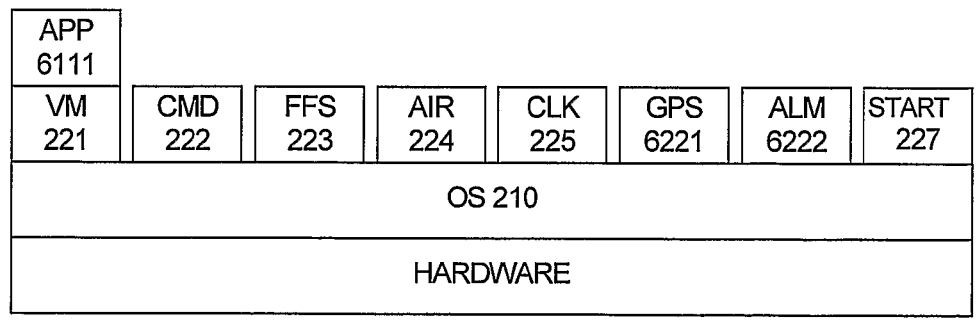
FIG. 43 is a flow diagram of the process of sending data to the theft indicator device.

The client processing device 100 provides the theft indicator 2002. The hardware architecture 6100, as shown in FIG. 42, for the theft indicator 2002 is the same as that for the client processor device 100, with the addition of specific I/O components for activating the lights 6120, the immobiliser 6130 and any other vehicle devices that may require an interface 6140 controlled via the bus 117. The lights 6120, immobiliser 6130 and interface 6140 for other vehicle devices are shown collectively as 2050 in FIG. 41. These components are controlled by switches 2013, which operate under the control of the microprocessor 102, and the microprocessor 102 interfaces with other components, such as the receiver 110, RAM 108 and flash memory 120. The radio transceiver 110 receives radio signals transmitted from the radio transmitter 2004 via the antenna 2016, and passes the received signal to the microprocessor 102 via the analog 118 or serial interface 117 (as shown in FIG. 42). As shown in FIG. 43, the theft indicator 2002 includes additional tasks, such as an alarm task 6222, for use with the application files 6111.

In operation, a user of the system places a call on mobile telephone 2007 or logs an entry via computing apparatus 2006 that their vehicle has been stolen. The vehicle may be identified by the vehicle license plate number or other unique identifier. The number is received by database 2003, connected to server 2015, and is matched to a theft indicator device 2002 number. A signal is then sent to the device 2002 carrying the matched theft indicator device number via radio transmitter 2004 to alert the device 2002 to the theft condition of the vehicle. The device 2002 then activates a vehicle mounted device, in the form of lights 2014 or an immobiliser, to act in a manner defined by the data received by the device 2002 (e.g. the radio signal received by the transceiver 110).

Figure 44:
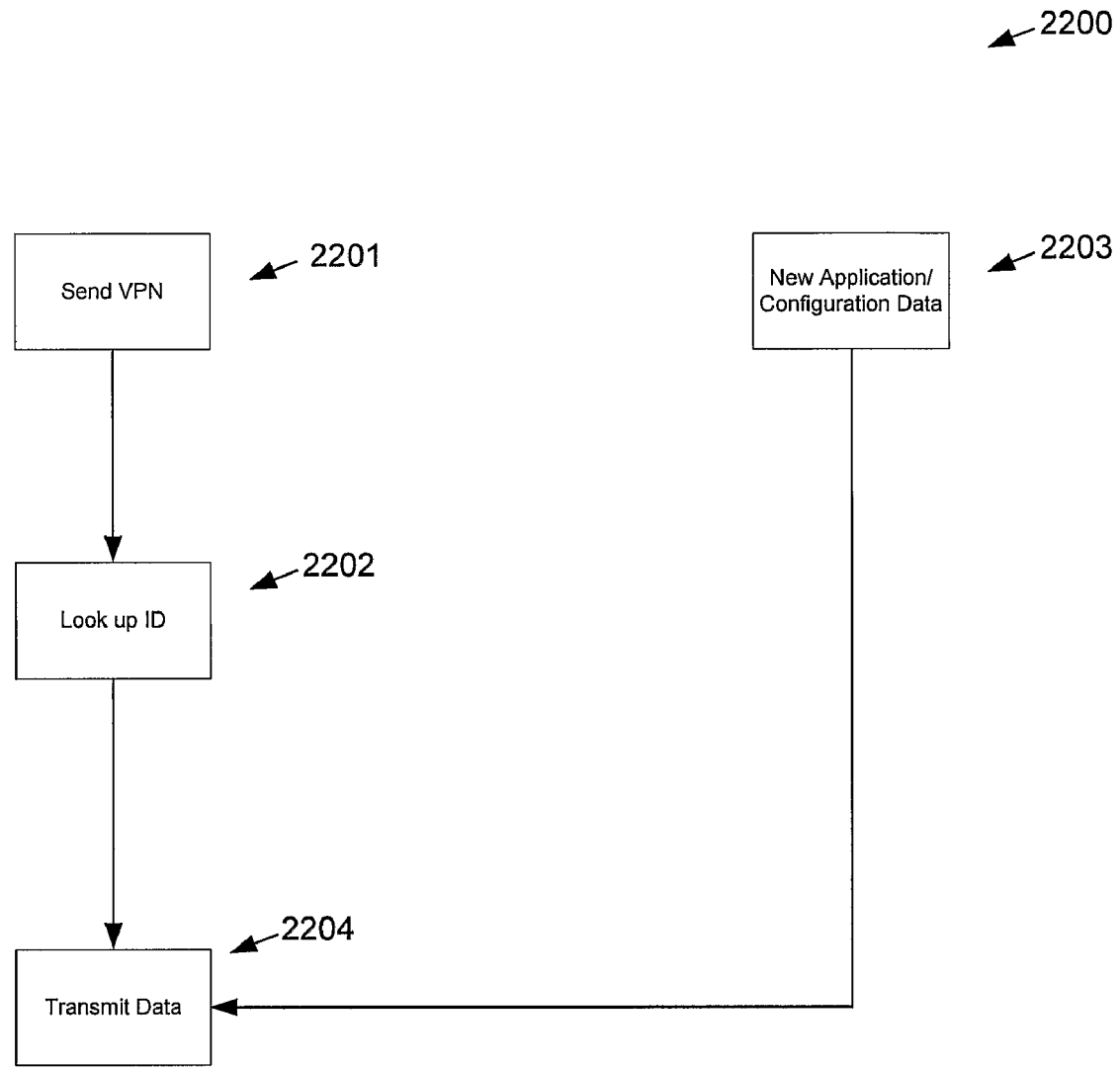
FIG. 44 is a flow diagram of the process executed by the theft indicator device during operation.

FIG. 44 shows a flow chart of the process 2200 illustrating the steps taken in sending data to the theft indicator device 2002. This data may indicate that a vehicle has been stolen or may be data to update the device 2002. Process 2200 may start at step 2201, where if a subscriber to the theft indicator system 2001 needs to report the theft of their vehicle, the subscriber sends their vehicle license plate number (or any other unique identifier associated with a vehicle) to the server 2015 using a remote terminal 2006, 2007 and/or 2018. The database 2003 of the system then correlates the vehicle license plate number with the device identifier at step 2202, and then the server 2015 sends data (including the device identifier) to the device 2002 at step 2204. Alternatively, process 2200 may start at step 2203, where the server 2015 sends data to the device 2002 to update the application, instruction or configuration data stored in the device 2002. In this instance, the data would be provided from the server at step 2203, and is then transmitted to the device 2002 at step 2204.

An updated program may be sent by a system administrator (e.g. using control station 2019) to alert the theft indicator of a new operating frequency or to send new application or data files which contains new instructions to operate one or more new vehicle mounted devices.

Figure 45:
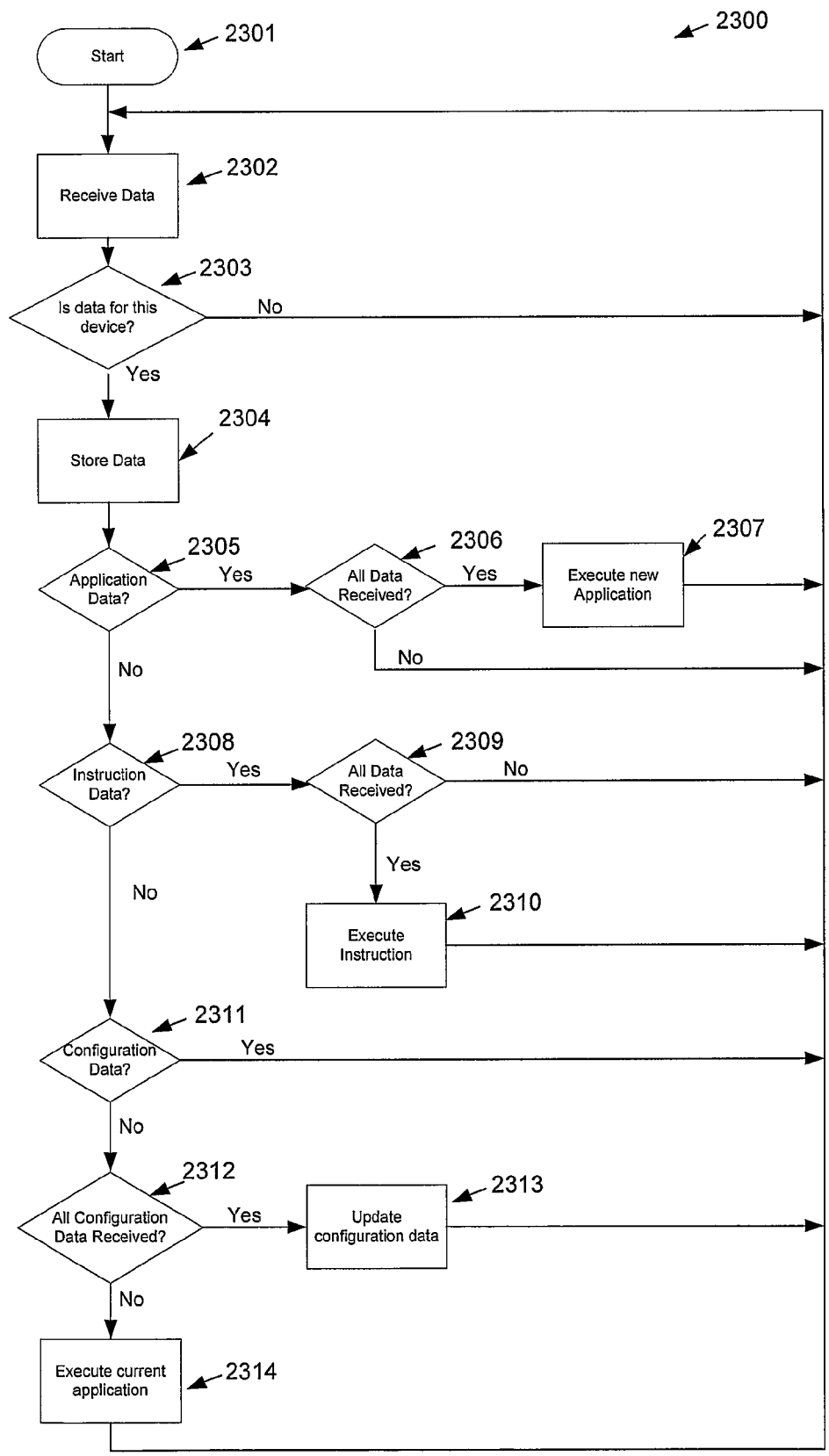
FIG. 45 is a flow diagram of the process for sending specific instructions to the theft indicator device.

The operation of the device 2002 is shown in FIG. 45 as process 2300. Process 2300 begins at step 2301, where the device 2002 receives transmitted data (e.g. from the radio transmitter 2004). The device 2002 processes the data at step 2303 to decide if the data sent is for that device 2002 (e.g. by checking the theft indicator device number associated with the data received, and checking whether that number corresponds with the device number of the device 2002). If step 2303 determines that the data is not for the device 2002, step 2303 proceeds to step 2302 to wait for further data. However, if step 2303 determines that the data is for the device 2002, the data received is stored in the memory 102 of the device 2002 at step 2304.

After storing the data at step 2304, step 2304 proceeds to step 2305, where the device determines what type of data has been received. At step 2305, the device 2002 tests where the data is application data. If the data is not application data, step 2305 proceeds to step 2307. Otherwise, step 2305 proceeds to step 2306 to determine whether all the application data (which are transmitted as a series of file fragments) have been received. If so, step 2306 proceeds to step 2307 to execute the new application, and step 2307 then proceeds to step 2302. Otherwise, step 2306 proceeds to step 2302 to receive further data.

The device 2002, at step 2308, determines whether the data received is instruction data. If the data is not instruction data, step 2308 proceeds to step 2311. Otherwise, step 2308 proceeds to step 2309, which determines whether all the instruction data has been received. If so, step 2309 proceeds to step 2310 to execute the instructions represented by the instruction data, and step 2310 then proceeds to step 2302. Otherwise, step 2309 proceeds to step 2302 to receive further data.

If the data is neither application nor instruction data, then at step 2311, the device 2002 determines whether the data received is configuration data. If step 2312 determines that the data is not configuration data, then the data received is invalid. The operation of the device 2002 remains unchanged, and step 2312 proceeds to step 2314 to execute the current application files stored in memory 102. However, if step 2312 determines that the data is configuration data, step 2312 proceeds to step 2313, where the device 200 is updated with the new configuration data, and step 2313 proceeds to step 2302 to receive further data.

FIG. 46 is a flow chart of process 2400 for sending specific instructions to the theft indicator device 2002. For example, the instructions generated by the server 2015 and received by the device 2002 may trigger the immobiliser 6130 of the car to be activated, thus stopping the vehicle. In addition, the instructions received by the device using process 2400 may activate the indicator lights or alarm siren in order to attract attention. Furthermore, the instructions may also activate the central locking system to either trap an intruder inside the vehicle, or to limit further access to the vehicle (e.g. until the theft indicator device is deactivated by a remote device 2006, 2007 or 2018 or by the server 2015).

Process 2400 begins at step 2402, where the device 2002 receives data from radio transmitter 2004. Once data is received at 2402, the device 2002 must process the data and decide at step 2403 if the data sent is for the particular device (e.g. by checking whether the theft indicator device number associated with the data corresponds with the device number of the device 2002). If step 2403 determines that the data is not for the device 2002, step 2403 proceeds to step 2402 to receive further data. Otherwise, step 2403 proceeds to step 2406 to store the data. Step 2407 then determines whether the data received contains new instructions. If so, step 2407 proceeds to step 2408, where the new instruction is added to the stack for the microprocessor 102 to execute in due course, and step 2408 proceeds to step 2402 to receive further data. Otherwise, step 2407 proceeds to step 2404 to disregard the instructions in the data, and the microprocessor 102 continues to execute the current instructions in the stack. Step 2404 then proceeds to step 2402 to receive further data.

Many modifications will be apparent to those skilled in the art without departing from the scope of the present invention as hereinbefore described with reference to the accompanying drawings.

The invention claimed is:

1. An alert device for a vehicle including:
   a communications receiver for receiving file fragments for said device;
   a positioning data receiver for providing vehicle location data;
   a microcontroller system including a microcontroller and a programmable non-volatile memory system, for building and storing application and data files from said fragments, and executing an alert application of said device by processing at least one application file and associated data identified by configuration instructions included in at least one of said fragments to provide alert data for said vehicle corresponding to the location of said vehicle determined by said application on the basis of said vehicle location data.

2. An alert device as claimed in claim 1, wherein said alert data generates notification of travel features, such as speed limits, accidents, traffic conditions or infringement detection devices.

3. An alert device as claimed in claim 1, wherein said fragments include location items, representing travel features, and location data for the items.

4. An alert device as claimed in claim 3, wherein the alert application monitors said location items within a range of the location of said vehicle based on the number of items within said range to selectively provide said alert data.

5. An alert device as claimed in claim 3, wherein the alert application monitors said location items within a range of the location of said vehicle and said range is adjusted based on the speed of said vehicle.

6. An alert device as claimed in claim 3, wherein the alert application monitors said location items within a range of the location of said vehicle based on relative movement of said vehicle to said location items.

7. An alert device as claimed in claim 6, wherein said range is defined by regions of a hierarchical region tree, and the position of said regions in a region stack maintained by said alert application, said position being determined by said location data.

8. An alert device as claimed in claim 7, wherein said relative movement is determined as one of approaching, receding and indeterminate.

9. An alert device as claimed in claim 2, including a voice processor for generating an audio announcement as said notification in response to said alert data.

10. An alert device as claimed in claim 2, including LEDs driven by said alert data to provide said notification.

11. An alert device as claimed in claim 1, wherein said alert data activates a component of said vehicle such as at least one light or an inimobiliser.

12. An alert device as claimed in claim 1, wherein the communications receiver uses a wireless communications protocol, such as POCSAG or GSM/SMS, to receive said file fragments.

13. An alert device as claimed in claim 1, wherein said device is remotely configured by a user accessing a server, such as a web server, and defining the application, configuration and/or data files to be sent to said device in said fragments.

14. An alert device as claimed in claim 1, wherein said file fragments are broadcast by a transmission system.

15. An alert device as claimed in claim 1, wherein said application is performed automatically by the device without any user intervention or interaction.

16. An alert device as claimed in claim 1, wherein said alert data activates a component of a vehicle such as at least one light or an immobiliser.

17. An alert device, including: a microprocessor; a programmable non-volatile memory system addressable by the microprocessor; a communications receiver for receiving file fragments for said device; and an operating system (OS) for controlling the device to identify fragments for said device, build files from said fragments, store said files in said memory system, and process the files as defining an alert application for providing alert data for a user of the device.

18. An alert device as claimed in claim 17, wherein the received fragments for the device include an initial file defining the remaining files as being of a type of application, configuration or data, and defining reading of the files.

19. An alert device as claimed in claim 17, wherein a vehicle includes the device and said alert data generates notification of travel features, such as speed limits, accidents, traffic conditions or infringement detection devices.

20. An alert device as claimed in claim 17, wherein said alert data activates a component of a vehicle such as at least one light or an immobiliser.

21. An alert device as claimed in claim 18, wherein the operating system includes a number of tasks to control basic processes performed by the microprocessor and the tasks include at least one of:
   (i) a clock task for implementing a real time clock and calendar;
   (ii) a virtual machine task for initiating a virtual machine, and causing reading of said initial file; and executing of a file;
   (iii) a command task for establishing device commands for production testing and initial configuration;
   (iv) a file system task for processing said fragments and said files and removing unwanted and redundant files;
   (v) a communications interface task for controlling said receiver and processing data received by the receiver;
   (vi) an I/O task for processing of input and output signals for I/O peripherals, such as input buttons or display elements of said device;
   (vii) a GPS receiver task to control a GPS receiver of said device to generate location data; and
   (viii) a voice task to control a voice processor of said device to generate audio announcements.

22. An alert device as claimed in claim 21, wherein the operating system includes a scheduler to allocate each task to be processed by the microprocessor, and allocates semaphores to resources of said device to allow the microprocessor to identify resources allocated to a running task.

23. An alert device as claimed in claim 17, wherein said fragments are broadcast by a transmission system.

24. A server transmission system for generating and transmitting file fragments for a device as claimed in claim 1 or 17.

25. A server transmission system as claimed in claim 24, wherein said fragments are broadcast to a plurality of said device.

26. A server transmission system as claimed in claim 24, including a server for providing a user interface allowing a user to submit instructions used to determine the application, configuration, and data files, to be sent to said device in said fragments.

27. A server transmission system as claimed in claim 24, including a server for providing a user interface allowing a user to submit a vehicle identifier, said system selecting said alert device on the basis of said vehicle identifier.

28. A handheld communications device for transmitting file fragments to a device as claimed in claim 1 or 17.

29. A handheld communications device as claimed in claim 28, wherein said fragments are received by said handheld device from a server transmission system prior to transmission to said alert device.

* * * * *

UNITED STATES PATENT AND TRADEMARK OFFICE
CERTIFICATE OF CORRECTION

PATENT NO. : 7,705,749 B2  Page 1 of 1
APPLICATION NO. : 11/571172
DATED : April 27, 2010
INVENTOR(S) : Andrew Paul Donaghey et al.

It is certified that error appears in the above-identified patent and that said Letters Patent is hereby corrected as shown below:

Column 47, line 49, delete "inimobiliser" and insert --immobiliser--.

Signed and Sealed this

Sixth Day of July, 2010

David J. Kappos
*Director of the United States Patent and Trademark Office*